(12) United States Patent  
Matsunaga et al.

(10) Patent No.: US 7,151,684 B2  
(45) Date of Patent: Dec. 19, 2006

(54) SEMICONDUCTOR MEMORY

(75) Inventors: Yasuhiko Matsunaga, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/104,528

(22) Filed: Apr. 13, 2005

(65) Prior Publication Data

US 2006/0028855 A1    Feb. 9, 2006

(30) Foreign Application Priority Data

Aug. 6, 2004    (JP) ............................. 2004-231578

(51) Int. Cl.  
  *G11C 5/06* (2006.01)
(52) U.S. Cl. .................... 365/63; 365/230.03
(58) Field of Classification Search .................. 365/63, 365/230.03  
See application file for complete search history.

(56) References Cited

U.S. PATENT DOCUMENTS

| 7,023,049 | B1* | 4/2006 | Takebuchi et al. | .......... 257/316 |
| 2004/0212008 | A1* | 10/2004 | Hasegawa | .................... 257/316 |
| 2005/0029573 | A1* | 2/2005 | Sato et al. | .................. 257/314 |
| 2005/0254302 | A1* | 11/2005 | Noguchi | ................. 365/185.17 |

FOREIGN PATENT DOCUMENTS

| JP | 3-283662 | 12/1991 |
| JP | 2001-196482 | 7/2001 |
| JP | 2002-110791 | 4/2002 |

* cited by examiner

*Primary Examiner*—Michael Tran  
(74) *Attorney, Agent, or Firm*—Oblon, Spivak, McClelland, Maier & Neustadt, P.C.

(57) ABSTRACT

The present invention avoids generation of voids in regions in which bit line contacts CB are to be formed in a row. A semiconductor memory, mounted on a semiconductor chip, includes bit lines BL and a source line SL and word lines WL orthogonal to the bit lines. The device further includes: bit line side select gate lines SGD and source line side select gate lines SGS that are aligned parallel to the word lines and adjacent to both ends thereof aligned along the bit line length; memory cell transistors MT that are arranged at the intersections of the bit lines and the word lines; select gate transistors ST that are arranged at the intersections of the bit lines and the select gate lines; bit line contacts CB that are arranged along the word line length between the bit line side select gate lines; and source line contacts CS that are arranged along the word line length between the source line side select gate lines; wherein interval L1 between the bit line side select gate lines is greater than interval L2 between the source line side select gate lines.

12 Claims, 43 Drawing Sheets

SEMICONDUCTOR MEMORY

CROSS REFERENCE TO RELATED APPLICATIONS AND INCORPORATION BY REFERENCE

This application is based upon and claims the benefit of priority from prior Japanese Patent Application P2004-231578 filed on Aug. 6, 2004; the entire contents of which are incorporated by reference herein.

BACKGROUND OF THE INVENTION

1. Field of the Invention

The present invention relates to a semiconductor memory. More specifically, it relates to a semiconductor memory having source line contacts CS and bit line contacts CB, and a fabrication method for the same.

2. Related Art

Conventionally, a NAND flash EEPROM is known as an electrically erasable and highly integratable nonvolatile semiconductor memory. A NAND flash EEPROM memory cell transistor has a stacked gate structure where a floating gate electrode layer or a floating gate electrode film, which is for charge accumulation, and a control gate electrode are stacked on a semiconductor substrate via an insulating film layer. A NAND cell unit is configured by vertically connecting multiple memory cell transistors in series such that neighboring memory cell transistors share either a common source or a common drain region, and arranging select gate transistors at both sides thereof.

A memory cell array is configured by arranging NAND cell units in a matrix. NAND cell units arranged in a row are called a 'NAND cell block'. The gates of select gate transistors arranged in the same row are connected to the same select gate line, and the control gates of memory cell transistors arranged in the same row are connected to the same control gate line.

A contact for connecting a bit line and a source line is formed at both sides of each NAND cell unit, allowing an electric current to flow through each NAND cell unit. An arrangement such that two adjacent NAND cell units share a single contact is typically used for reducing the area occupied by the contacts. Accordingly, a NAND cell unit is symmetrically arranged with bit line contacts CB and source line contacts CS as points of symmetry. Each of the bit line contacts CB and the source line contacts CS is formed between corresponding select gate transistors of adjacent NAND cell units.

The NAND cell units are vertically arranged at equal intervals. In other words, widths of all regions in which contacts are to be formed within a cell array are equal. With this structure, voids, which are parallel to select gate lines, are formed in the regions in which contacts are to be formed so that the aspect ratio before embedding an interlayer insulating film is large. In the case where the bit line contacts CB are formed therein, there is a high probability of a bit line BL short occurring due to contact plug material wraparound.

Japanese Patent Application Laid-open No. 2001-196482 relates to a flash memory that is formed by applying a local interconnection to the source line and discloses a method of monitoring whether or not a source contact with a narrow contact area has been in contact with an electrode by utilizing properties of an over erased cell of a flash.

Japanese Patent Application Laid-open No. Hei 03-283662 discloses a structure of a NAND EEPROM, which improves bit line contact yield and area reduction by using an extended electrode for the bit line contact. Cost is reduced by decreasing the number of processes, see FIG. 4 of Japanese Patent Application Laid-open No. Hei 03-283662.

With a flash memory semiconductor device having a multi-level interconnect structure where voids are formed in interlayer insulating films so as to reduce the parasitic capacitance between interconnects, there is a disadvantage of short circuiting adjacent bit lines via a metal that has penetrated into inter-contact voids when the contacts extend over the voids formed between word lines. Consequently, as a void countermeasure, a structure of a semiconductor device allows formation of inter-bit line contacts and diffusion layers on the interlayer insulating films so as to intersect with voids by forming a sidewall insulating film such as a nitride film on the inner wall of the contact. This structure also prevents short circuits through the inter-bit line contacts; and reduces the parasitic capacitance between word lines (See Japanese Patent Application Laid-open No. 2002-1100791).

A requirement for embedding an interlayer insulating film is to avoid generating voids and/or seams in the regions in which contacts are to be formed. Assuming that voids and/or seams exist, deposition of contact plugs through a film formation method with excellent step coverage such as CVD increases a possibility of short circuiting the bit lines BL due to the material of the contact plugs penetrating into the void and/or seam interiors In actuality, a BPSG film with excellent reflow characteristics after deposition thereof also often includes voids or seams. Consequently, embedding the voids and/or seams in a subsequent reflow step avoids void embedding. However, avoids void embedding is recently becoming more difficult due to the following factors.

Firstly, the greater the down-scaling, the narrower the spaces between select gate transistors, while the heights of gate electrodes are less scaled down. As a result, the aspect ratio before embedding an interlayer insulating film increases from generation to generation, and voids become easier to generate.

Secondly, there is a need for a low heat process after diffusion layer formation. The short channel effect is noticeable when the gate length is scaled down. As a result, it is necessary to control dopant impurity diffusion using a low heat process. In addition, there is a recent tendency to use a salicide film for reducing the control gate line sheet resistance A heat process of approximately 700° C. or greater after salicide film formation creates about high resistance, which does not allow use of the reflow characteristics of the interlayer insulating film. As a result, the generated voids remain.

As described thus far, avoiding void or seam generation in regions in which contacts are to be formed is an extremely significant objective for future miniaturization.

In the above description, a NAND flash EEPROM has been described as an exemplary MOS semiconductor memory; however, even a memory with another operating structure such as an AND type, NOR type, two-transistor/cell type, or three-transistor/cell type having circuitry in which bit line contacts CB are arranged in a row, avoiding void or seam generation in regions in which contacts are to be formed is also an extremely significant objective for future miniaturization.

SUMMARY OF THE INVENTION

An aspect of the present invention inheres in a semiconductor memory which includes: a plurality of bit lines, a plurality of word line groups orthogonal to the plurality of bit lines, and a plurality of source lines that are respectively arranged adjacent and parallel to the word line groups; a pair of bit line side select gate lines formed between a pair of word line groups of the plurality of word line groups, and aligned parallel to the word line groups; a pair of source line side select gate lines formed between a word line group adjacent to the pair of word line groups and the pair of word line groups, and aligned parallel to the word line groups; memory cell transistors arranged at an intersections of the bit lines and the word lines, and select gate transistors arranged at an intersections of the bit lines and the select gate lines; a bit line contact arranged between the pair of bit line side select gate lines; and a source line contact arranged between the pair of source line side select gate lines.

Another aspect of the present invention inheres in a semiconductor memory which includes: a plurality of bit lines, a plurality of word line groups orthogonal to the plurality of bit lines, and a plurality of source lines that are respectively arranged adjacent and parallel to the word line groups; a bit line contact arranged between a pair of word lines in the plurality of word line groups; a source line contact arranged between another pair of word lines adjacent to the pair of word lines; and memory cell transistors arranged at an intersections of the bit lines and the word lines.

Another aspect of the present invention inheres in a semiconductor memory which includes: a plurality of bit lines, a plurality of word line groups orthogonal to the plurality of bit lines, and a plurality of source lines that are respectively arranged adjacent and parallel to the word line groups; a bit line contact arranged between a pair of word lines in the plurality of word line groups; a pair of source line side select gate lines formed between a word line group adjacent to the pair of word lines and the pair of word lines, and aligned parallel to the word line groups; memory cell transistors arranged at an intersection of the bit lines and the word lines, and select gate transistors arranged at an intersection of the bit lines and the select gate lines; and a source line contact arranged between the pair of source line side select gate lines.

DETAILED DESCRIPTION OF THE INVENTION

Figure 1:
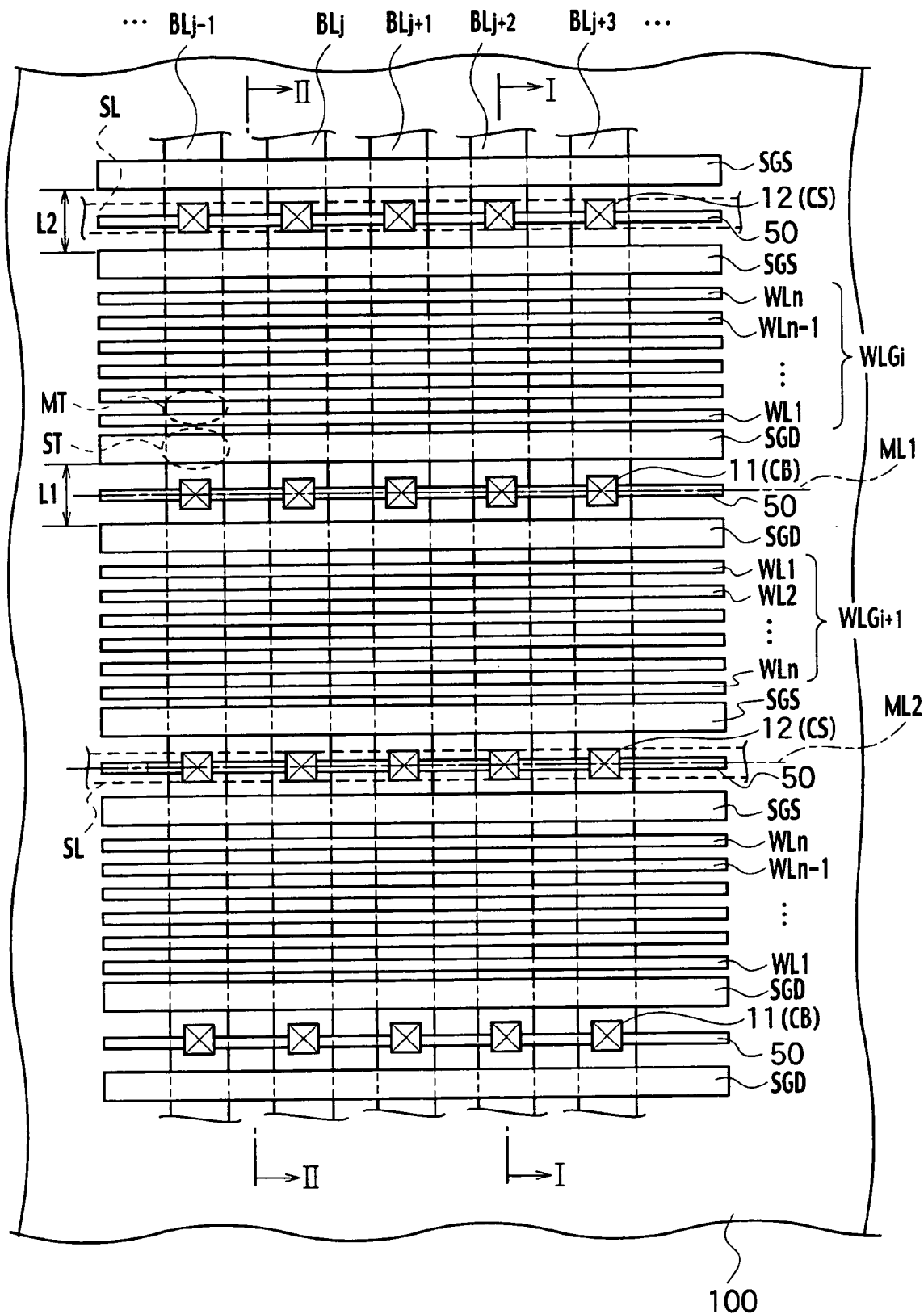
FIG. 1 is a plan view of a schematic layout pattern of a semiconductor memory according to a comparative example of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

According to embodiments of the present invention, a memory having circuitry in which bit line contacts are arranged in a row avoids void or seam generation in regions in which contacts are to be formed and provides an easily miniaturized semiconductor memory and fabrication method for the same.

Wider diffusion areas for bit line contacts CB in a nonvolatile memory are formed than those for source line contacts CS. In other words, a longer interval between adjacent select gate transistors on both sides of each bit line contact CB than the interval between adjacent select gate transistors on both sides of each source line contact CS is provided.

First through tenth embodiments of the present invention are described forthwith while referencing the drawings. The same or similar symbols are given to the same or similar parts throughout the appended drawings. However, it should be noted that the drawings are merely schematics that the relationship between thickness and planar dimension and the ratio of respective layer thicknesses and the like differ from those of the actual invention. Accordingly, specific thicknesses and dimensions should be determined while considering the following description. Furthermore, parts with differing dimensions and/or differing ratios among the drawings may be included.

In addition, the first through tenth embodiments given forthwith illustrate devices and methods for embodying the technical idea of the present invention, and that technical idea of the present invention is not limited to the following materials, shapes, structures, arrangements or the like. The technical idea of the present invention may be modified into various modifications within the scope of the appended claims.

[First Embodiment]

(NAND Type)

Figure 4:
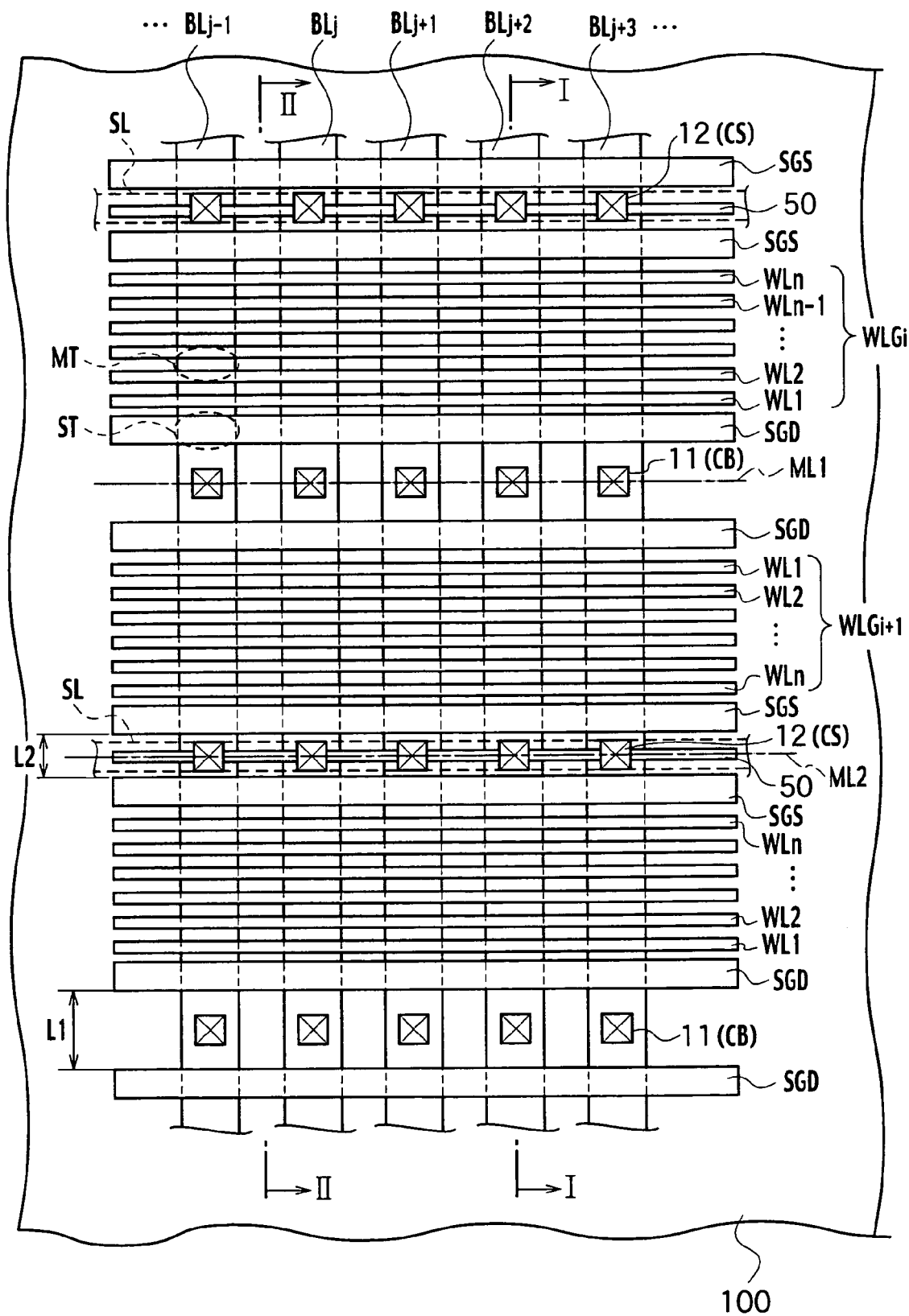
FIG. 4 is a plan view of a schematic layout pattern of a semiconductor memory according to a first embodiment of the present invention.
Figure 5:
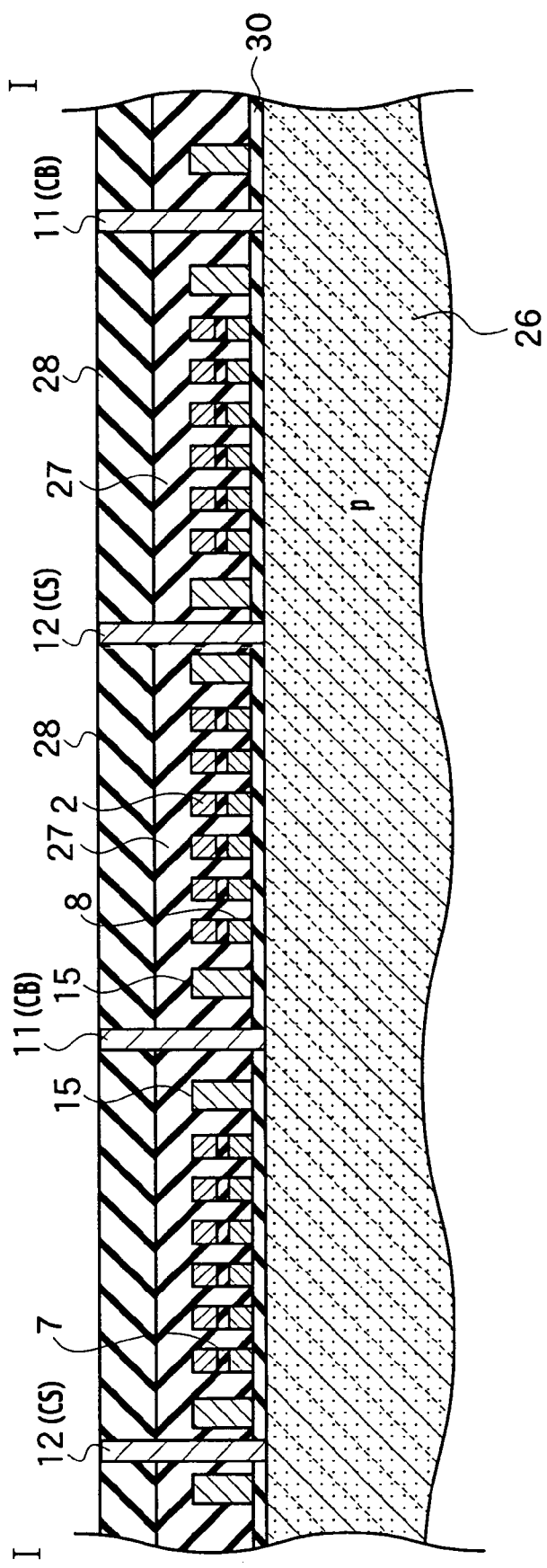
FIG. 5 shows a schematic cross-sectional device structure cut along the line I—I of FIG. 4.
Figure 6:
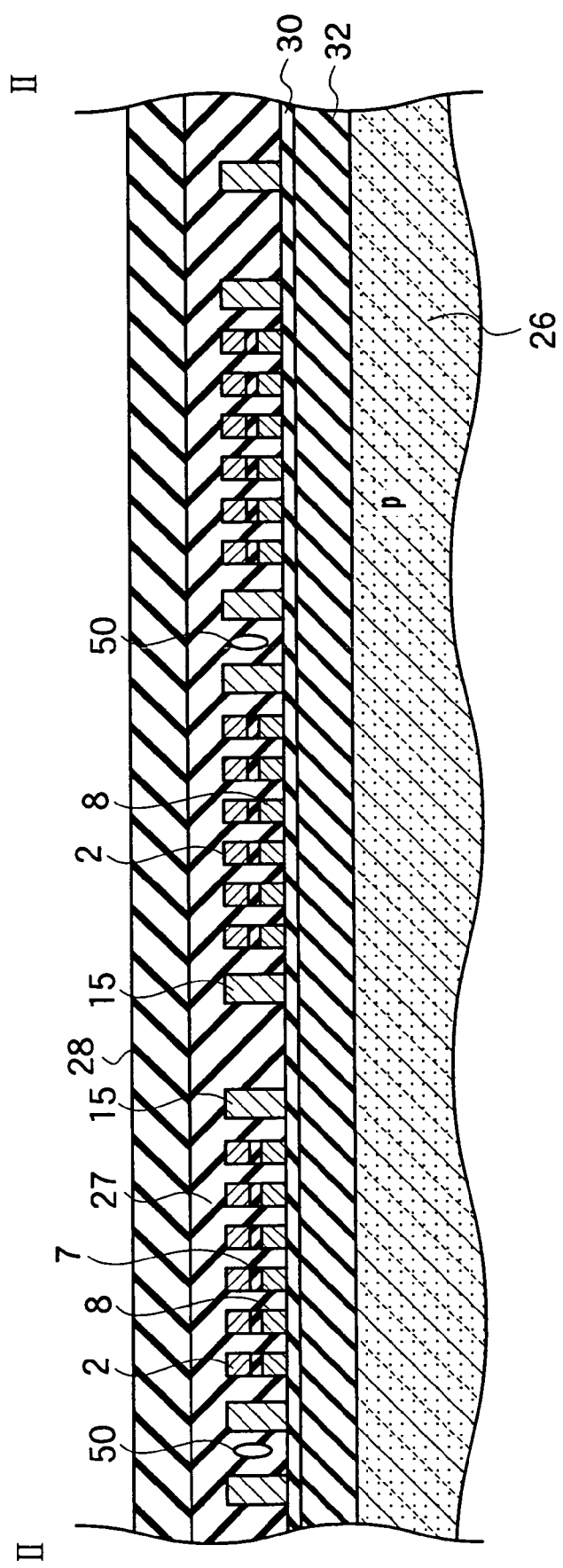
FIG. 6 shows a schematic cross-sectional device structure cut along the line II—II in FIG. 4.
Figure 7:
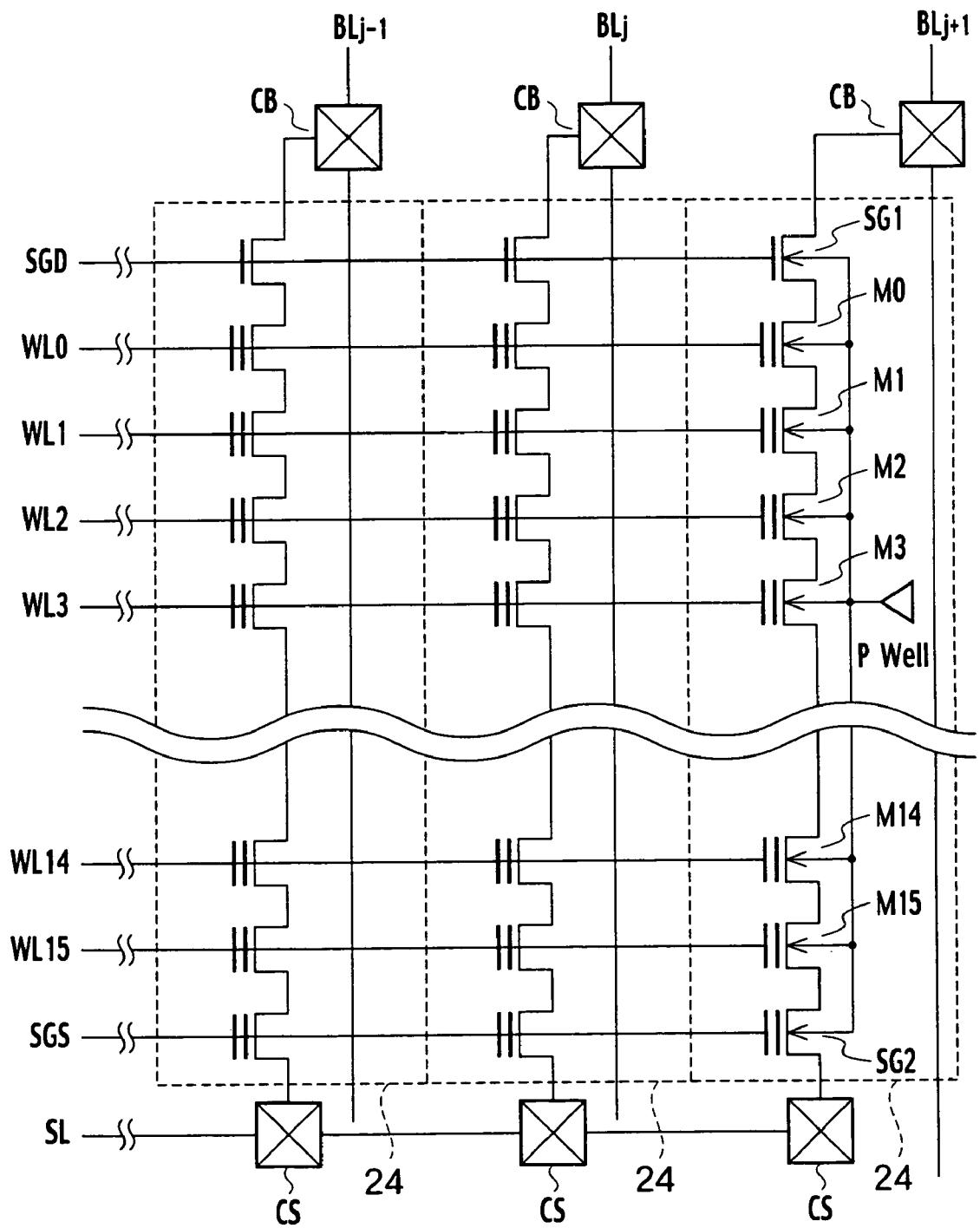
FIG. 7 is a circuit diagram of the semiconductor memory according to the first embodiment of the present invention.
Figure 8:
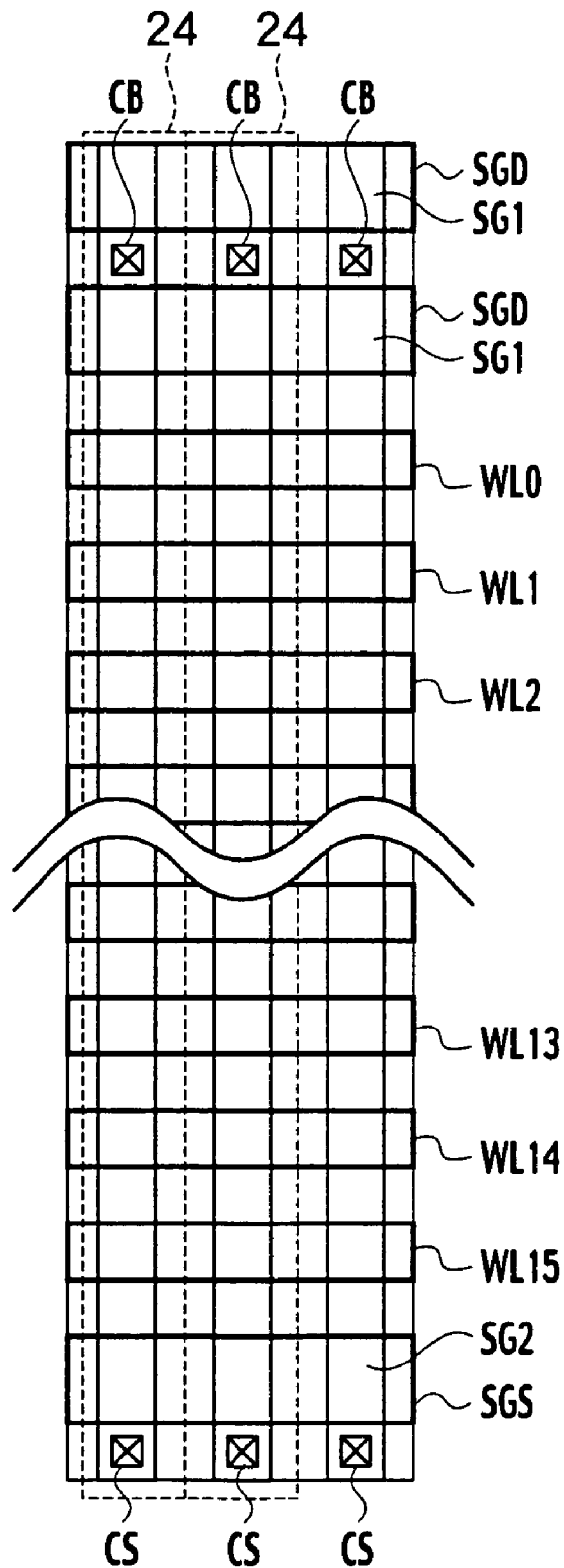
FIG. 8 is a plan view of a device pattern corresponding to FIG. 7.

A plan view of a schematic layout pattern of a semiconductor memory according to a first embodiment of the present invention is shown in FIG. 4, a schematic device cross section cut along the line I—I in FIG. 4 is shown in FIG. 5, and a schematic cross-sectional device structure cut along the line II—II is shown in FIG. 6. Furthermore, circuitry of the semiconductor memory according to the first embodiment of the present invention is shown in FIG. 7, and a plan view of a layout pattern corresponding to FIG. 7 is shown in FIG. 8.

Figure 37:
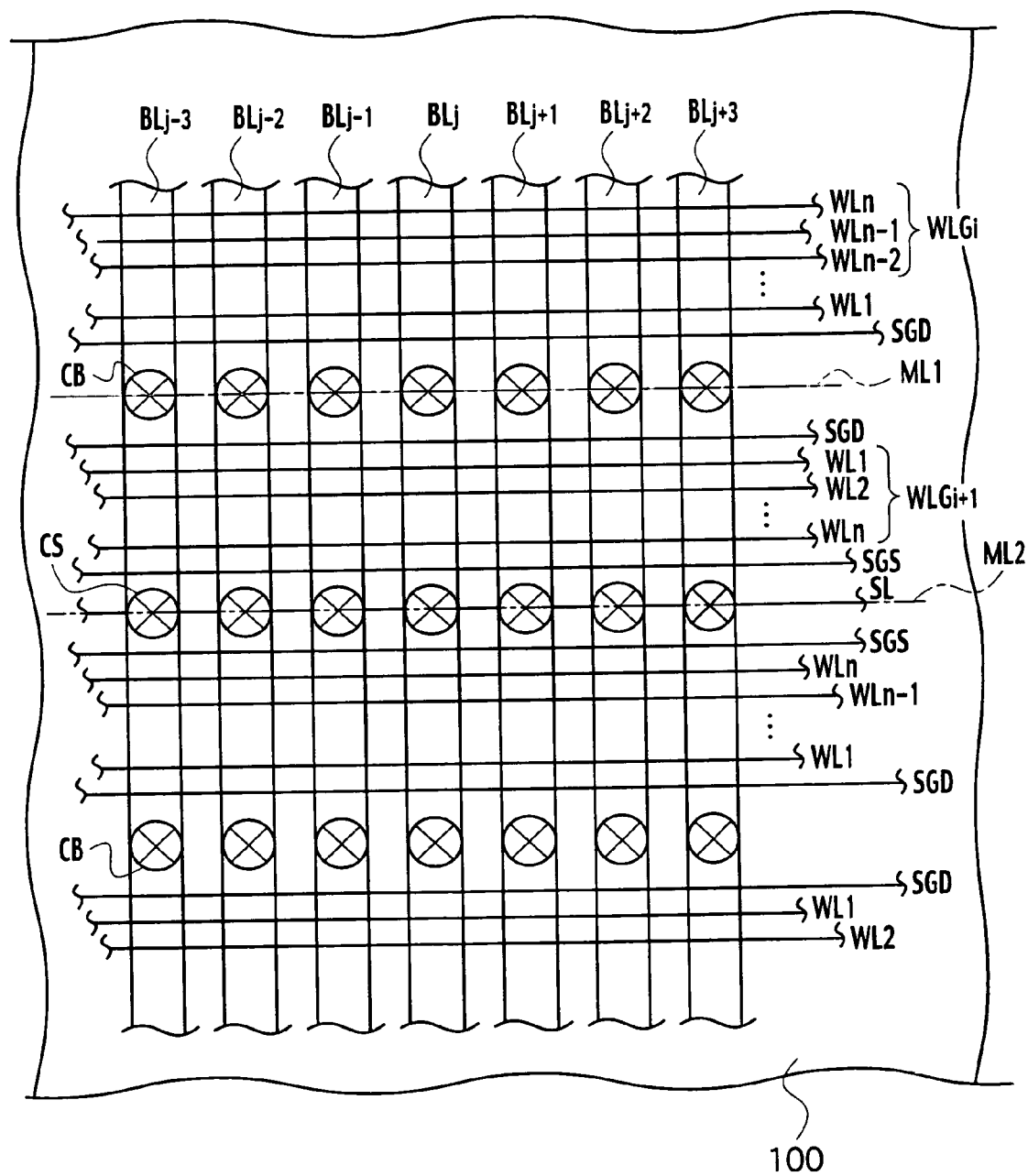
FIG. 37 is a diagram schematically showing an arrangement pattern of bit line contacts CB and source line contacts CS in an AND or NAND structure.

An arrangement pattern of bit line contacts CB and source line contacts CS in a NAND structure is schematically shown in FIG. 37 while referencing the plan view of the layout pattern shown in FIG. 4.

The semiconductor memory according to the first embodiment of the present invention, as shown in FIG. 4 or FIG. 37, is mounted on a semiconductor chip 100, and includes: multiple bit lines $BL_{j-1}$, $BL_j$, $BL_{j+1}$, ...; multiple word line groups $WLG_i$, $WLG_{i+1}$, ... orthogonal to the multiple bit lines $BL_{j-1}$, $BL_j$, $BL_{j+1}$, ...; a source line SL parallel and adjacent to respective word line groups $WLG_i$, $WLG_{i+1}$, ...; a pair of bit line side select gate lines SGD, which are adjacent to the inner sides of a pair of word line groups $WLG_i$, $WLG_{i+1}$ of the multiple word line groups $WLG_i$, $WLG_{i+1}$, ... and arranged parallel to the word line groups $WLG_i$, $WLG_{i+1}$, ...; a pair of source line side select gate lines SGS, which has a topology parallel to the word line groups $WLG_i$, $WLG_{i+1}$, adjacent to the outer sides of the pair of word line groups $WLG_i$, $WLG_{i+1}$, and between word line groups that are adjacent to the pair of word line groups $WLG_i$, $WLG_{i+1}$ and that pair of word line groups; memory cell transistors MT, which are arranged at the intersections of the bit lines $BL_{j-1}$, $BL_j$, $BL_{j+1}$, ... and word lines $WL_1$, $WL_2$, ..., $WL_{n-1}$, $WL_n$; select gate transistors ST, which are arranged at the intersections of the bit lines $BL_{j-1}$, $BL_j$, $BL_{j+1}$, ... and the select gate lines SGD and SGS; bit line contacts (CB) 11, which are linearly arranged along the word line groups $WLG_i$, $WLG_{i+1}$; and source line contacts (CS) 12, which are linearly arranged along the word line groups $WLG_i$, $WLG_{i+1}$ between a pair of source line side select gate lines SGS. The memory has a structure having a periodic symmetrical pattern with the center line between the pair of bit line side select gate lines SGD as a first line of symmetry ML1 and the center line between the pair of source line side select gate lines SGS as a second line of symmetry ML2. An interval L1 between the pair of bit line side select gate lines SGD is greater than an interval L2 between the pair of source line side select gate lines SGS.

The semiconductor memory according to the first embodiment of the present invention has a NAND flash EEPROM structure as a basic structure. The NAND structure includes, as shown in FIGS. 5 and 6, memory cells, each with a stacked gate structure configured from a gate insulating film 30 formed as a tunnel insulating film on a p-well or semiconductor substrate 26, a floating gate 8, an inter-gate insulating film 7, and a control gate 2 arranged on the gate insulating film 30. Multiple memory cells are connected in series along the bit line length via source and drain diffusion layers (not shown in the drawing) of each memory cell transistor. Select gate electrodes 15 of select gate transistors are arranged on both ends of the memory cells, and bit line contacts (CB) 11 and source line contacts (CS) 12 are connected via the above select gate transistors. As a result, a memory cell unit is configured, and a plurality of such memory cell units is arranged in parallel along the word line WL length orthogonal to the bit lines. Note that FIG. 6 corresponds to a cross-sectional structure of a device isolating region (STI) 32.

NAND cell units 24 are configured from memory cell transistors M0 through M15 and select gate transistors SG1 and SG2, as shown in detail in FIGS. 7 and 8. The drains of the select gate transistors SG1 are connected to the bit lines $BL_{j-1}$, $BL_j$, $BL_{j+1}$, ... via respective bit line contacts CB, while the sources of the select gate transistors SG2 are connected to the common source line SL via respective source line contacts CS.

The NAND cell units 24 shown in FIGS. 7 and 8 are arranged to alternately sandwich two types of to-be-formed contact region widths L1 and L2 along the column length of the NAND flash EEPROM shown in FIG. 4. The wider to-be-formed contact region width L1 is for the bit line contacts 11 and is a width allowing void-free embedding of interlayer insulating film 27 shown in FIGS. 5 and 6. The narrower to-be-formed contact region width L2 is for the source line contacts 12 and should be a minimum width determined from design rules such as contact diameter, alignment margin and the like This is because, as shown in FIGS. 4 and 7, it does not matter if voids 50 are generated and short circuit the source line contacts (CS) 12 since the source line SL is shared by the NAND cell units 24 aligned along the row length.

In this manner, formation of a wide to-be-formed bit line contact region width L1 and a narrow to-be-formed source line contact region width L2 corresponds to formation of, for example, wider areas of the diffusion regions for the bit line contacts CB than those for the source line contacts CS. In other words, the interval between the select gate lines SGD for the respective select gate transistors adjacent to both sides of each bit line contact CB is widened more than the interval between the select gate lines SGS for the respective select gate transistors adjacent to both sides of each source line contact CS.

COMPARATIVE EXAMPLE

Figure 2:
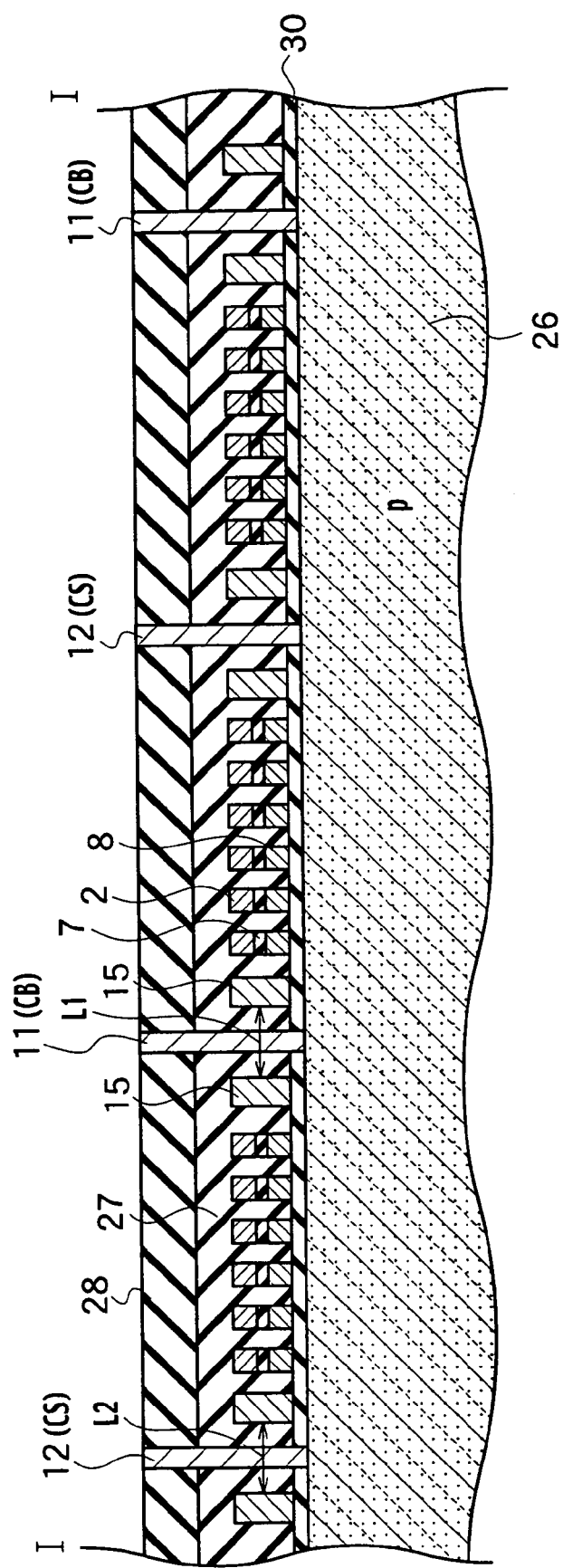
FIG. 2 shows a schematic cross-sectional device structure cut along the line I—I in FIG. 1.
Figure 3:
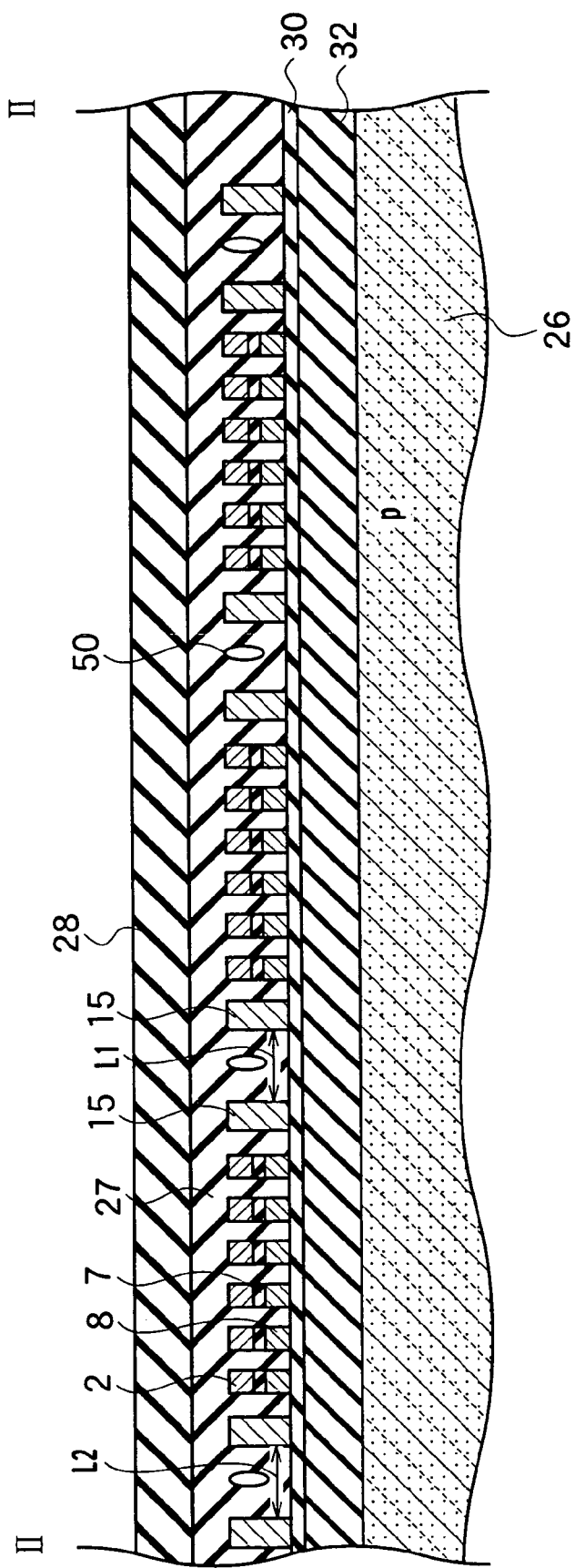
FIG. 3 shows a schematic cross-sectional device structure cut along the line II—II in FIG. 1.

A plan view of a schematic layout pattern of a semiconductor memory according to a comparative example of the present invention is shown in FIG. 1, a schematic device cross section cut along the line I—I in FIG. 1 is shown in FIG. 2, and a schematic cross-sectional device structure cut along the line II—II is shown in FIG. 3. Furthermore, the circuitry is the same as with FIG. 7.

According to the plan view of the schematic layout pattern of the semiconductor memory of the comparative example shown in FIG. 1, that pattern is formed on a semiconductor chip 100 and includes: multiple bit lines $BL_{j-1}$, $BL_j$, $BL_{j+1}$, ...; multiple word line groups $WLG_i$, $WLG_{i+1}$, ... orthogonal to the multiple bit lines $BL_{j-1}$, $BL_j$, $BL_{j+1}$, ...; a source line SL parallel and adjacent to respective word line groups $WLG_i$, $WLG_{i+1}$, ...; a pair of bit line side select gate lines SGD, which are adjacent to the inner sides of a pair of word line groups $WLG_i$, $WLG_{i+1}$ of the multiple word line groups $WLG_i$, $WLG_{i+1}$, ... and arranged parallel to the word line groups $WLG_i$, $WLG_{i+1}$, ...; a pair of source line side select gate lines SGS, which is arranged with a topology parallel to the word line groups $WLG_i$, $WLG_{i+1}$, adjacent to the outer sides of the pair of word line groups $WLG_i$, $WLG_{i+1}$, and between a word line group adjacent to the pair of word line groups $WLG_i$, $WLG_{i+1}$ and that pair of word line groups; memory cell transistors MT, which are arranged at the intersections of the bit lines $BL_{j-1}$, $BL_j$, $BL_{j+1}$, ... and word lines $WL_1$, $WL_2$, ..., $WL_{n-1}$, $WL_n$; select gate transistors ST, which are arranged at the intersections of the bit lines $BL_{j-1}$, $BL_j$, $BL_{j+1}$, ... and the select gate lines SGD and SGS; bit line contacts (CB) 11, which are linearly arranged along the word line groups $WLG_i$, $WLG_{i+1}$; and source line contacts (CS) 12, which are linearly arranged along the word line groups $WLG_i$, $WLG_{i+1}$ between a pair of source line side select gate lines SGS. The structure has a periodic symmetrical pattern with the center line between the pair of bit line side select gate lines SGD as a first line of symmetry ML1 and the center line between the pair of source line side select gate lines SGS as a second line of symmetry ML2. An interval L1 between the pair of bit line side select gate lines SGD is greater than an interval L2 between the pair of source line side select gate lines SGS.

The NAND cell units 24 are arranged along the column length at equal intervals, and the to-be-formed contact region widths L1 and L2 in a cell array are all arranged at equal intervals. At this time, as shown in FIGS. 2 and 3, large voids 50 parallel to select gate lines are formed in the regions in which contacts are to be formed in accordance with the aspect ratio before embedding an interlayer insulating film 27. In the case where the bit line contacts (CB) 11 are formed therein, there is a high probability of a bit line BL short due to wrap-around of a contact plug material. Note that FIG. 3 corresponds to a cross-sectional structure of a device isolating region (STI) 32.

A requirement for embedding the interlayer insulating film 27 is to avoid generation of voids or seams in the regions in which contacts are to be formed. Assuming that voids or seams exist, deposition of contact plugs 9 (FIG. 12) through a film formation method with excellent step coverage, such as CVD, creates a possibility of short circuiting the bit lines $BL_{j-1}$, $BL_j$, $BL_{j+1}$, . . . due to the material of the contact plugs 9 (FIG. 12) penetrating into the void or seam interiors. In actuality, a BPSG film with excellent reflow characteristics also often generates voids or seams after deposition, as will be described with FIG. 16. Consequently, embedding the voids or seams in a subsequent reflow step permits void free embedding. However, use of a salicide film for gate electrodes makes it impossible to use a reflow process, and the generated voids may consequently remain.

(Fabrication Method)

A fabrication method for the semiconductor memory according to the first embodiment of the present invention is described referencing FIGS. 9 through 14. Note that the fabrication method for the semiconductor memory set forth hereafter is merely an example, and can naturally be implemented through other various fabrication methods including modified examples thereof.

Figure 9:
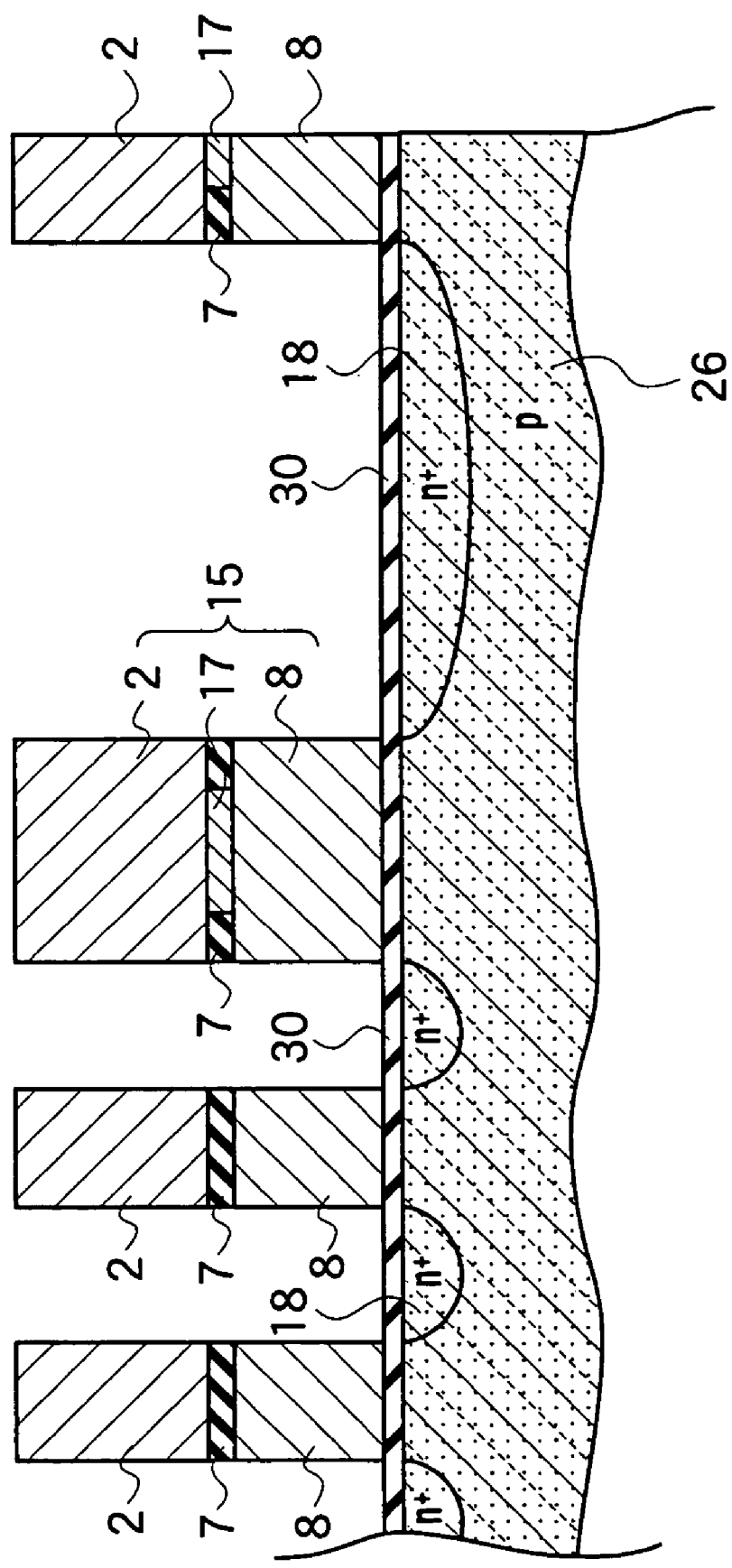
FIG. 9 shows a schematic cross-sectional device structure for describing a step of a fabrication method for the semiconductor memory according to the first embodiment of the present invention.

As shown in FIG. 9, to begin with, memory cell transistors and select gate transistors are formed with a stacked gate structure through lithography and dry etching, and diffusion layers 18 are then formed through ion implantation.

The stacked gate structure of a memory cell transistor comprises a floating gate 8, an inter-gate insulating film 7, and a control gate 2 formed on the well or semiconductor substrate 26. The stacked gate structure of a select gate transistor includes a floating gate 8, an inter-gate insulating film 7, and a control gate 2 formed on the well or semiconductor substrate 26, and further includes a select gate electrode 15 formed by electrically short circuiting the floating gate 8 and the control gate 2 via a polysilicon contact 17, which is formed by patterning the inter-gate insulating film 7.

Figure 10:
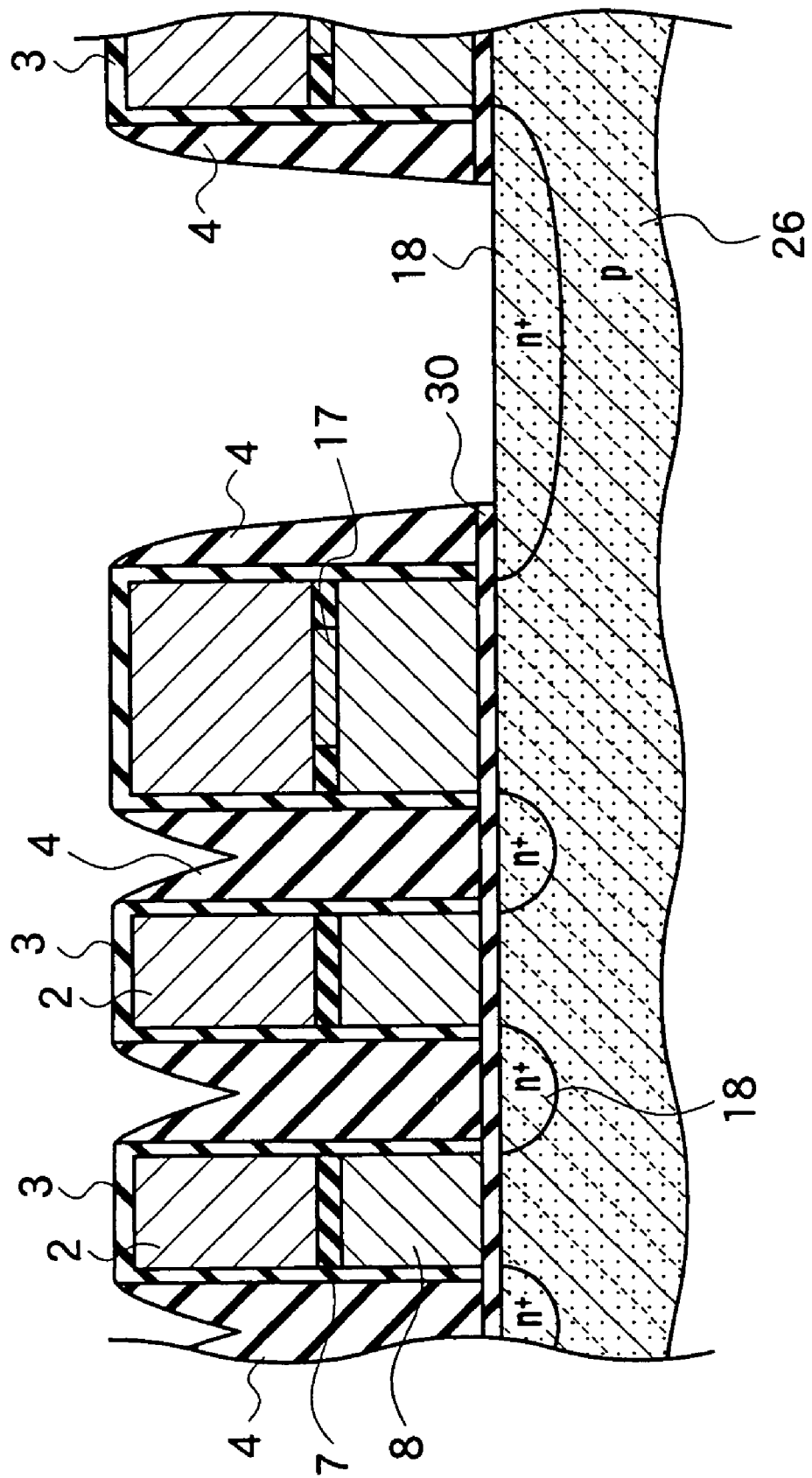
FIG. 10 shows a schematic cross-sectional device structure for describing a step of the fabrication method for the semiconductor memory according to the first embodiment of the present invention.

As shown in FIG. 10, spacer films 3 and sidewall films 4 are formed using one or more insulating films, and the spacer films 3 and the sidewall films 4 in regions in which bit line contacts CB and source line contacts CS are to be formed are then removed through lithography and etching.

Figure 11:
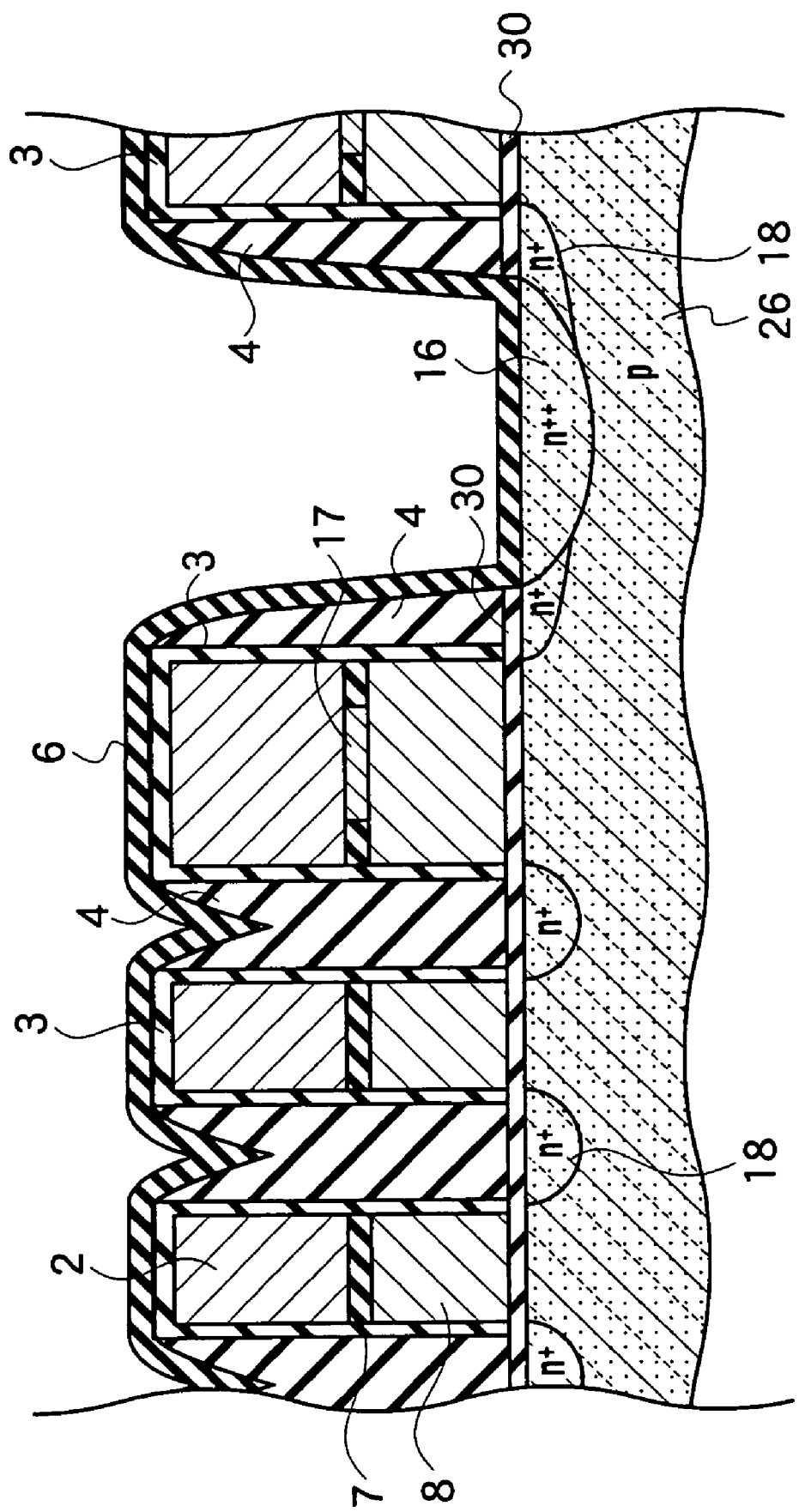
FIG. 11 shows a schematic cross-sectional device structure for describing a step of the fabrication method for the semiconductor memory according to the first embodiment of the present invention.

As shown in FIG. 11, a diffusion layer 16 is formed through ion implantation, and an insulating film 6 is then deposited across the entire surface of the device a barrier film. The diffusion layer 16 has a higher impurity density than the diffusion layer 18, and is formed for contacting the diffusion layer 18.

Figure 12:
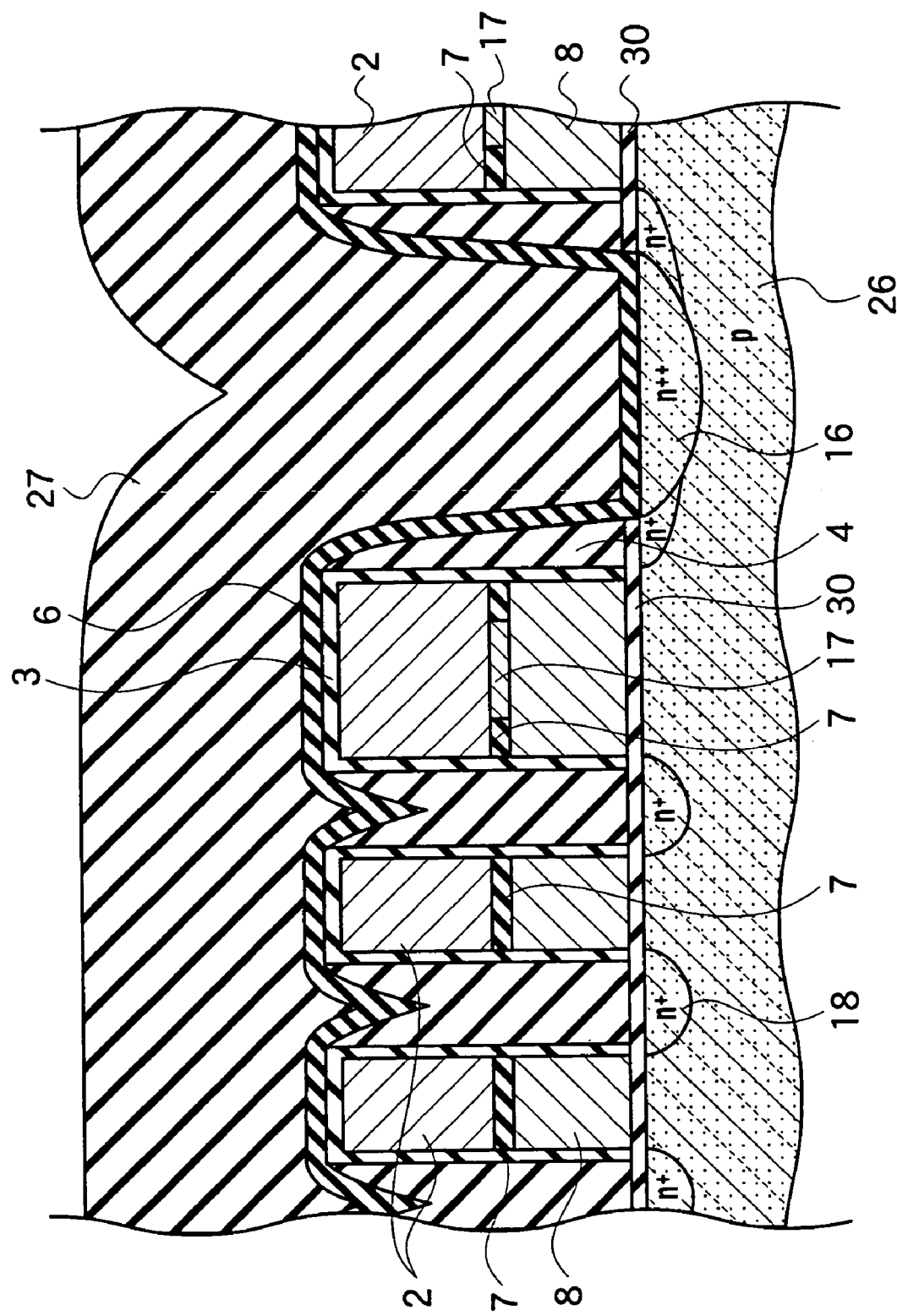
FIG. 12 shows a schematic cross-sectional device structure for describing a step of the fabrication method for the semiconductor memory according to the first embodiment of the present invention.

As shown in FIG. 12, a thick interlayer insulating film 27 is deposited so as to insulate an interconnect layer (not shown in the drawing) and the control gates 2 of the stacked gate structure. An insulating film with 'reflow characteristics' such as a BPSG film resulting from doping an oxide film with boron (B) or phosphorous (P) is used as this interlayer insulating film 27. Here, 'reflow characteristics' means improving a film embedding shape by fluidization through annealing.

Figure 13:
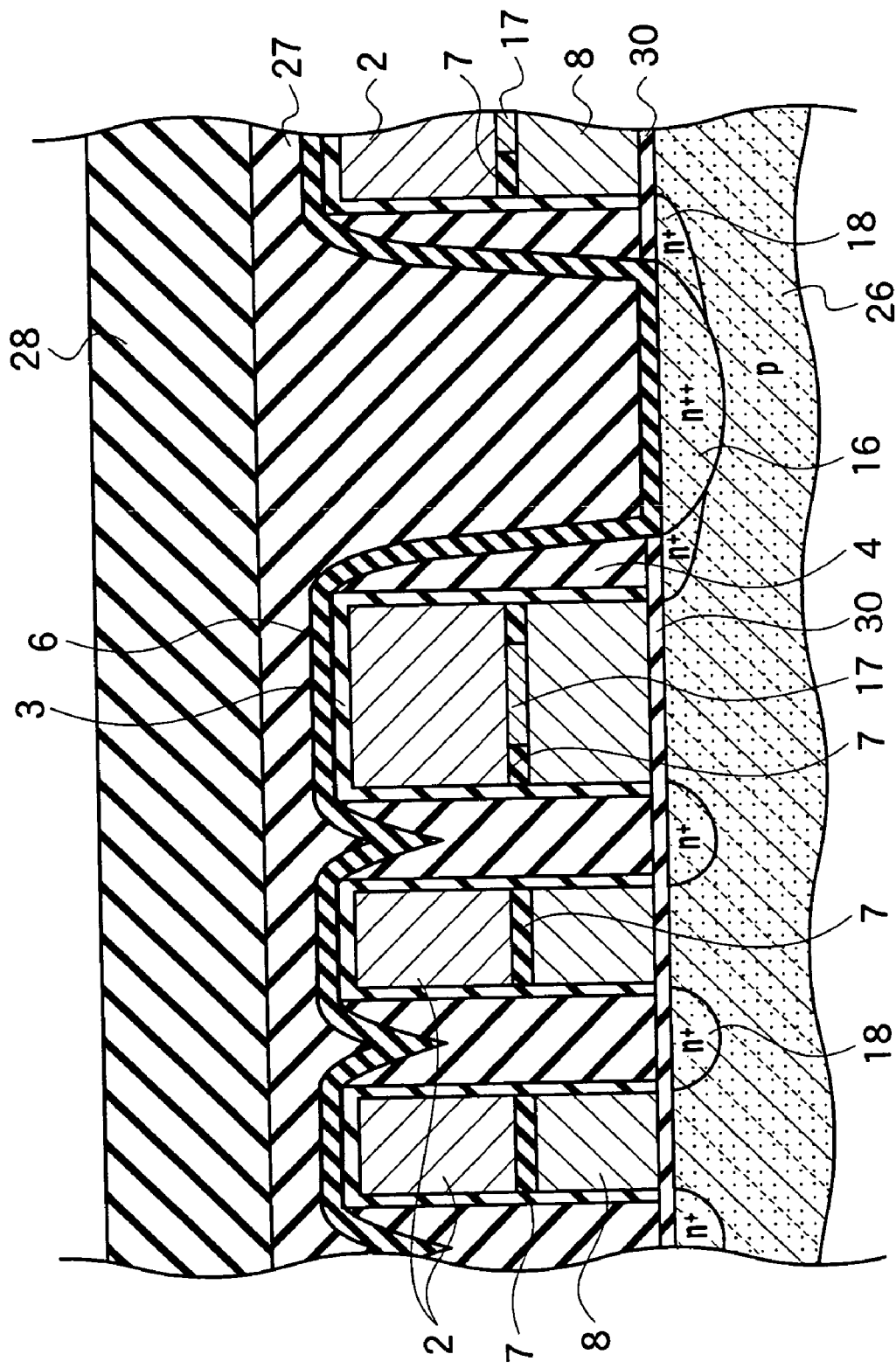
FIG. 13 shows a schematic cross-sectional device structure for describing a step of the fabrication method for the semiconductor memory according to the first embodiment of the present invention.

As shown in FIG. 13, the diffusion layer 27 is planarized through chemical and mechanical polishing (CMP), and a mask insulating film 28 is then deposited across the entire surface of the device.

Figure 14:
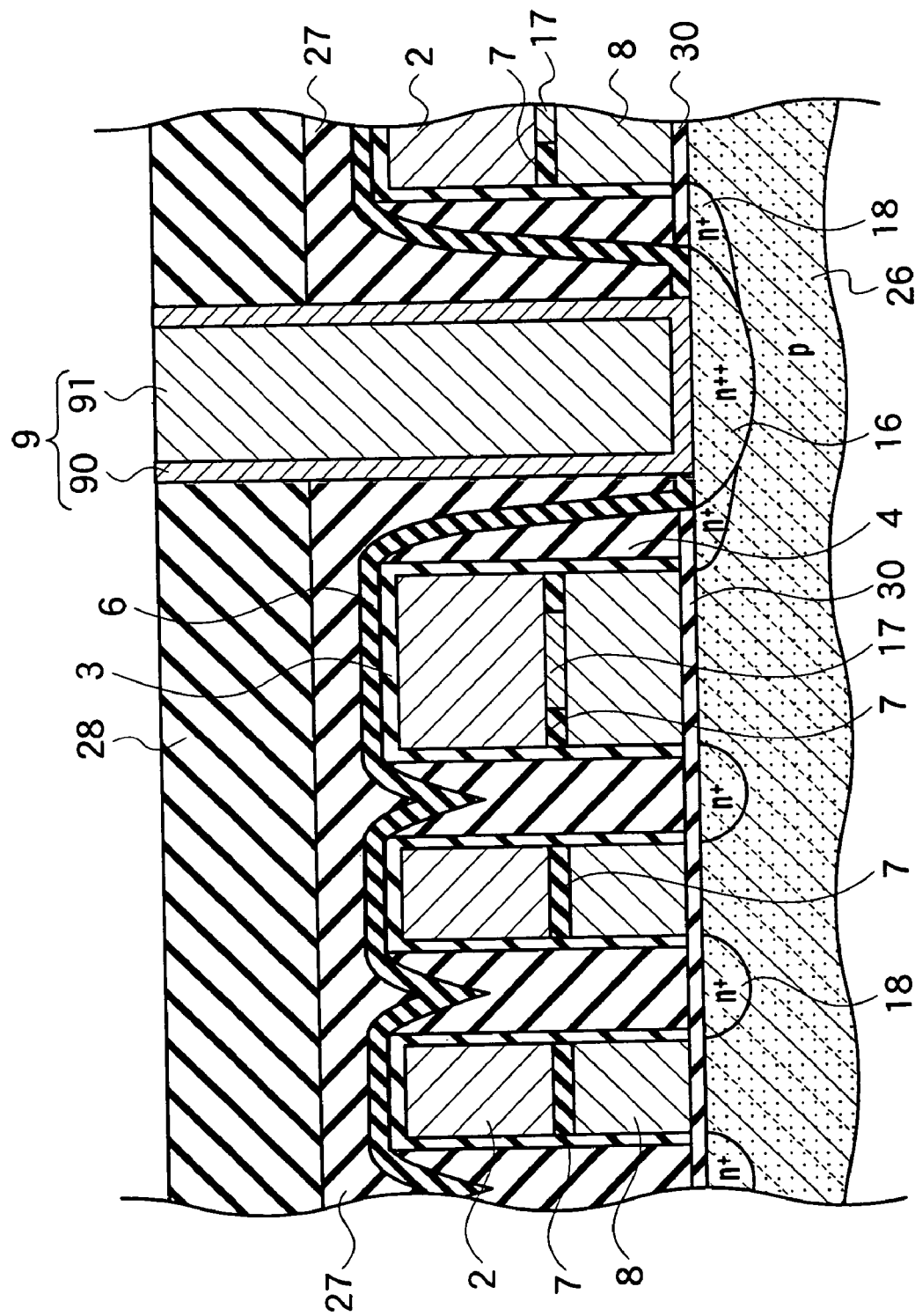
FIG. 14 shows a schematic cross-sectional device structure for describing a step of the fabrication method for the semiconductor memory according to the first embodiment of the present invention.

As shown in FIG. 14, a contact hole is opened in a region in which a bit line contact CB or a source line contact CS is to be formed through lithography and dry etching, and a contact plug 9 is then formed by embedding one or more conductive films 90, 91 in the opened hole.

As described thus far, according to the fabrication method for the semiconductor memory of the first embodiment of the present invention, arrangement of the NAND cell units 24 alternately sandwiching the two types of to-be-formed contact region widths L1 and L2 allows generation of voids between the source line contacts CS in the interlayer insulating film 27. However, generation of voids between the bit line contacts CB can be controlled, short circuits between adjacent bit lines can be avoided, and yield can be improved.

(Modified Example of the Fabrication Method)

In the semiconductor memory fabrication according to the first embodiment of the present invention, the contact plug 9 is formed after formation of the diffusion layer 16 with a high impurity density. However, as a simpler procedure, as shown in FIG. 15, after the step shown in FIG. 9, an insulating film 10 may be deposited across the entire surface of the device so as to form a bit line contact (CB) 11 using the same conductive film as with the contact plug 9 (FIG. 14) through lithography and patterning.

Figure 15:
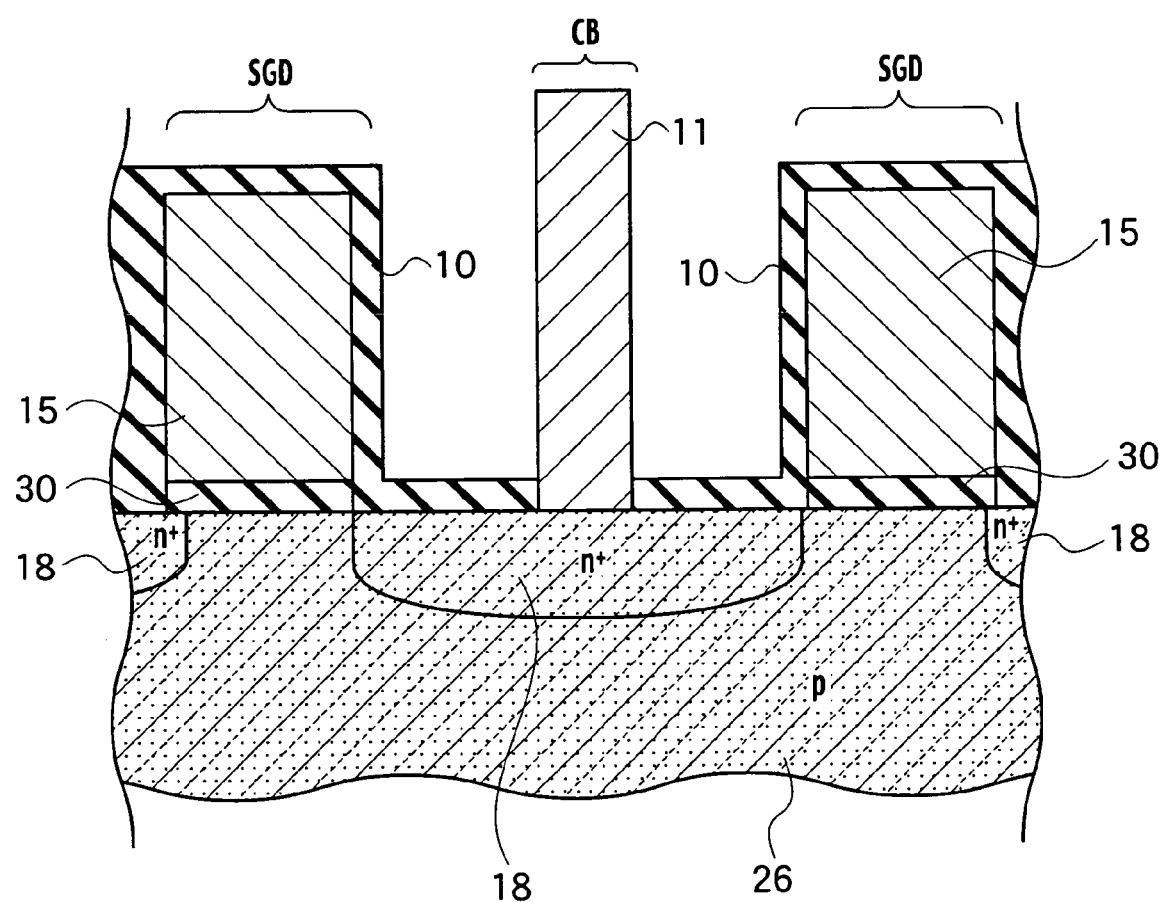
FIG. 15 shows a schematic cross-sectional device structure for describing a modified example of the fabrication method for the semiconductor memory according to the first embodiment of the present invention, and describes non self-aligned contacts.

According to the modified example of the semiconductor memory fabrication process as shown in FIG. 15, provision of a wider interval L1 between the select gate lines SGD provides a contact formation method through a non self-aligning step of void-free formation of the bit line contacts CB.

(Void Structure)

Figure 16:
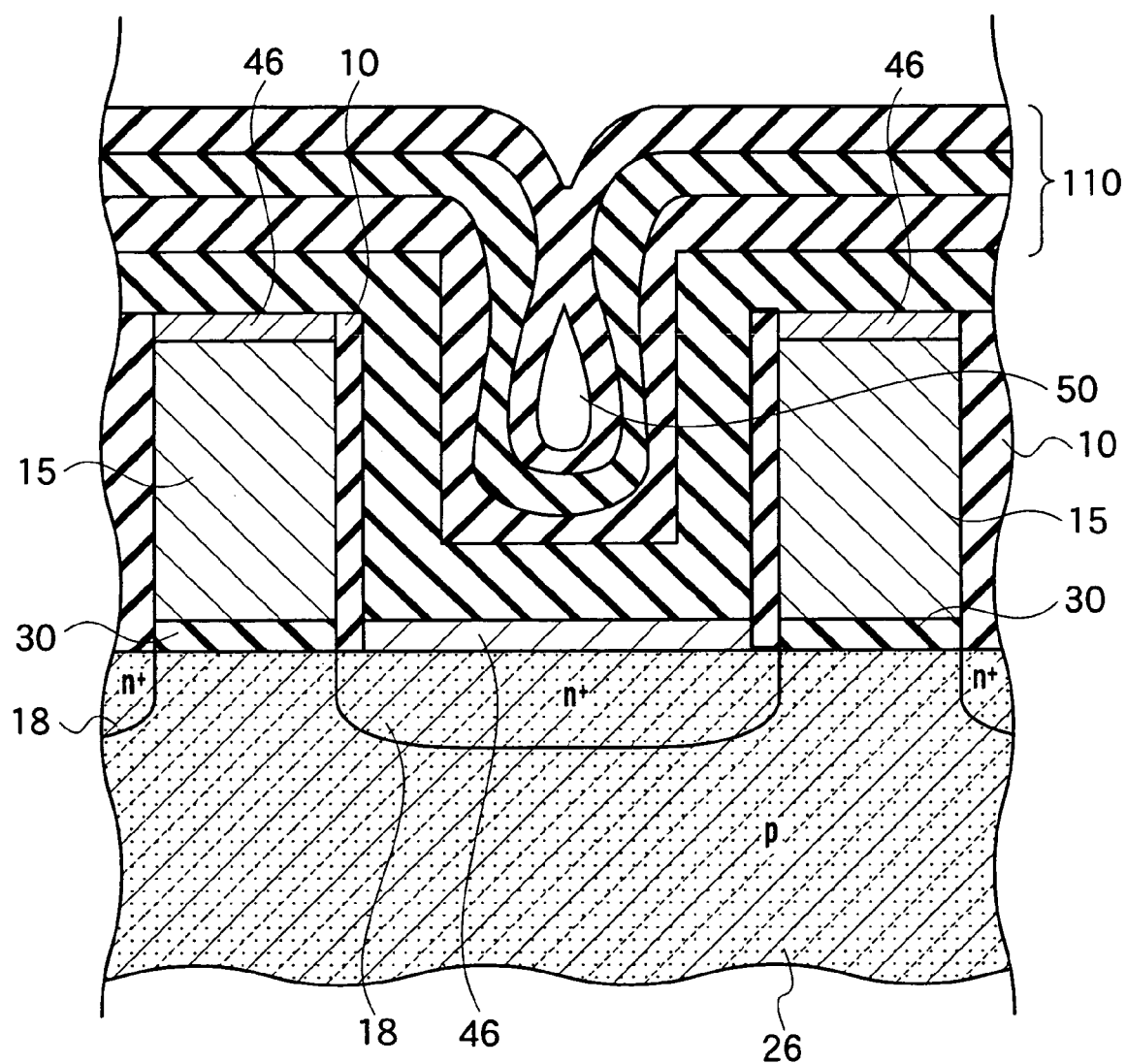
FIG. 16 shows a schematic cross-sectional device structure of the semiconductor memory according to the first embodiment of the present invention, and describes a void structure.

A void structure to be formed in the semiconductor memory according to the first embodiment of the present invention, as shown in FIG. 16, may be generated when a multi-level insulating film 110 with reflow characteristics is formed after formation of, for example, insulating films 10 and salicide films 46, on the diffusion layers 18 and the select gate electrodes 15. When the interval between the select gate electrodes 15 is small and the aspect ratio is high, a void 50 is formed during a process of successively depositing the multi-level insulating film 110 having reflow characteristics. The voids are positively available for the source line SL to which the source line contacts CS are all in contact; however, the voids for the bit line contacts CB may cause short circuits between bit lines, as described above.

According to the structure of the semiconductor memory, alternately sandwiching the two types of to-be-formed contact region widths L1 and L2 allows generation of voids between the source line contacts CS. However, generation of voids between the bit line contacts CB can be controlled, short circuits between adjacent bit lines can be avoided, and yield can be improved.

[Second Embodiment]

(NAND Type)

Figure 17:
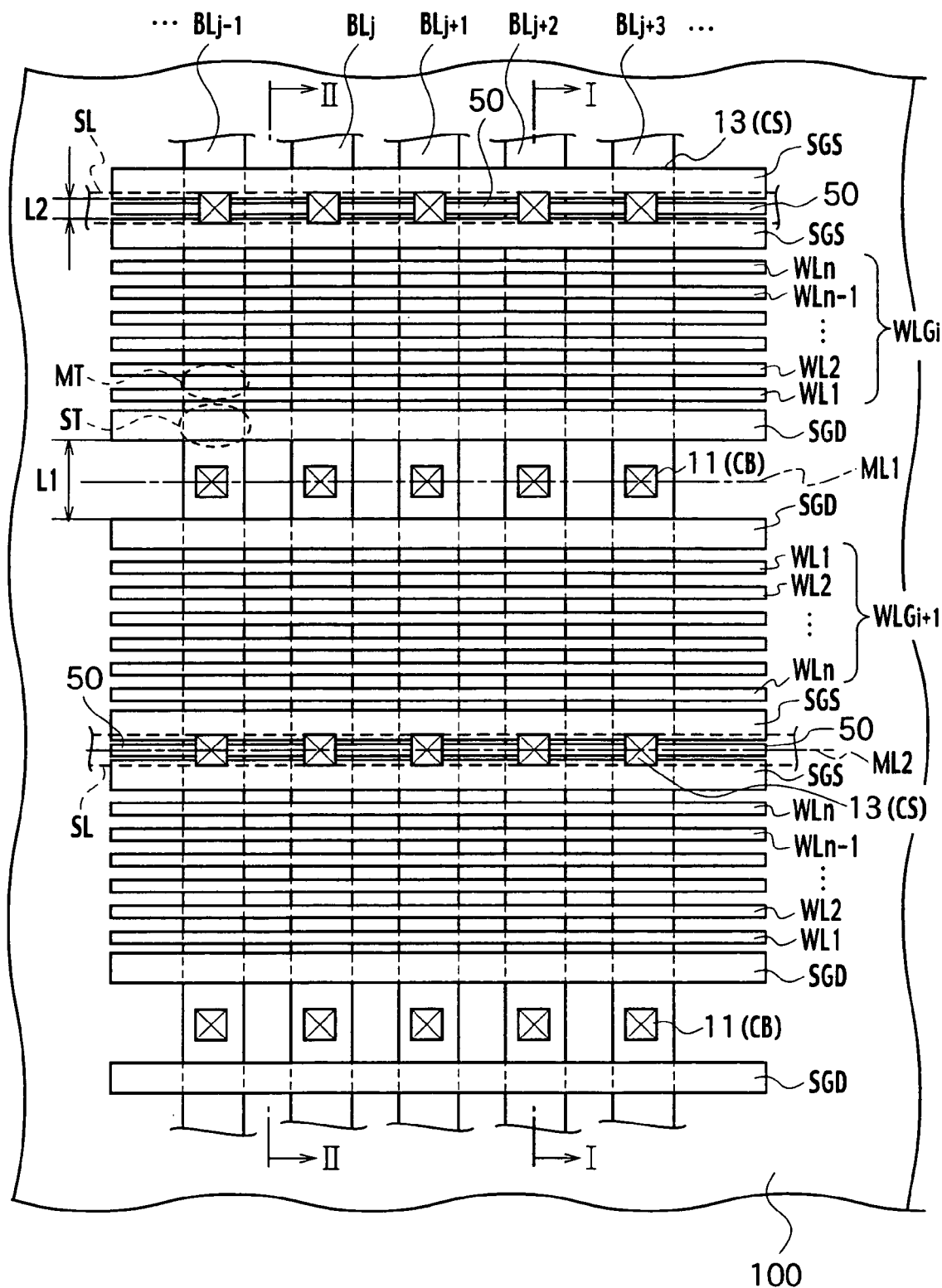
FIG. 17 shows a plan view of a schematic device pattern of a semiconductor memory according to a second embodiment of the present invention.
Figure 18:
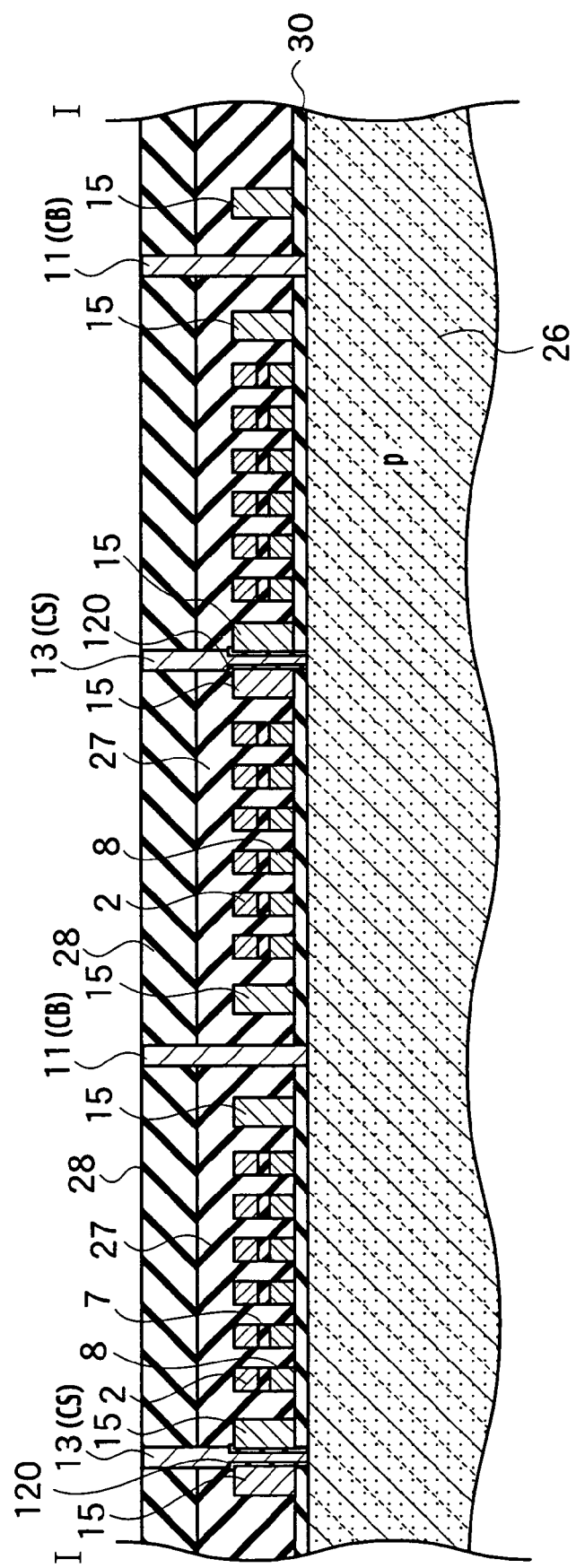
FIG. 18 shows a schematic cross-sectional device structure cut along the line I—I of FIG. 5.
Figure 19:
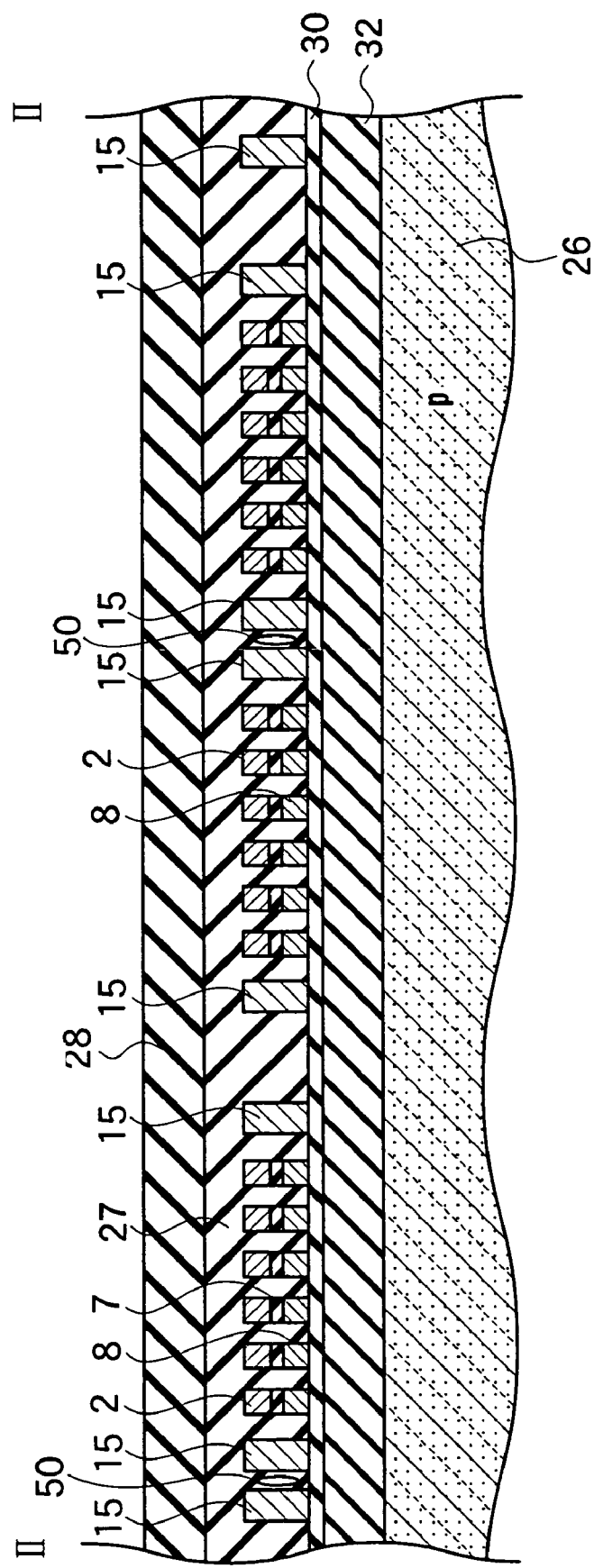
FIG. 19 shows a schematic cross-sectional device structure cut along the line II—II in FIG. 5.

A plan view of a schematic layout pattern of a semiconductor memory according to a second embodiment of the present invention is shown in FIG. 17, a schematic device cross section cut along the line I—I in FIG. 17 is shown in FIG. 18, and a schematic cross-sectional device structure cut along the line II—II is shown in FIG. 19. The circuitry and layout pattern of the semiconductor memory, according to the second embodiment of the present invention, are the same as in FIG. 7 and FIG. 8.

The semiconductor memory according to the second embodiment of the present invention, as shown in FIG. 17 or FIG. 37, is mounted on a semiconductor chip 100. The device includes: multiple bit lines $BL_{j-1}$, $BL_j$, $BL_{j+1}$, . . . ; multiple word line groups $WLG_i$, $WLG_{i+1}$, . . . orthogonal to the multiple bit lines $BL_{j-1}$, $BL_j$, $BL_{j+1}$, . . . ; a source line SL parallel and adjacent to respective word line groups $WLG_i$, $WLG_{i+1}$, . . . ; a pair of bit line side select gate lines SGD, which are adjacent to the inner sides of a pair of word line groups $WLG_i$, $WLG_{i+1}$ of the multiple word line groups $WLG_i$, $WLG_{i+1}$, . . . and arranged parallel to the word line groups $WLG_i$, $WLG_{i+1}$, . . . ; a pair of source line side select gate lines SGS, which is arranged with a topology parallel to the word line groups $WLG_i$, $WLG_{i+1}$, adjacent to the outer sides of the pair of word line groups $WLG_i$, $WLG_{i+1}$, and between a word line group adjacent to the pair of word line groups $WLG_i$, $WLG_{i+1}$ and that pair of word line groups; memory cell transistors MT, which are arranged at the intersections of the bit lines $BL_{j-1}$, $BL_j$, $BL_{j+1}$, . . . and word lines $WL_1$, $WL_2$, . . . , $WL_{n-1}$, $WL_n$; select gate transistors ST, which are arranged at the intersections of the bit lines $BL_{j-1}$, $BL_j$, $BL_{j+1}$, . . . and the select gate lines SGD and SGS; bit line contacts (CB) 11, which are linearly arranged along the word line groups $WLG_i$, $WLG_{i+1}$; and source line contacts (CS) 13, which are linearly arranged along the word line groups $WLG_i$, $WLG_{i+1}$ between a pair of source line side select gate lines SGS. The semiconductor memory has a structure with a periodic symmetrical pattern with the center line between the pair of bit line side select gate lines SGD as a first line of symmetry ML1 and the center line between the pair of source line side select gate lines SGS as a second line of symmetry ML2, and interval L1 between the pair of bit line side select gate lines SGD being greater than interval L2 between the pair of source line side select gate lines SGS.

The semiconductor memory according to the second embodiment of the present invention has a NAND flash EEPROM structure as a basic structure. The structure includes, as shown in FIGS. 18 and 19, memory cells, each with a stacked gate structure configured from a gate insulating film 30, which is formed as a tunnel insulating film on a p-well or semiconductor substrate 26, a floating gate 8, an inter-gate insulating film 7, and a control gate 2 arranged on the gate insulating film 30. Multiple memory cells are connected in series along the bit line length via source and drain diffusion layers (not shown in the drawing) of each memory cell transistor, select gate electrodes 15 of select gate transistors are arranged on both ends of the memory cells, and the memory cells are connected to bit line contacts (CB) 11 and self-aligned source line contacts (CS) 13 via those select gate transistors. As a result, each of memory cell units are so configured, and are arranged in parallel along the word line WL length orthogonal to the bit lines. Note that FIG. 19 corresponds to a cross-sectional structure of a device isolating region (STI) 32.

NAND cell units 24 are configured from memory cell transistors M0 through M15 and select gate transistors SG1 and SG2, as shown in detail in FIGS. 7 and 8. The drains of the select gate transistors SG1 are connected to the bit lines $BL_{j-1}$, $BL_j$, $BL_{j+1}$, . . . via respective bit line contacts CB, while the sources of the select gate transistors SG2 are connected to the common source line SL via respective self-aligned source line contacts (CS) 13.

The NAND cell units 24 shown in FIGS. 7 and 8 are arranged to alternately sandwich two types of to-be-formed contact region widths L1 and L2 along the column length in the NAND flash EEPROM shown in FIG. 17. The wider to-be-formed contact region width L1 is for the bit line contacts 11 and is a width allowing void-free embedding of interlayer insulating films 27 shown in FIGS. 18 and 19. The narrower to-be-formed contact region width L2 is for the source line contacts 13.

With the second embodiment, formation of the source line contacts (CS) 13 through self alignment allows a minimum width determined from design rules such as contact diameter, alignment margin and the like. Dimensions of the narrower width L2 may be set narrower than those of the to-be-formed source line contact region width L2 of the first embodiment.

In this manner, formation of a wide to-be-formed bit line contact region width L1 and a narrow, self-aligned, to-be-formed source line contact region width L2 corresponds to formation of, for example, wider areas of the diffusion regions for the bit line contacts CB than those for the source line contacts CS. In other words, an interval between the select gate lines SGD of adjacent select gate transistors on both sides of each bit line contact CB is wider than the interval between the select gate lines SGS of adjacent select gate transistors on both sides of each self-aligned source line contact CS.

(Fabrication Method)

Figure 20:
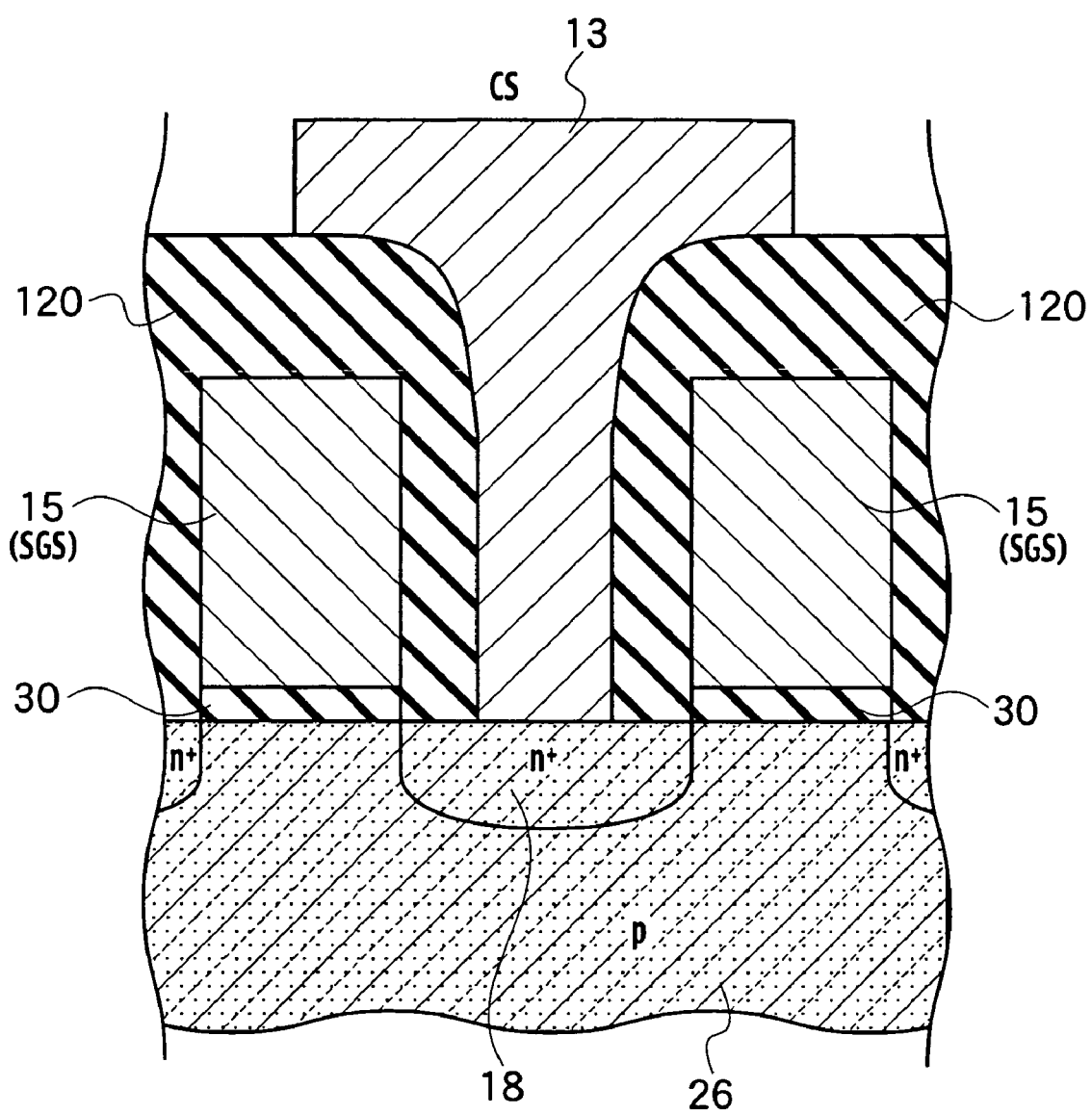
FIG. 20 shows a schematic cross-sectional device structure for describing a step of a fabrication method for the semiconductor memory according to the second embodiment of the present invention, and describes self-aligned contacts.

The semiconductor memory fabrication method according to the second embodiment of the present invention is the same as that according to the first embodiment shown in FIGS. 9 through 14, and thus description thereof is omitted. Formation of the bit line contacts (CB) 11 employs the same steps as in FIGS. 9 through 14. The source line contacts (CS) 13 are formed through self alignment as shown in FIG. 20.

According to the semiconductor memory fabrication method, according to the second embodiment, advantages are achieved such as arrangement of the NAND cell units 24 to alternately sandwich the two types of to-be-formed contact region widths L1 and L2 allows generation of voids between the source line contacts CS in the interlayer insulating film 27. However, generation of voids between the bit line contacts CB can be controlled, short circuits between adjacent bit lines can be avoided, and yield can be improved. Furthermore, formation of source line contacts through self alignment allows further narrowing of the interval L2 between source side select gate lines SGS and improvement in scale of integration.

(Modified Example of the Fabrication Method)

In the semiconductor memory fabrication according to the second embodiment, the contact plug 9 is formed after formation of the diffusion layer 16 with a high impurity density. However, with simpler steps, as shown in FIG. 15, after the step shown in FIG. 9, an insulating film 10 may be deposited across the entire surface of the device so as to form bit line contacts (CB) 11 using the same conductive film as with the contact plug 9 (FIG. 14) through lithography and patterning.

According to the modified example of the semiconductor memory fabrication process, as shown in FIG. 15, provision of a sufficiently wide interval L1 between the select gate lines SGD allows a contact formation method through a non self-aligning step of forming the bit line contacts CB without voids.

(Void Structure)

A void structure may be generated in the semiconductor memory according to the second embodiment of the present invention, as with the first embodiment as shown in FIG. 16, when a multi-level insulating film 110 with reflow characteristics is formed after formation of, for example, insulating films 10 and salicide films 46 on the diffusion layers 18 and the select gate electrodes 15. When the interval between the select gate electrodes 15 is small and the aspect ratio is high, a void 50 is formed during a process of successively depositing the multi-level insulating film 110 having reflow characteristics. The voids are positively available for the source line SL to which the self aligned source line contacts CS are in contact, because the source line SL and source line contacts CS are commonly short circuited to the ground potential. However, the voids for the bit line contacts CB may cause short circuits between bit lines, as described above.

According to the structure of the semiconductor memory, according to the second embodiment of the present invention, alternately sandwiching the two types of to-be-formed contact region widths L1 and L2 generates voids between the source line contacts CS in the interlayer insulating film 27; however, generation of voids between the bit line contacts CB can be controlled, short circuits between adjacent bit lines can be avoided, and yield can be improved.

[Third Embodiment]

(NAND Type)

Figure 21:
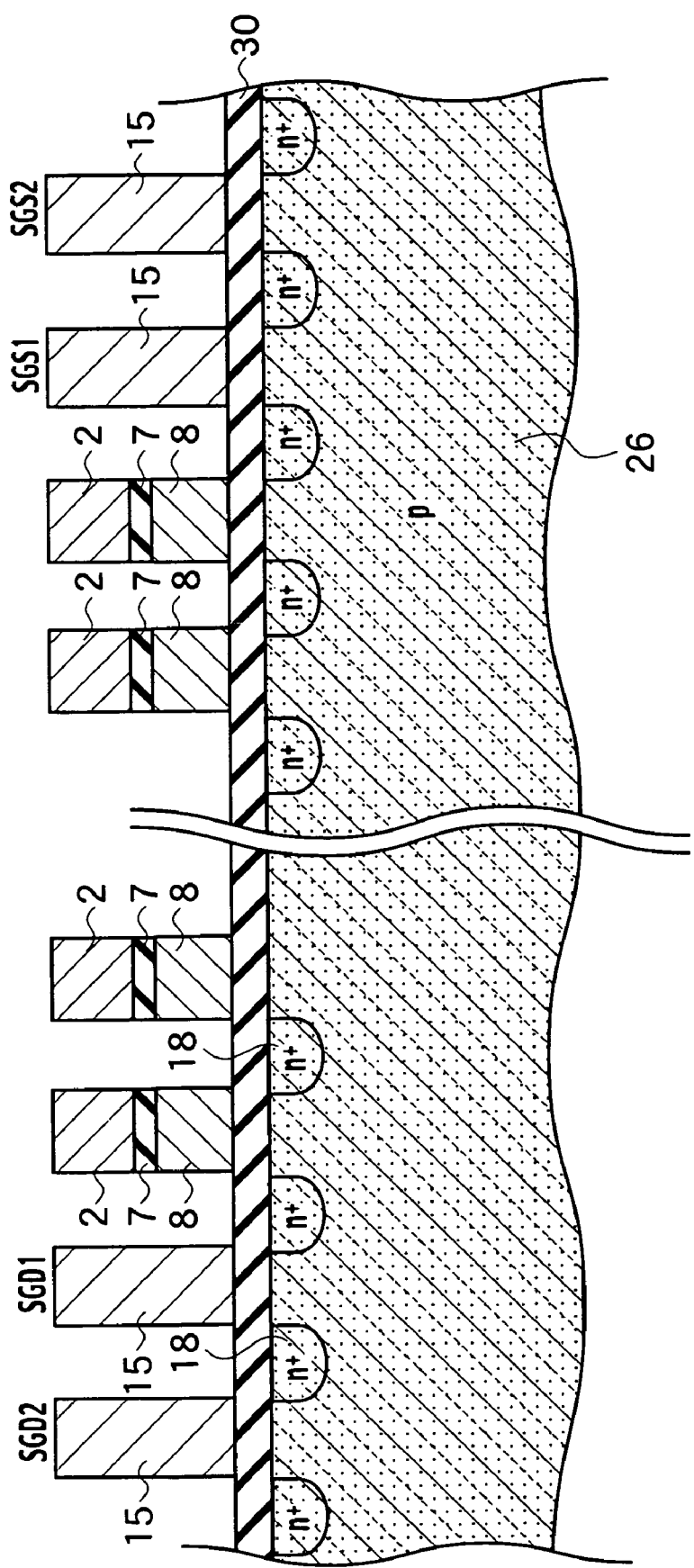
FIG. 21 shows a schematic cross-sectional device structure of a semiconductor memory according to a third embodiment of the present invention.
Figure 22:
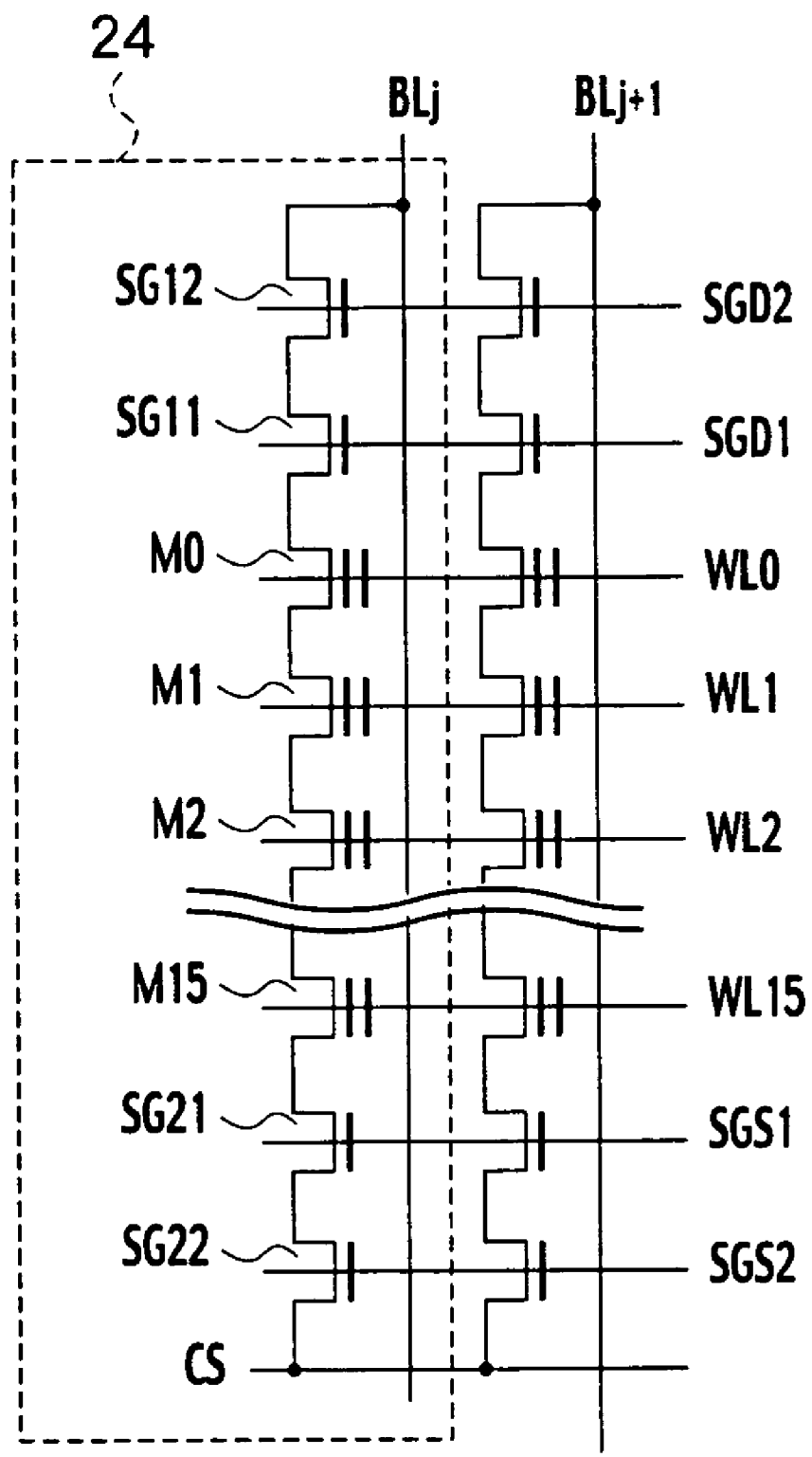
FIG. 22 is a schematic circuit diagram of the semiconductor memory according to the third embodiment of the present invention.

A schematic device cross section of a semiconductor memory according to a third embodiment of the present invention is shown in FIG. 21, and circuitry thereof is shown in FIG. 22.

The semiconductor memory according to the third embodiment has the same plan view of a layout pattern as in FIG. 4, and thus description thereof is omitted; however, it differs in that the bit line side select gate line SGD is replaced by two select gate lines SGD1 and SGD2, and the source line side select gate line SGS is replaced by two select gate lines SGS1 and SGS2. Provision of two select gate lines in this manner improves cutoff characteristics of selected transistors.

The semiconductor memory according to the third embodiment of the present invention has a NAND flash EEPROM structure as a basic structure. As shown in FIGS. 21 and 22, the structure includes a gate insulating film 30 which is used as a tunnel insulating film and is formed on a p-well or semiconductor substrate 26, and memory cells, each with a stacked gate structure configured from a floating gate 8, an inter-gate insulating film 7, and a control gate 2 arranged on the gate insulating film 30. Multiple memory cells are connected in series along the bit line length via source and drain diffusion layers 18 of each memory cell transistor, and two select gate electrodes 15 of select gate transistors are arranged on both ends of the memory cells and connected to bit line contacts CB and source line contacts CS. As a result, each of memory cell units are so configured and are arranged in parallel along the word line WL length orthogonal to the bit lines.

NAND cell units 24 are configured from memory cell transistors M0 through M15, bit line side select gate transistors SG11 and SG12, and source line side select gate transistors SG21 and SG22, as shown in detail in FIGS. 21 and 22. The drains of the select gate transistors SG12 are connected to bit lines . . . . BL$_j$, BL$_{j+1}$, . . . via respective bit line contacts CB, while the sources of the select gate transistors SG22 are connected to the common source line SL via respective source line contacts CS.

The NAND cell units 24 shown in FIGS. 21 and 22 are arranged to alternately sandwich two types of to-be-formed contact region widths L1 and L2 along the column length in the NAND flash EEPROM shown with the same plan view of a layout pattern as in FIG. 4. The wider to-be-formed contact region width L1 is for the bit line contacts 11 and is a width allowing embedding of interlayer insulating films 27 without voids. The narrower to-be-formed contact region width L2 is for the source line contacts 12 and should be a minimum width determined from design rules such as contact diameter, alignment margin and the like. This is because, as shown in FIGS. 4 and 22, it does not matter if voids are generated and short circuit the source line contacts (CS) 12 since the source line SL is shared by the NAND cell units 24 aligned along the row length.

In this manner, formation of a wide to-be-formed bit line contact region width L1 and a narrow to-be-formed source line contact region width L2 corresponds to formation of, for example, wider areas of the diffusion regions for the bit line contacts CB than those for the source line contacts CS. In other words, a wider interval is provided between the select gate lines SGD of adjacent select gate transistors on both sides of each bit line contact CB than the interval between the select gate lines SGS of adjacent select gate transistors on both sides of each source line contact CS.

According to the structure of the semiconductor memory, according to the third embodiment, alternately sandwiching the two types of to-be-formed contact region widths L1 and L2 allows generation of voids between the source line contacts CS in the interlayer insulating film 27. However, generation of voids between the bit line contacts CB can be controlled, short circuits between adjacent bit lines can be avoided, and yield can be improved. Furthermore, arrangement of two select gate lines provides a semiconductor memory with reduced leakage current flowing through the select gate transistors and improves cutoff characteristics.

(First Modified Example of the Third Embodiment)

Figure 23:
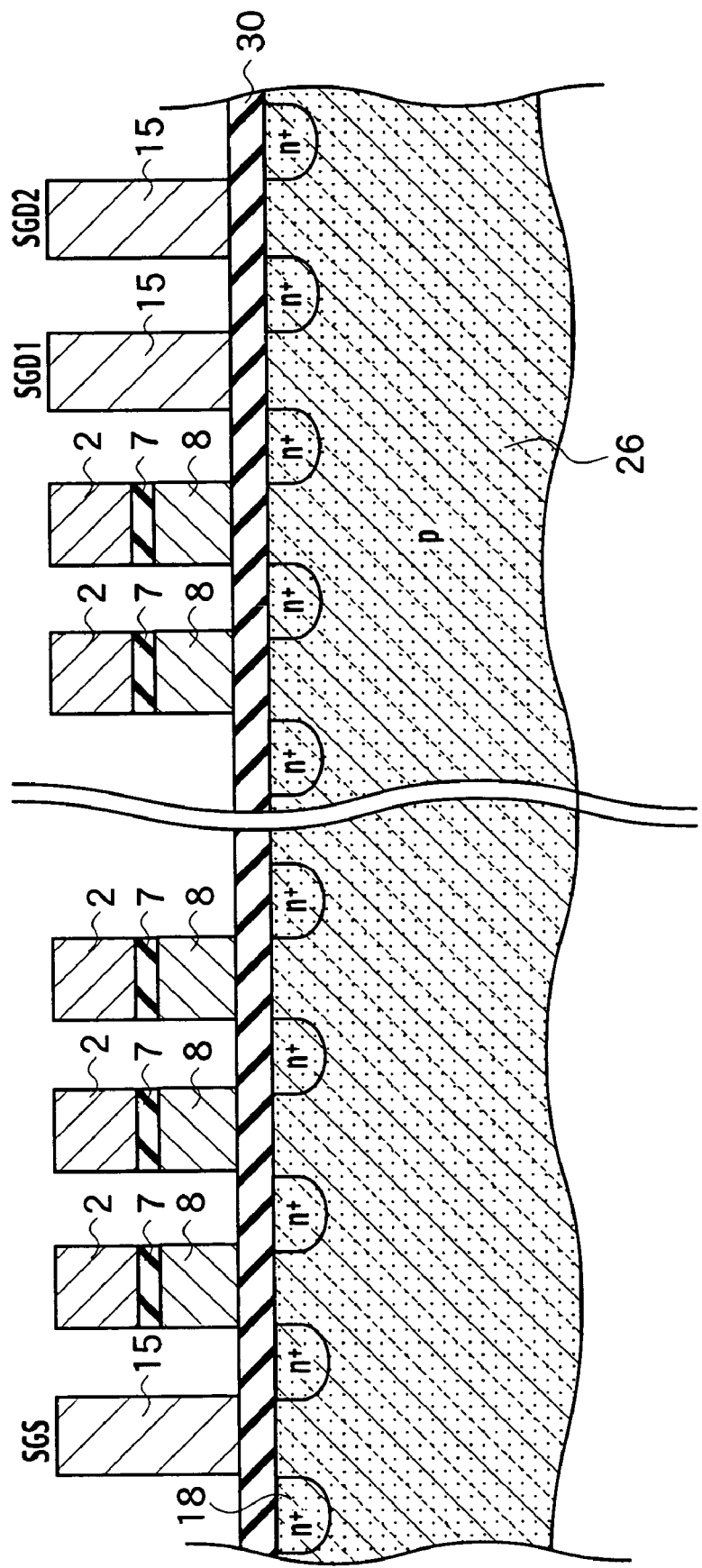
FIG. 23 shows a schematic cross-sectional device structure of a semiconductor memory according to a first modified example of the third embodiment of the present invention.

A schematic cross section of a semiconductor memory according to a first modified example of the third embodiment of the present invention is shown in FIG. 23.

The semiconductor memory according to the first modified example of the third embodiment has the same plan view of a layout pattern as in FIG. 4, and thus description thereof is omitted. However, the first modification differs in that the bit line side select gate line SGD is replaced by two select gate lines SGD1 and SGD2. Provision of two select gate lines in this manner improves cutoff characteristics of selected transistors.

The NAND cell units shown in FIG. 23 are arranged to alternately sandwich two types of to-be-formed contact region widths L1 and L2 along the column length in the NAND flash EEPROM shown with the same plan view of a layout pattern as in FIG. 4. The wider to-be-formed contact region width L1 is for the bit line contacts 11 and is a width allowing embedding of interlayer insulating films 27 without voids. The narrower to-be-formed contact region width L2 is for the source line contacts 12 and should be a minimum width determined from design rules such as contact diameter, alignment margin and the like. This is because it does not matter if voids are generated and short circuit the source line contacts (CS) 12 since the source line SL is shared by the NAND cell units aligned along the row length.

According to the structure of the semiconductor memory, according to the first modified example of the third embodiment, alternately sandwiching the two types of to-be-formed contact region widths L1 and L2 generates voids between the source line contacts CS. However, generation of voids between the bit line contacts CB can be controlled, short circuits between adjacent bit lines can be avoided, and yield can be improved. Furthermore, arrangement of two select gate lines provides a semiconductor memory with reduced leakage current flowing through the select gate transistors and improves in cutoff characteristics.

(Second Modified Example of the Third Embodiment)

Figure 24:
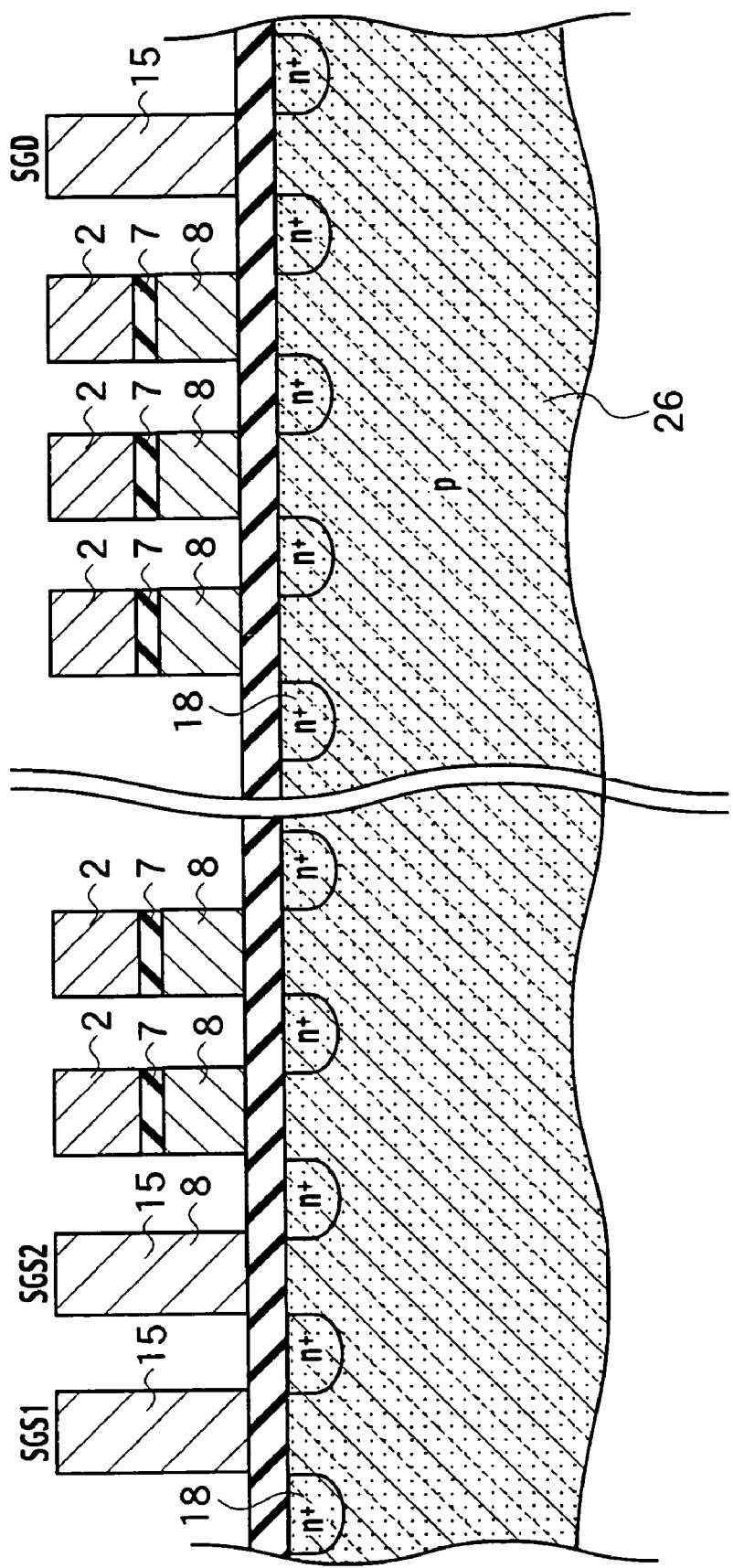
FIG. 24 shows schematic device cross-sectional structure of a semiconductor memory according to a second modified example of the third embodiment of the present invention.

A schematic cross section of a semiconductor memory according to a second modified example of the third embodiment is shown in FIG. 24.

The semiconductor memory according to the second modified example of the third embodiment has the same plan view of a layout pattern as in FIG. 4, and thus description thereof is omitted. However, the second modified example differs in that the source line side select gate line SGS is replaced by two select gate lines SGS1 and SGS2. Provision of two select gate lines in this manner improves cutoff characteristics of selected transistors.

The NAND cell units shown in FIG. 24 are arranged to alternately sandwich two types of to-be-formed contact region widths L1 and L2 along the column length in the NAND flash EEPROM shown with the same plan view of a layout pattern as in FIG. 4. The wider to-be-formed contact region width L1 is for the bit line contacts 11 and is a width allowing embedding of interlayer insulating films 27 without voids. The narrower to-be-formed contact region width L2 is for the source line contacts 12 and should be a minimum width determined from design rules such as contact diameter, alignment margin and the like. This is because it does not matter if voids are generated and short circuit the source line contacts (CS) 12 since the source line SL is shared by the NAND cell units aligned along the row length.

According to the structure of the semiconductor memory, according to the second modified example of the third embodiment, alternately sandwiching the two types of to-be-formed contact region widths L1 and L2 generates voids between the source line contacts CS. However, generation of voids between the bit line contacts CB can be controlled, short circuits between adjacent bit lines can be avoided, and yield can be improved. Furthermore, arrangement of two select gate lines provides a semiconductor memory with reduced leakage current flowing through the select gate transistors and improvement in cutoff characteristics.

[Fourth Embodiment]

(AND Type)

Figure 25:
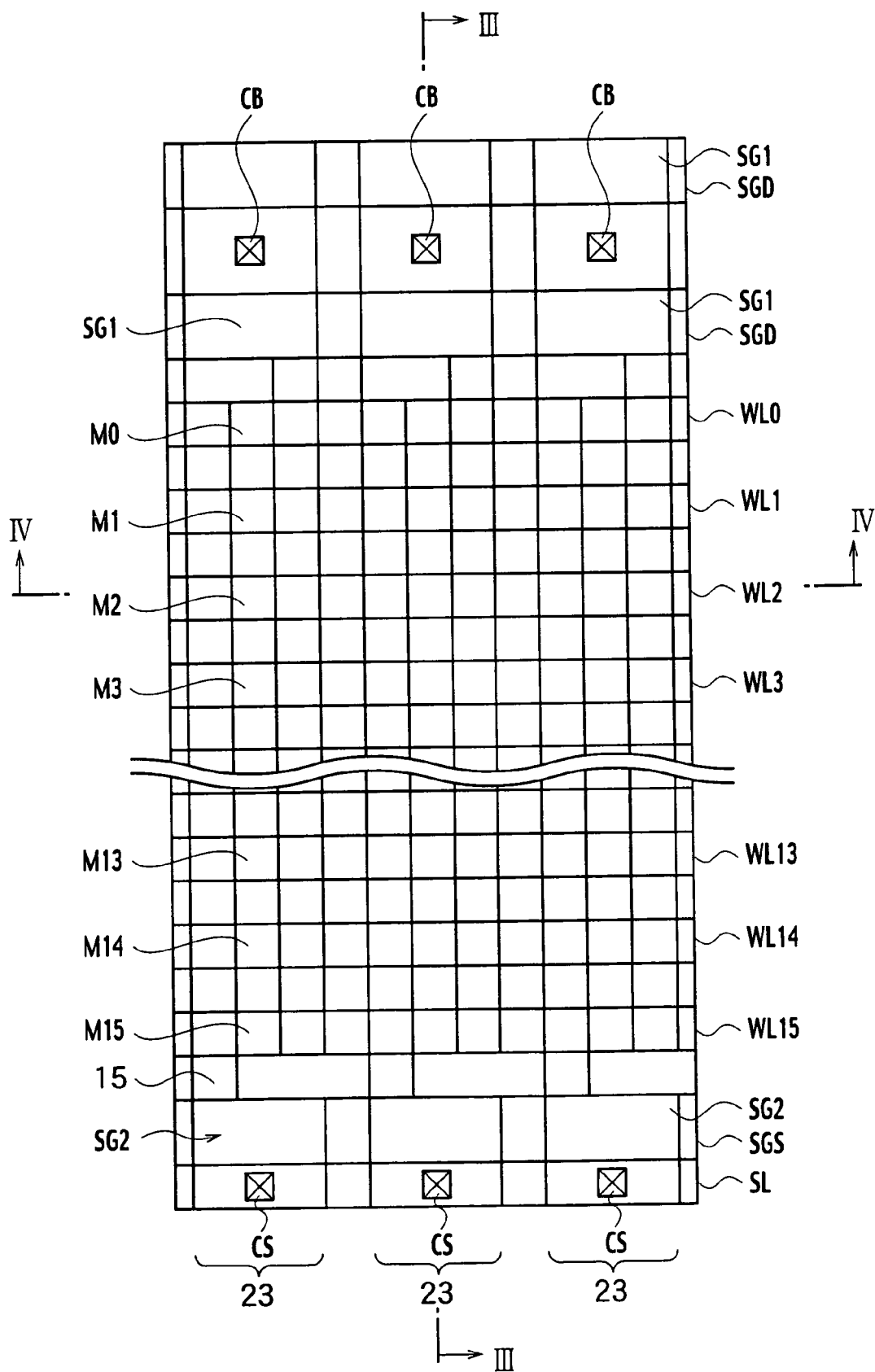
FIG. 25 shows a plan view of a schematic AND device pattern of a semiconductor memory according to a fourth embodiment of the present invention.
Figure 26:
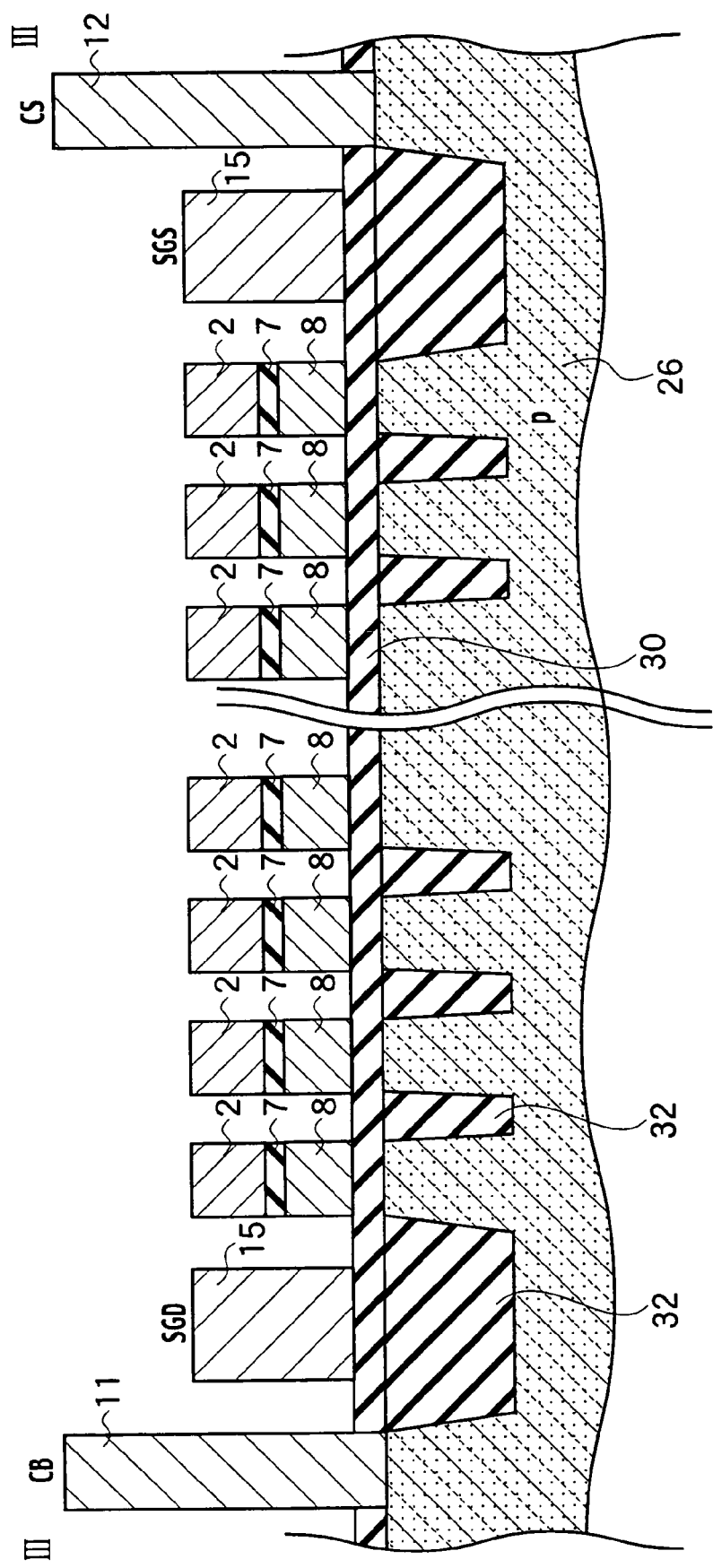
FIG. 26 shows a schematic cross-sectional device structure cut along the line III—III of FIG. 25.
Figure 27:
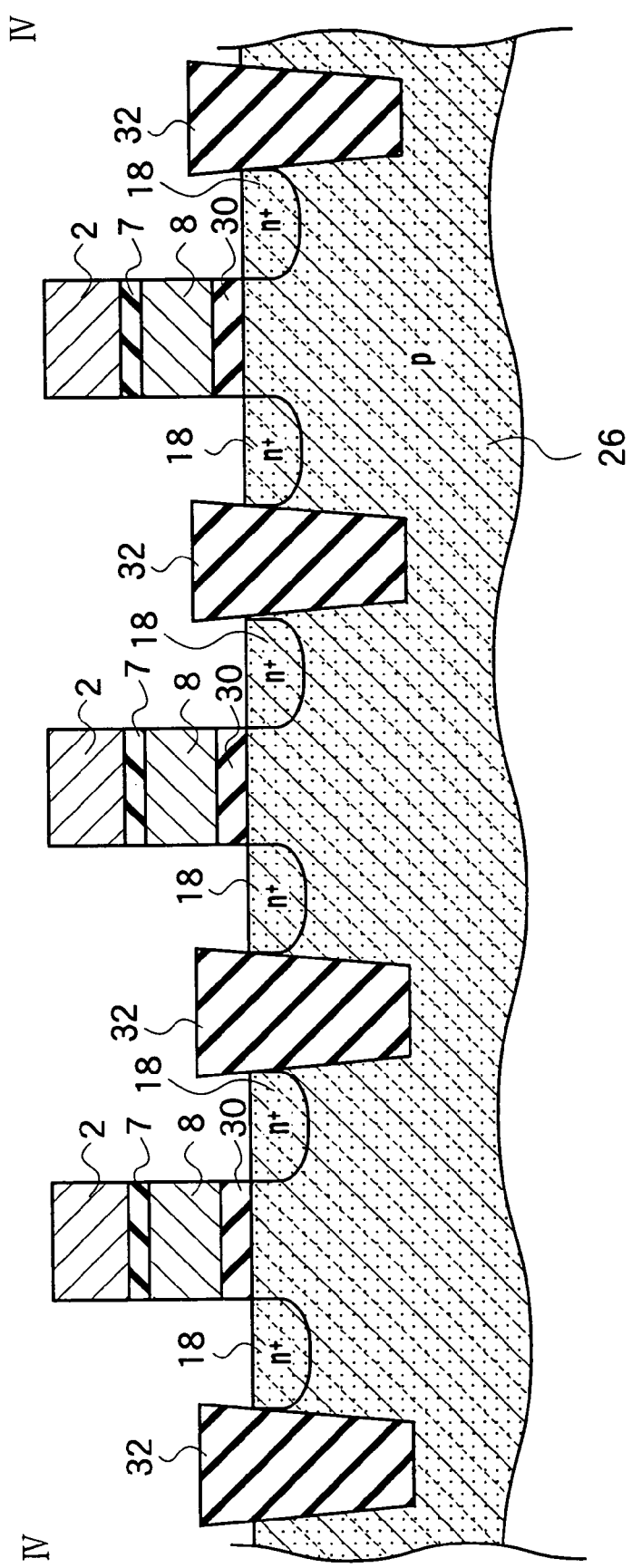
FIG. 27 shows a schematic cross-sectional device structure cut along the line IV—IV of FIG. 25.
Figure 28:
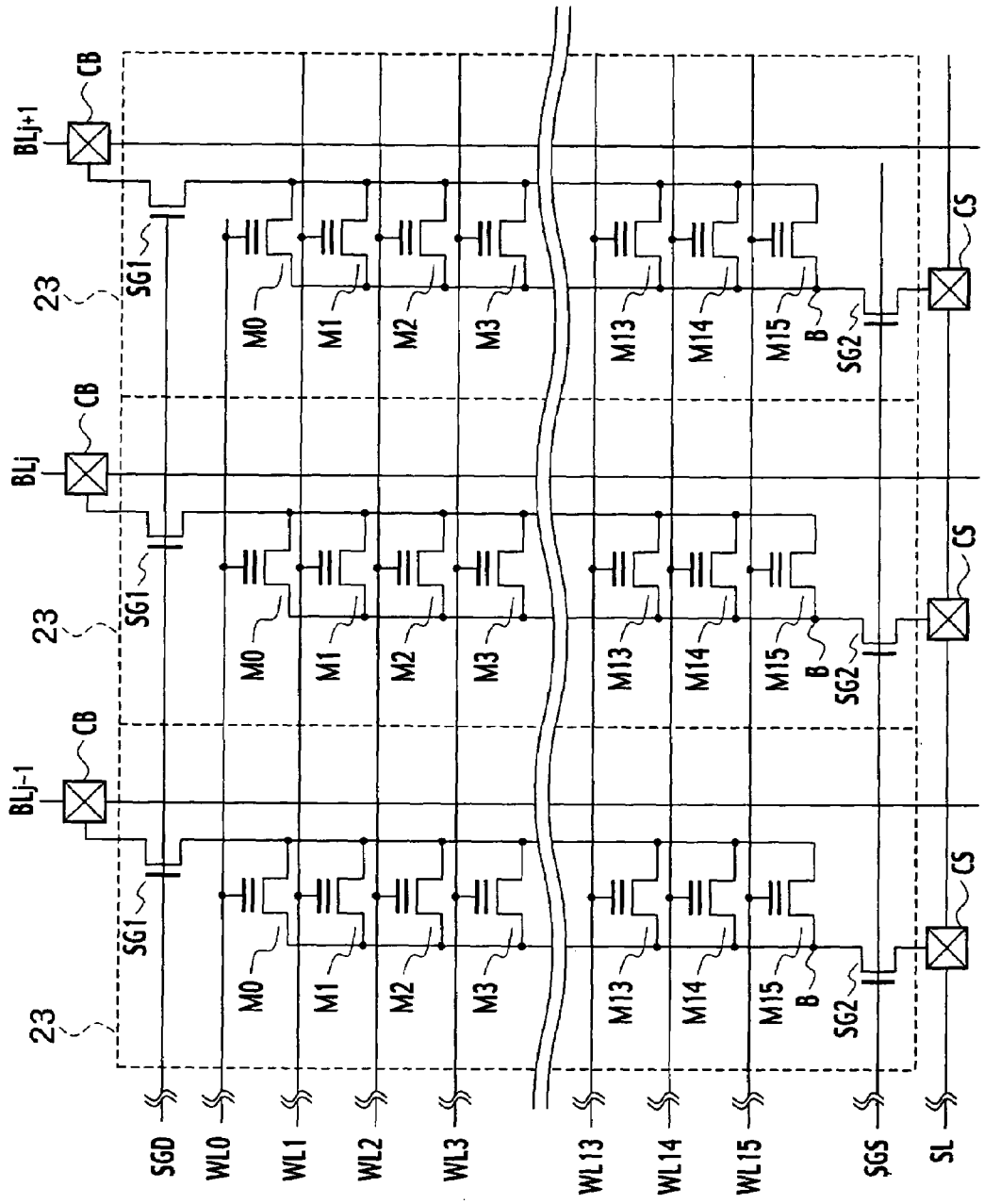
FIG. 28 is a diagram showing an exemplary AND circuitry of the semiconductor memory according to the fourth embodiment of the present invention.

A plan view of a schematic layout pattern of a semiconductor memory according to a fourth embodiment of the present invention is shown in FIG. 25, a schematic device cross section cut along the line I—I in FIG. 25 is shown in FIG. 26, and a schematic cross-sectional device structure cut along the line II—II is shown in FIG. 27. Furthermore, an AND circuitry of the semiconductor memory according to the fourth embodiment of the present invention is shown in FIG. 28.

An arrangement pattern of bit line contacts CB and source line contacts CS in the AND structure can be schematically shown as with the NAND structure shown in FIG. 37 while referencing the plan view of the layout pattern shown in FIG. 25.

The plan view of a pattern of the semiconductor memory according to the fourth embodiment of the present invention is arranged as with either FIG. 4 or FIG. 37, mounted on a semiconductor chip 100. The pattern includes: multiple bit lines $BL_{j-1}$, $BL_j$, $BL_{j+1}$, . . . ; multiple word line groups $WLG_i$, $WLG_{i+1}$, . . . orthogonal to the multiple bit lines $BL_{j-1}$, $BL_j$, $BL_{j+1}$, . . . ; a source line SL parallel to and adjacent to respective word line groups $WLG_i$, $WLG_{i+1}$, . . . ; a pair of bit line side select gate lines SGD, which are adjacent to the inner sides of a pair of word line groups $WLG_i$, $WLG_{i+1}$ of the multiple word line groups $WLG_i$, $WLG_{i+1}$, . . . and arranged parallel to the word line groups $WLG_i$, $WLG_{i+1}$, . . . ; a pair of source line side select gate lines SGS, which is arranged with a topology parallel to the word line groups $WLG_i$, $WLG_{i+1}$, . . . , adjacent to the outer sides of the pair of word line groups $WLG_i$, $WLG_{i+1}$, and between a word line group adjacent to the pair of word line groups $WLG_i$, $WLG_{i+1}$ and that pair of word line groups; memory cell transistors MT, which are arranged on intersections of the bit lines $BL_{j-1}$, $BL_j$, $BL_{j+1}$, . . . and word lines $WL_1$, $WL_2$, . . . , $WL_{n-1}$, $WL_n$; select gate transistors ST, which are arranged at the intersections of the bit lines $BL_{j-1}$, $BL_j$, $BL_{j+1}$, . . . and the select gate lines SGD and SGS, bit line contacts (CB) 11, which are linearly arranged along the word line groups $WLG_i$, $WLG_{i+1}$; and source line contacts (CS) 12, which are linearly arranged along the word line groups $WLG_i$, $WLG_{i+1}$ between a pair of source line side select gate lines SGS. The semiconductor memory has a structure having a periodic symmetrical pattern with the center line between the pair of bit line side select gate lines SGD as a first line of symmetry ML1 and the center line between the pair of source line side select gate lines SGS as a second line of symmetry ML2. An interval L1 between the pair of bit line side select gate lines SGD is greater than interval L2 between the pair of source line side select gate lines SGS.

The semiconductor memory according to the fourth embodiment of the present invention has an AND flash EEPROM structure as a basic structure. The structure includes, as shown in FIGS. 26 and 27, memory cells, each with a stacked gate structure configured from a gate insulating film 30, which is formed as a tunnel insulating film on a p-well or semiconductor substrate 26, a floating gate 8, an inter-gate insulating film 7, and a control gate 2 arranged on the gate insulating film 30 isolated from each other by device isolating regions (STI) 32. As shown in FIGS. 27 and 28, multiple memory cells are connected in parallel along the bit line length via source and drain diffusion layers 18 of each memory cell transistor; select gate electrodes 15 of select gate transistors are arranged on both ends of the memory cells; and the memory cells are connected to bit line contacts (CB) 11 and source line contacts (CS) 12 via those select gate transistors. As a result, each of the AND memory cell units are so configured and arranged in parallel along the word line WL length orthogonal to the bit lines.

AND cell units 23 are configured from memory cell transistors M0 through M15 connected in parallel and select gate transistors SG1 and SG2, as shown in detail in FIGS. 25 through 28. The drains of the select gate transistors SG1 are connected to the bit lines . . . , $BL_{j-1}$, $BL_j$, $BL_{j+1}$, . . . via respective bit line contacts CB, and the sources of the select gate transistors SG2 are connected to the common source line SL via respective source line contacts CS.

The AND cell units 23 shown in FIGS. 25 through 28 are arranged to alternately sandwich two types of to-be-formed contact region widths L1 and L2 along the column length in the AND flash EEPROM formed with the same plan view as the layout pattern shown in FIG. 4. The wider to-be-formed contact region width L1 is for the bit line contacts 11 and is a width allowing void-free embedding of an interlayer insulating film 27. The narrower to-be-formed contact region width L2 is for the source line contacts 12 and should be a minimum width determined from design rules such as contact diameter, alignment margin and the like. This is because, as shown in FIGS. 4, 25 and 28, it does not matter if voids 50 are generated and short circuit the source line contacts (CS) 12 since the source line SL is shared by the AND cell units 23 aligned along the row length.

In this manner, formation of a wide to-be-formed bit line contact region width L1 and a narrow to-be-formed source line contact region width L2 corresponds to formation of wider areas of the diffusion regions for the bit line contacts CB than those for the source line contacts CS. In other words, this arrangements provides a longer interval between the select gate lines SGD of adjacent select gate transistors on both sides of each bit line contact CB than the interval between the select gate lines SGS of adjacent select gate transistors on both sides of each source line contact CS.

An AND cell unit represented by 23, enclosed by a dotted line in FIG. 28. In each AND cell unit 23, the drain regions of the memory cell transistors M0 through M15 are connected in common and the source regions thereof are also connected in common. Namely, in each AND cell unit 23 of an AND flash memory as shown in FIG. 28, the memory cell transistors M0 through M15 are connected in parallel, and a single bit line side select transistor SG1 is connected on one side thereof, and a single source line select transistor SG2 is connected on the other side thereof. Word lines WL0 through WL15 are connected to the respective gates of the memory cell transistors M0 through M15. The select gate line SGD is connected to the gates of the bit line side select transistors SG1. The select gate line SGS is connected to the gates of the source line side select transistors SG2. The drains of bit line side select transistors SG1 are connected to the bit lines $BL_{j-1}$, $BL_j$, $BL_{j+1}$, . . . via the bit line contacts CB. The sources of the source line side select transistors SG2 are connected to the source line SL via the source line contacts CS.

According to the semiconductor memory of the fourth embodiment of the present invention, even with the AND circuitry, alternately sandwiching the two types of to-be-formed contact region widths L1 and L2 generates voids between the source line contacts CS. However, generation of voids between the bit line contacts CB can be controlled, short circuits between adjacent bit lines can be avoided, and yield can be improved.

(Modified Example of the Fourth Embodiment)

Figure 29:
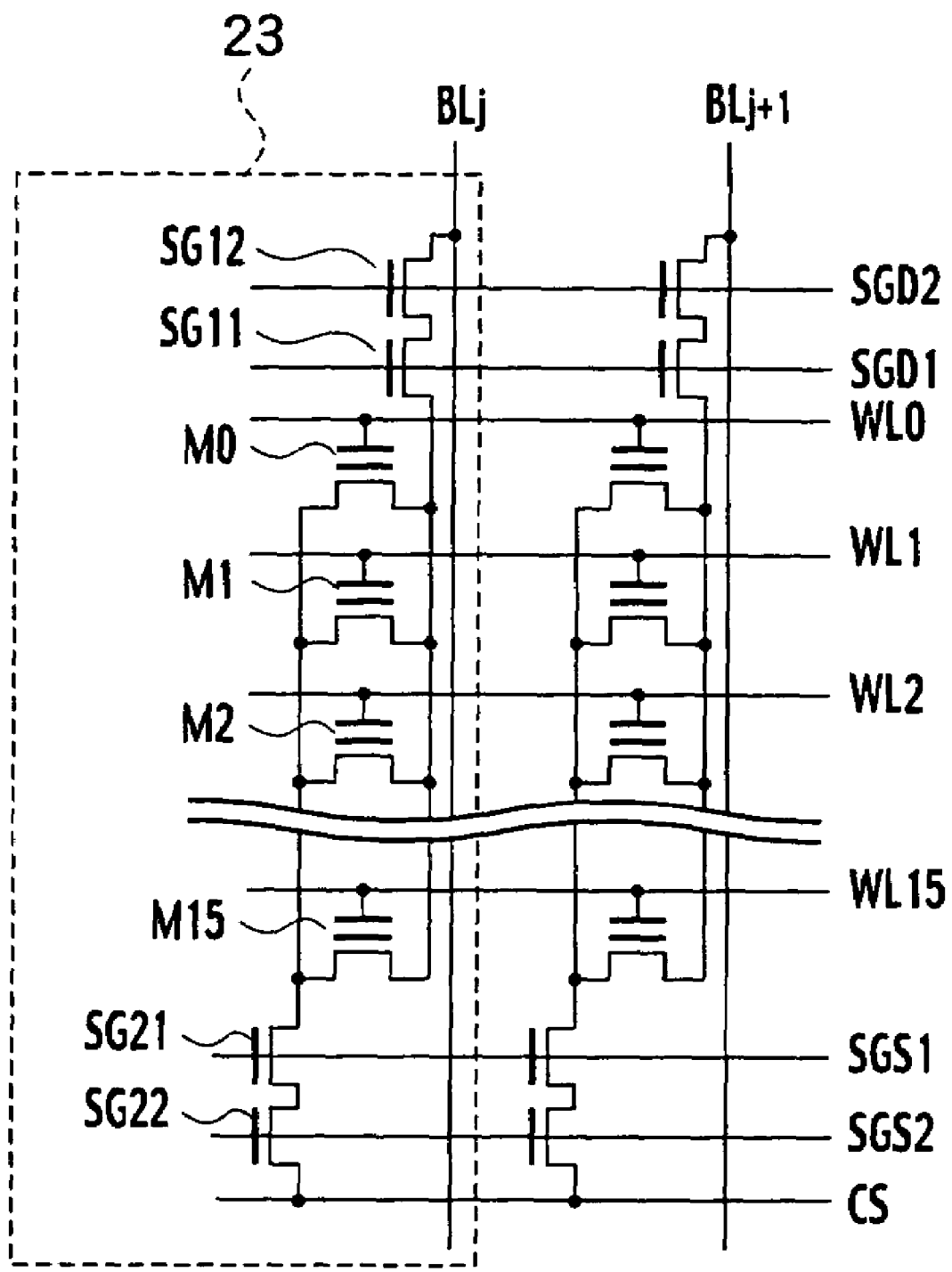
FIG. 29 is a diagram showing an exemplary AND circuitry of the semiconductor memory according to the fourth embodiment of the present invention.

An AND circuitry of the semiconductor memory according to a modified example of the fourth embodiment of the present invention is shown in FIG. 29. In order to secure cutoff characteristics of select gate transistors, the number of select transistors is not limited to one and may naturally have a structure of multiple select transistors connected in series.

The semiconductor memory, according to a modified example of fourth embodiment of the present invention, has the same plan view of a layout pattern as with FIG. 25, and thus description thereof is omitted. However, it differs in that the bit line side select gate line SGD is replaced by two select gate lines SGD1 and SGD2, and the source line side select gate line SGS is replaced by two select gate lines SGS1 and SGS2. Provision of two select gate lines in this manner improves cutoff characteristics of selected transistors.

[Fifth Embodiment]

(NOR Structure)

Figure 30:
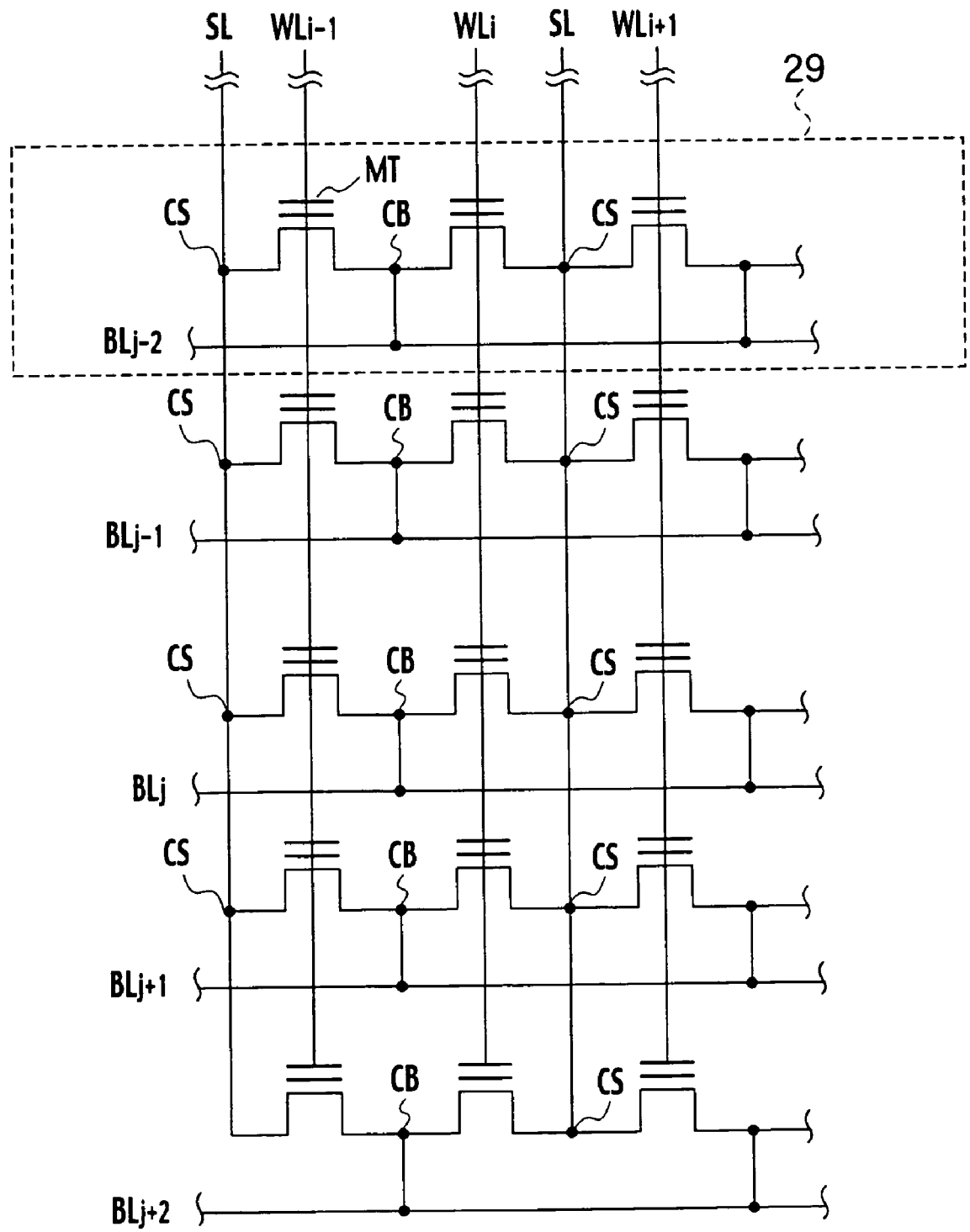
FIG. 30 is a diagram showing an exemplary NOR circuitry of a semiconductor memory according to a fifth embodiment of the present invention.
Figure 31:
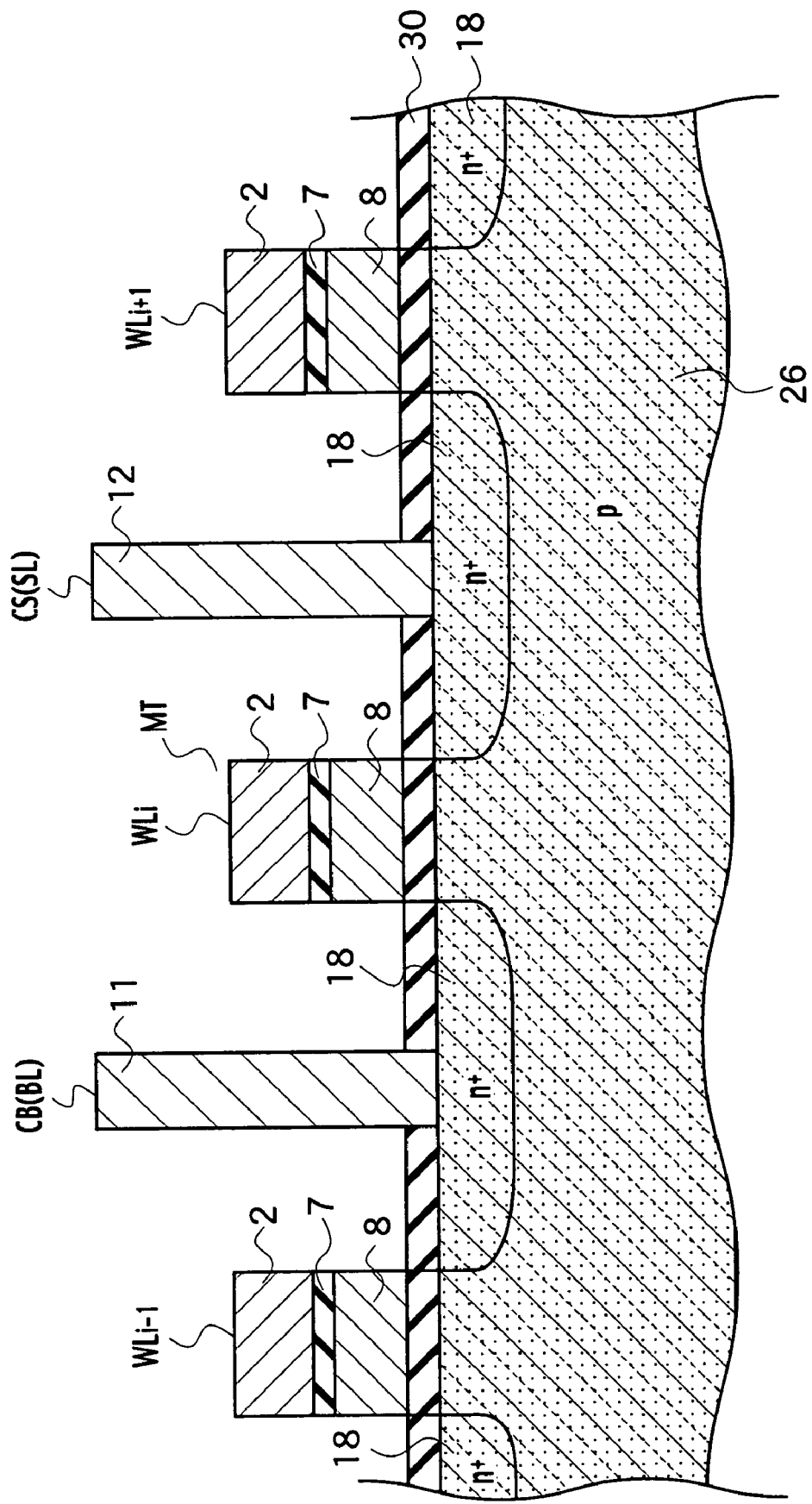
FIG. 31 shows a schematic cross-sectional device structure corresponding to the NOR circuitry of the semiconductor memory according to the fifth embodiment of the present invention.
Figure 32:
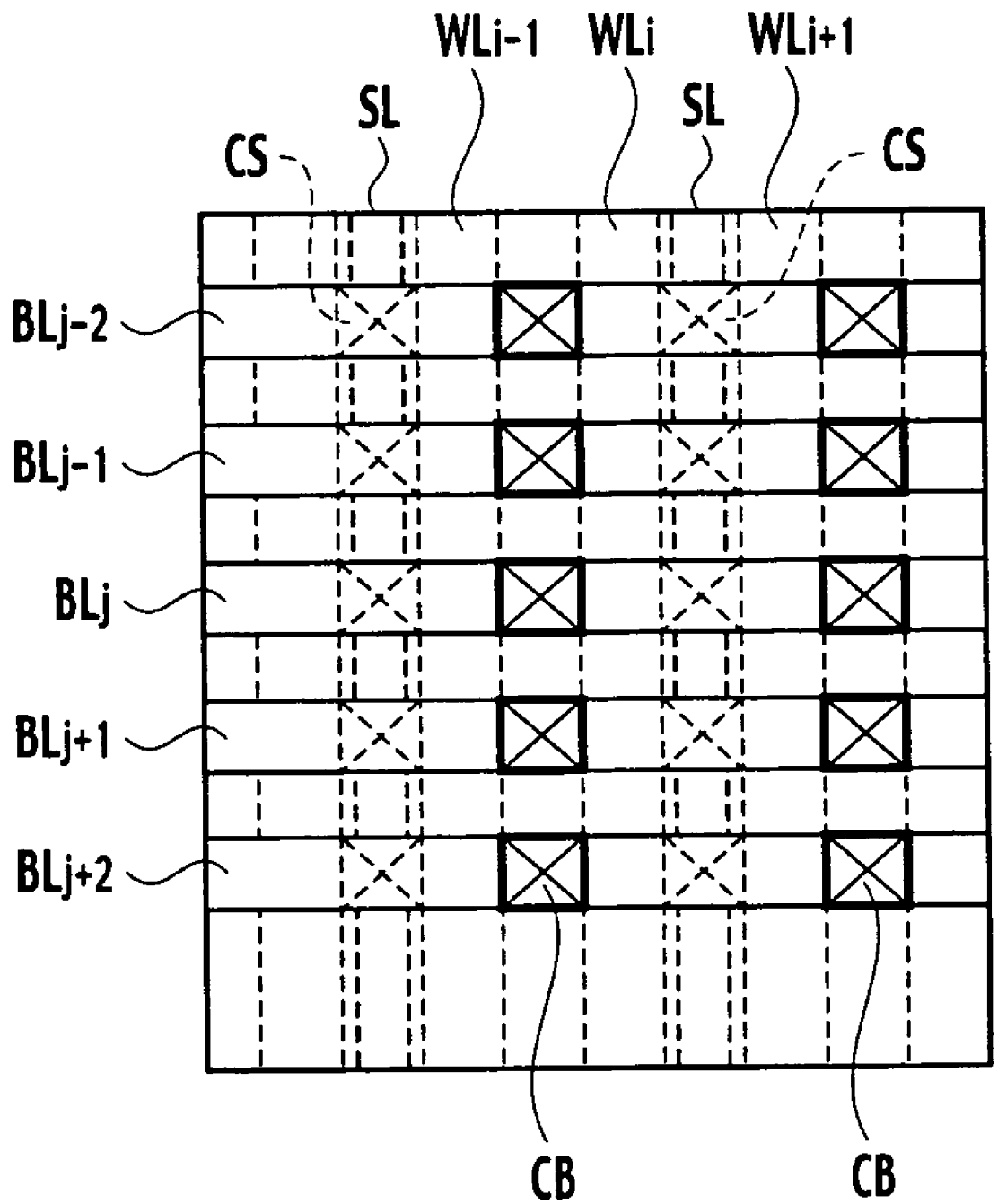
FIG. 32 shows a plan view of a schematic device pattern corresponding to the NOR circuitry of the semiconductor memory according to the fifth embodiment of the present invention.

A semiconductor memory according to a fifth embodiment of the present invention is an example structured with NOR memory cell arrays. The circuitry is shown in FIG. 30 and a schematic device cross section of the vicinity of a NOR cell unit 29 in FIG. 30 is shown in FIG. 31. Furthermore, a plan view of a schematic device pattern of the semiconductor memory according to the fifth embodiment of the present invention is shown in FIG. 32.

A NOR cell unit is represented by 29, enclosed by a dotted line in FIG. 30. In the NOR cell unit 29, the common source region of two adjacent memory cell transistors is connected to a source line SL via a source line contact CS, while the common drain region is connected to bit lines $BL_{j-2}$, $BL_{j-1}$, $BL_j$, $BL_{j+1}$, $BL_{j+2}$ via a bit line contact CB. This structure is characterized by faster reading than the NAND structure.

The semiconductor memory according to the fifth embodiment of the present invention has a NOR flash EEPROM structure as a basic structure. The structure includes, as shown in FIG. 31, memory cells, each with a stacked gate structure configured from a gate insulating film 30, which is formed as a tunnel insulating film on a p-well or semiconductor substrate 26, a floating gate 8, an inter-gate insulating film 7, and a control gate 2 arranged on the gate insulating film 30. One of source and drain diffusion layers 18 of each memory cell transistor is connected to a bit line BL via a bit line contact (CB) 11, and the other is connected to the source line SL via a source line contact (CS) 12.

As shown in FIG. 30, the drain regions of multiple memory cells connected in series along the length of the bit lines $BL_{j-2}$, $BL_{j-1}$, $BL_j$, $BL_{j+1}$, $BL_{j+2}$ are connected to the common bit lines $BL_{j-2}$, $BL_{j-1}$, $BL_j$, $BL_{j+1}$, $BL_{j+2}$, respectively, and multiple memory cells with source regions connected to the common source line SL via source line contacts CS each have a control gate 2 connected to common word lines $WL_{i-1}$, $WL_i$, $WL_{i+1}$, . . . , respectively. The multiple memory cells connected in series along the length of the bit lines $BL_{j-2}$, $BL_{j-1}$, $BL_j$, $BL_{j+1}$, $BL_{j+2}$ configure a single NOR cell unit 29, and a plurality of such memory cell units is arranged in parallel along the word line WL length orthogonal to the bit lines.

Each NOR cell unit 29 is configured from memory cell transistors M0 through M15 and select gate transistors SG1 and SG2, as shown in detail in FIGS. 7 and 8. The drains of the select gate transistors SG1 are connected to the bit lines . . . , $BL_{j-1}$, $BL_j$, $BL_{j+1}$, . . . via respective bit line contacts CB, while the sources of the select gate transistors SG2 are connected to the common source line SL via respective source line contacts CS.

The NOR cell unit 29 shown in FIG. 30 is arranged as in the plan view of the layout pattern shown in FIG. 32. The bit line contacts CB are linearly arranged between adjacent word lines $WL_{i-1}$, $WL_i$, $WL_{i+1}$, . . . , and the source line contacts CS are also linearly arranged therebetween.

Figure 38:
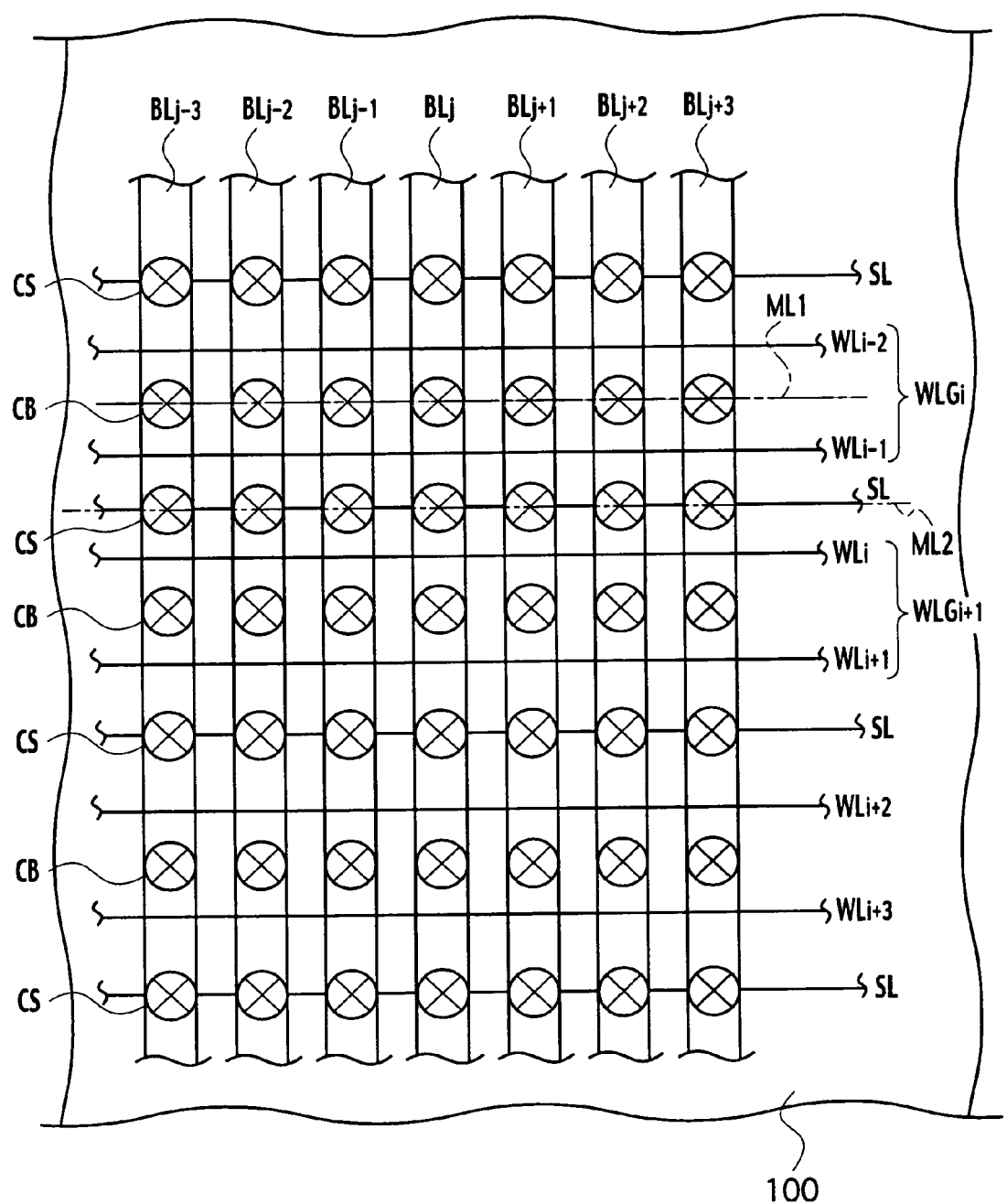
FIG. 38 is a diagram schematically showing an arrangement pattern of bit line contacts CB and source line contacts CS in a NOR structure.

An arrangement pattern of bit line contacts CB and source line contacts CS in a NOR structure is schematically shown in FIG. 38 while referencing the plan view of the layout pattern shown in FIG. 32.

The semiconductor memory according to the fifth embodiment of the present invention, as shown in FIGS. 30 to 32 and FIG. 38, is mounted on a semiconductor chip 100. The memory includes: multiple bit lines $BL_{j-3}$, $BL_{j-2}$, $BL_{j-1}$, $BL_j$, $BL_{j+1}$, $BL_{j+2}$, $BL_{j+3}$, ...; a source line SL, which is arranged adjacent and parallel to respective multiple word line groups $WLG_i$, $WLG_{i+1}$, ... orthogonal to the multiple bit lines $BL_{j-3}$, $BL_{j-2}$, $BL_{j-1}$, $BL_j$, $BL_{j+1}$, $BL_{j+2}$, $BL_{j+3}$, ...; bit line contacts (CB) 11, which are linearly arranged along the word line group length between a pair of word lines $WL_{i-2}$, $WL_{i-1}$, in the multiple word line groups $WLG_i$, $WLG_{i+1}$, ...; source line contacts (CS) 12, which are arranged with a topology linearly arranged along the length of the word line groups $WLG_i$, $WLG_{i+1}$, ..., adjacent to the outer sides of the pair of word lines $WL_{i-2}$, $WL_{i-1}$, and between another pair of word lines $WL_i$, $WL_{i+1}$ adjacent to the pair of word lines $WL_{i-2}$, $WL_{i-1}$ and that pair of word lines $WL_{i-2}$, $WL_{i-1}$; and memory cell transistors MT, which are arranged at the intersections of the bit lines $BL_{j-3}$, $BL_{j-2}$, $BL_{j-1}$, $BL_j$, $BL_{j+1}$, $BL_{j+2}$, $BL_{j+3}$, ... and the word lines $WL_{j-3}$, $WL_{j-2}$, $WL_{j-1}$, $WL_j$, $WL_{j+1}$, $WL_{j+2}$, $WL_{j+3}$, .... The semiconductor memory has a structure having a periodic symmetrical pattern with the center line between the pair of pair of word lines $WL_{i-2}$, $WL_{i-1}$ as a first line of symmetry ML1 and the center line between another pair of word lines $WL_i$, $WL_{i+1}$ adjacent to the pair of word lines $WL_{i-2}$, $WL_{i-1}$ as a second line of symmetry ML2. The interval between the pair of word lines $WL_{i-2}$, $WL_{i-1}$ being greater than an interval between the pair of word lines $WL_{i-2}$, $WL_{i-1}$ and another pair of word lines $WL_i$, $WL_{i+1}$ adjacent to the pair of word lines $WL_{i-2}$, $WL_{i-1}$.

The wider to-be-formed contact region width is for the bit line contacts 11 and is a width allowing void-free embedding of an interlayer insulating film 27. The narrower to-be-formed contact region width is for the source line contacts 12 and should be a minimum width determined from design rules such as contact diameter, alignment margin and the like This is because, as shown in FIGS. 30, 32 and 38, it does not matter if voids are generated and short circuit the source line contacts (CS) 12 since the source line SL is shared by the NOR cell units 29 aligned along the word line length.

In this manner, formation of a wide to-be-formed bit line contact region width and a narrow to-be-formed source line contact region width corresponds to formation of wider areas of the diffusion regions for the bit line contacts CB than those for the source line contacts CS. In other words, this structure corresponds to providing a wider interval between adjacent word lines on both sides of each bit line contact CB than the interval between adjacent word lines on both sides of each bit line contact CS.

According to the fabrication method for the semiconductor memory, of the fifth embodiment, even with the NOR circuitry, alternately sandwiching two types of to-be-formed contact region widths allows generation of voids between the source line contacts CS since the arrangements of the bit line contacts CB and the source line contacts CS are linear. However, generation of voids between the bit line contacts CB can be controlled, short circuits between adjacent bit lines can be avoided, and yield can be improved.

[Sixth Embodiment]

Figure 33:
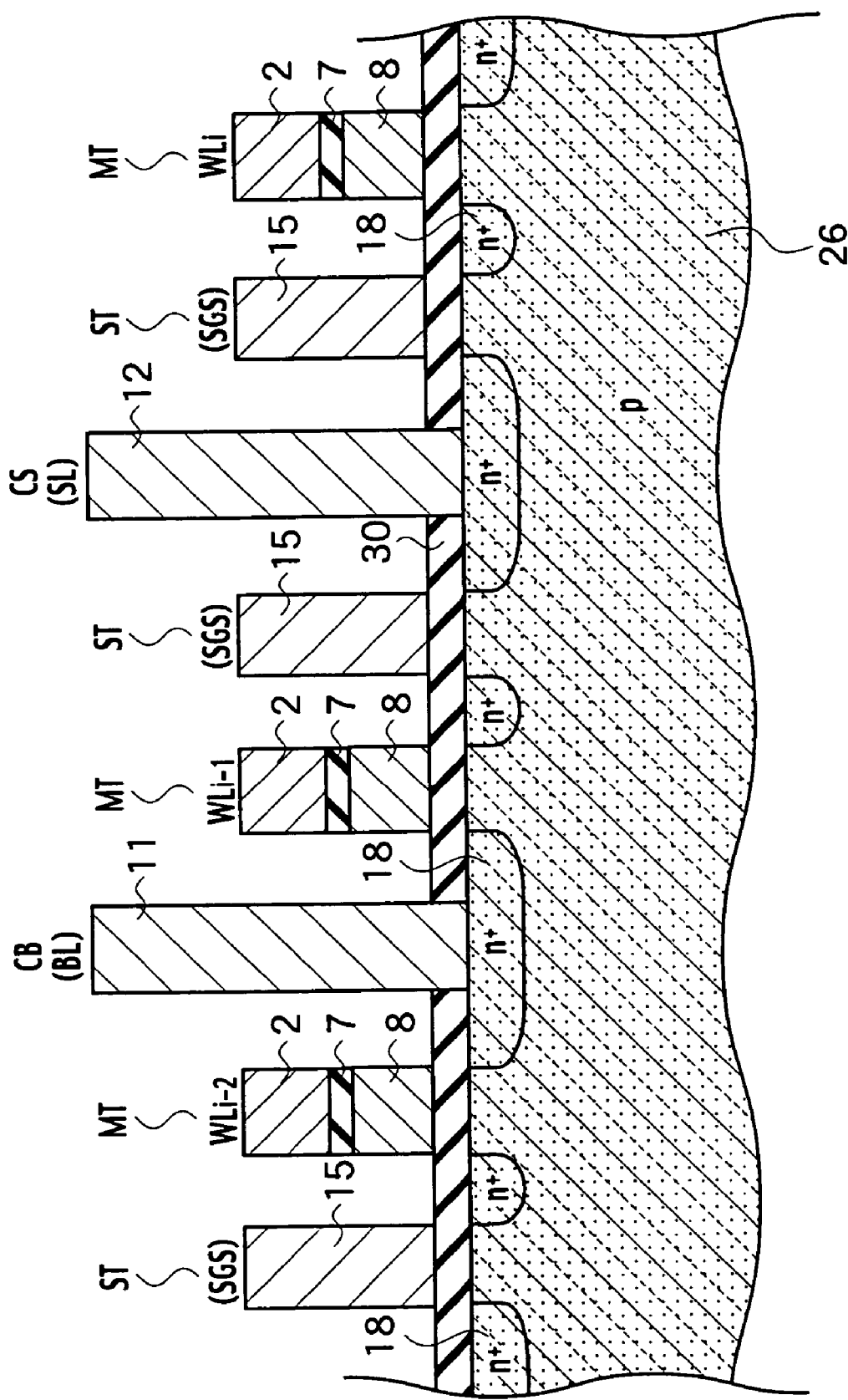
FIG. 33 shows a schematic cross-sectional device structure of a two-transistor/cell system of a semiconductor memory according to a sixth embodiment of the present invention.
Figure 34:
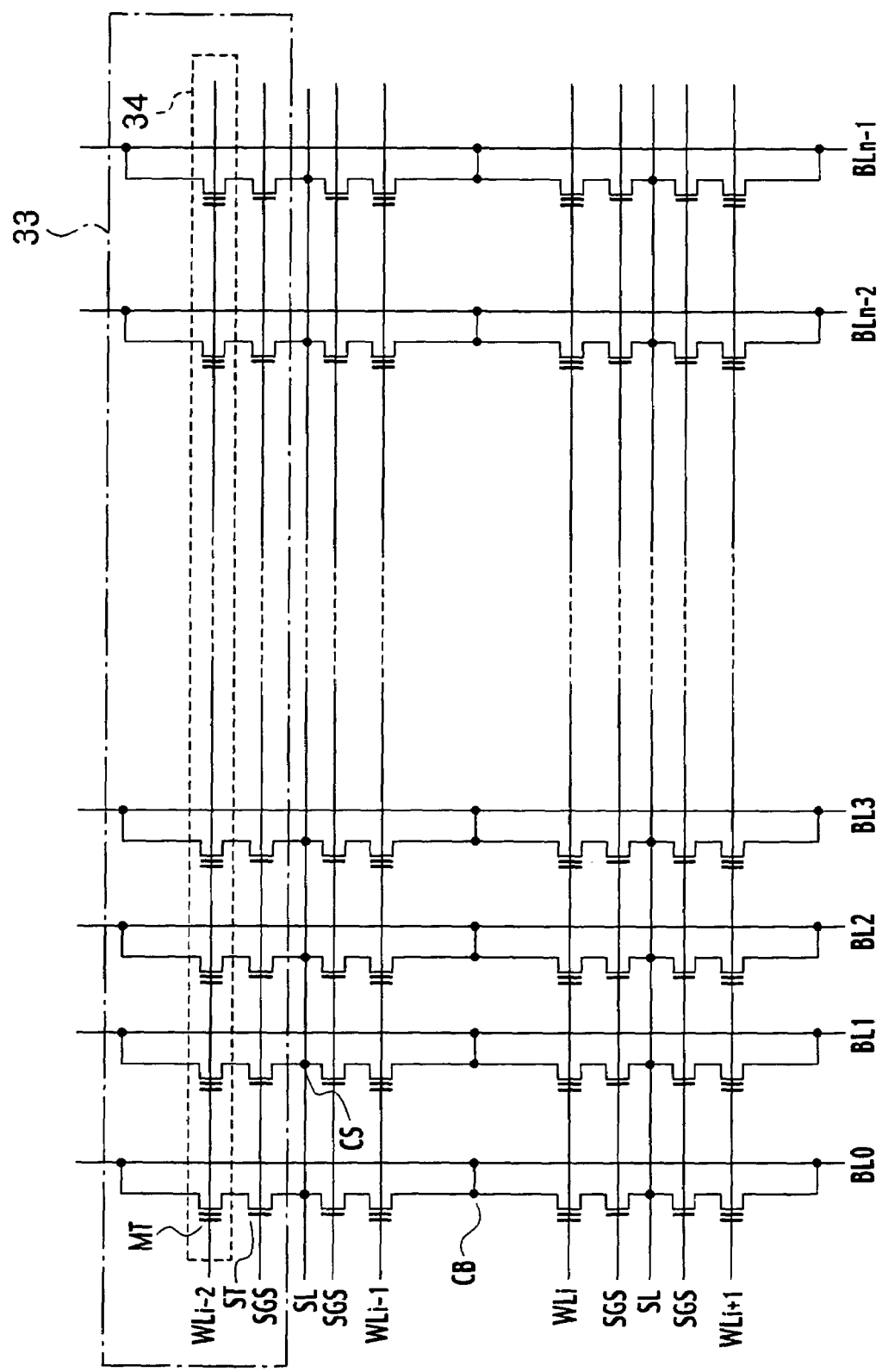
FIG. 34 is a diagram showing an exemplary circuitry of the two-transistor/cell system of a semiconductor memory according to the sixth embodiment of the present invention.

A schematic device cross section of a two-transistor/cell system for a semiconductor memory according to a sixth embodiment of the present invention is shown in FIG. 33, and a two-transistor/cell system circuitry is shown in FIG. 34.

Figure 39:
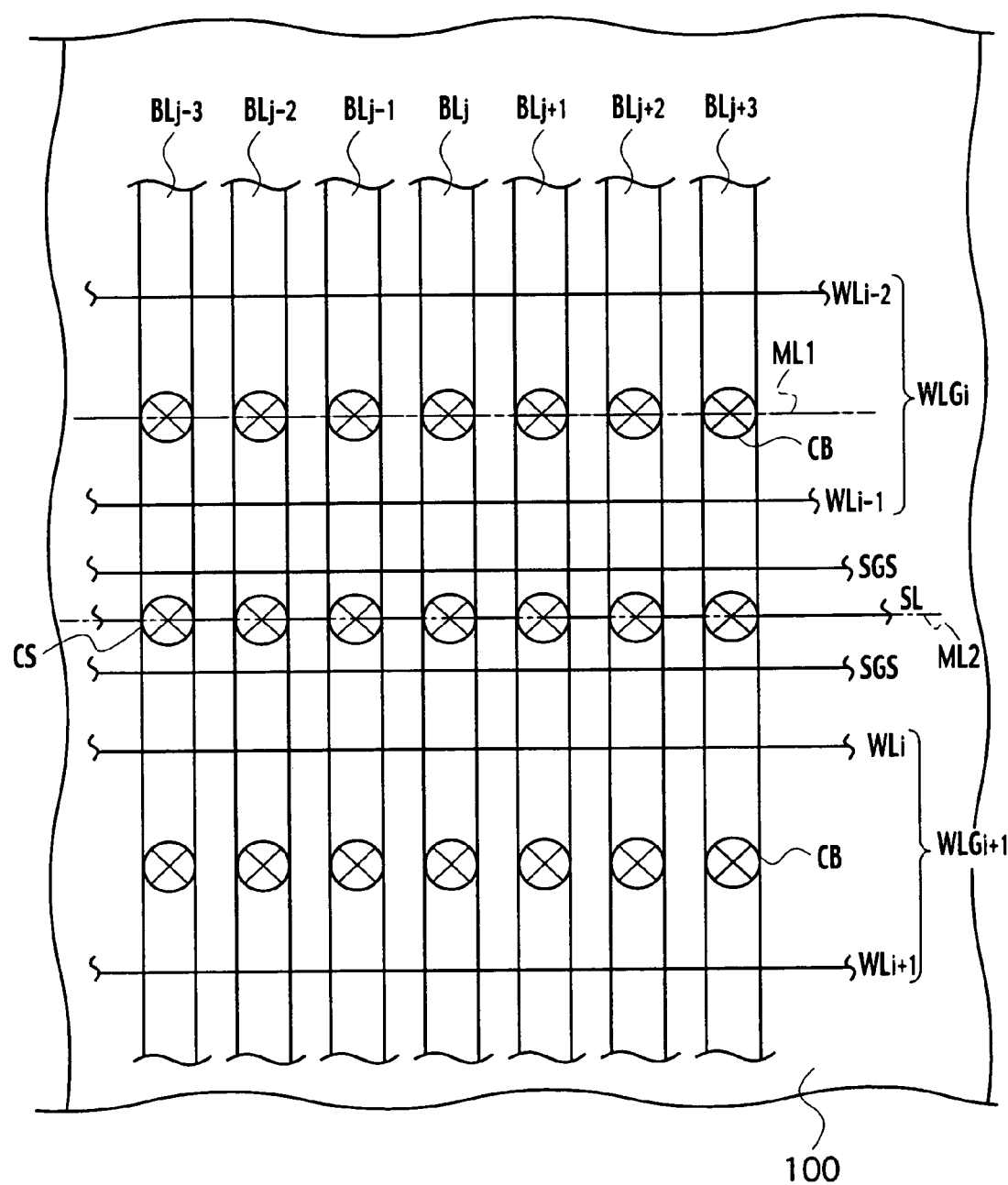
FIG. 39 is a diagram schematically showing an arrangement pattern of bit line contacts CB and source line contacts CS in a two-transistor/cell system.

A layout pattern of bit line contacts CB and source line contacts CS in a two-transistor/cell structure is schematically shown in FIG. 39 while referencing the circuitry shown in FIG. 34.

The semiconductor memory according to the sixth embodiment of the present invention has a two-transistor/cell structure as a basic structure. The structure includes, as shown in FIGS. 33 and 34, memory cells, each with a stacked gate structure configured from a gate insulating film 30, which is formed as a tunnel insulating film on a p-well or semiconductor substrate 26, a floating gate 8, an inter-gate insulating film 7, and a control gate 2 arranged on the gate insulating film 30. The drain region of a memory cell transistor is connected to a bit line contact (CB) 11 via a diffusion layer 18, while the source region is connected to the drain region of a select transistor via a diffusion layer 18. The source region of the select transistor is connected to a source line contact (CS) 12 via the diffusion later 18. Such two-transistor/cell system memory cells are arranged in parallel along the word line length and, as shown in FIG. 34, configures a memory cell block 33. In a single memory cell block 33, the word line $WL_{i-2}$ is connected in common to memory cell control gates, configuring a page unit 34. Note that pages within multiple blocks may be compiled into a page unit. A select gate line SGS is connected in common to the gates of the select transistors Circuitry having two-transistor/cell system memory cells symmetrically arranged with the source line SL, as a line of symmetry, is arranged in series along the length of bit lines BL0, BL1, BL2, ..., BLn.

As a result, as shown in FIG. 34, the bit line contacts CB are linearly arranged between adjacent word lines $WL_{i-1}$, $WL_i$, $WL_{i+1}$, ... along the length thereof, while the source line contacts CS are linearly arranged between adjacent select gate lines SGS along the word line length.

The semiconductor memory according to the sixth embodiment of the present invention, as shown in FIG. 39, is mounted on a semiconductor chip 100. The device includes: multiple bit lines $BL_{j-3}$, $BL_{j-2}$, $BL_{j-1}$, $BL_j$, $BL_{j+1}$, $BL_{j+2}$, $BL_{j+3}$, ...; a source line SL, which is arranged adjacent and parallel to respective multiple word line groups $WLG_i$, $WLG_{i+1}$, ... orthogonal to the multiple bit lines $BL_{j-3}$, $BL_{j-2}$, $BL_{j-1}$, $BL_j$, $BL_{j+1}$, $BL_{j+2}$, $BL_{j+3}$, ...; bit line contacts (CB) 11, which are linearly arranged along length of the word line groups $WLG_i$, $WLG_{i+1}$, ... between a pair of word lines $WL_{i-2}$, $WL_{i-1}$ in the multiple word line groups $WLG_i$, $WLG_{i+1}$, ...; a pair of source line side select gate lines SGS, which is arranged with a topology of being parallel to the word line groups $WLG_i$, $WLG_{i+1}$, ..., adjacent to the outer sides of the pair of word lines $WL_{i-2}$, $WL_{i-1}$, and between a word line group adjacent to the pair of word lines $WL_{i-2}$, $WL_{i-1}$ and that pair of word lines; memory cell transistors MT, which are arranged at the intersections of the bit lines $BL_{j-3}$, $BL_{j-2}$, $BL_{j-1}$, $BL_j$, $BL_{j+1}$, $BL_{j+2}$, $BL_{j+3}$, ... and the word lines $WL_{j-3}$, $WL_{j-2}$, $WL_{j-1}$, $WL_j$, $WL_{j+1}$, $WL_{j+2}$, $WL_{j+3}$, ...; select gate transistors ST, which are arranged at the intersections of the bit lines $BL_{j-3}$, $BL_{j-2}$, $BL_{j-1}$, $BL_j$, $BL_{j+1}$, $BL_{j+2}$, $BL_{j+3}$, ... and the source line side select gate transistors SGS; and source line contacts (CS) 12, which are linearly arranged along the length of the word line groups $WLG_i$, $WLG_{i+1}$, ... between the pair of source line select gate lines SGS. The semiconductor memory has a structure having a periodic symmetrical pattern with the center line between the pair of word lines $WL_{i-2}$, $WL_{i-1}$ as a first line of symmetry ML1 and the center line between the pair of source line side select gate lines SGS as a second line of symmetry ML2. The interval between the pair of word lines $WL_{i-2}$, $WL_{i-1}$, being greater than an interval between the pair of source line side select gate lines SGS.

The two-transistor/cell system memory cells shown in FIGS. 33 and 34 are arranged to alternately sandwich two types of to-be-formed contact region widths along the column length in the flash EEPROM shown in FIG. 39. The wider to-be-formed contact region width is for the bit line contacts and is a width allowing void-free embedding of an interlayer insulating film 27. The narrower to-be-formed contact region width is for the source line contacts and should be a minimum width determined from design rules such as contact diameter, alignment margin and the like. This is because, as shown in FIGS. 34 and 39, it does not matter if voids are generated and short circuit the source line contacts CS since the source line SL is shared by memory cells along the row length.

In this manner, formation of a wide to-be-formed bit line contact region width and a narrow to-be-formed source line contact region width corresponds to formation of, for example, wider areas of the diffusion regions for the bit line contacts CB than the areas for the source line contacts CS. In other words, this corresponds to providing a wider interval between adjacent word lines on both sides of each bit line contact CB than the interval between the select gate lines SGS of adjacent word lines on both sides of each source line contact CS.

According to the semiconductor memory of the sixth embodiment, an intermediary operation to the NAND type and the NOR type memories is possible even with the two-transistor/cell system memory cell system circuitry. By alternately sandwiching two types of to-be-formed contact region widths, since the arrangements of the bit line contacts CB and the source line contacts CS are linear, voids may develop between the source line contacts CS. However, generation of voids between the bit line contacts CB can be controlled, short circuits between adjacent bit lines can be avoided, and yield can be improved.

[Seventh Embodiment]

Figure 35:
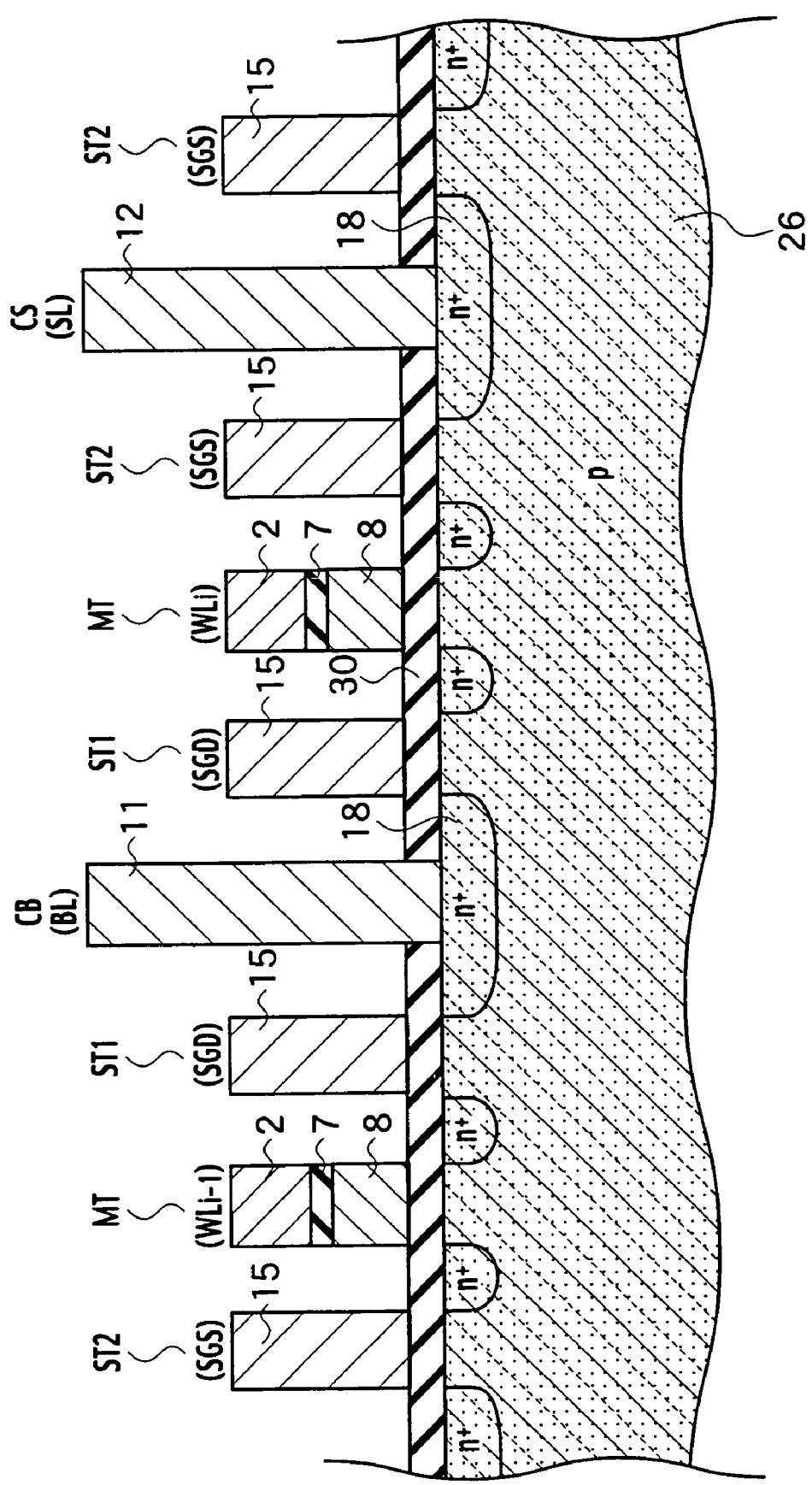
FIG. 35 shows a schematic cross-sectional device structure of a three-transistor/cell system of a semiconductor memory according to a seventh embodiment of the present invention.
Figure 36:
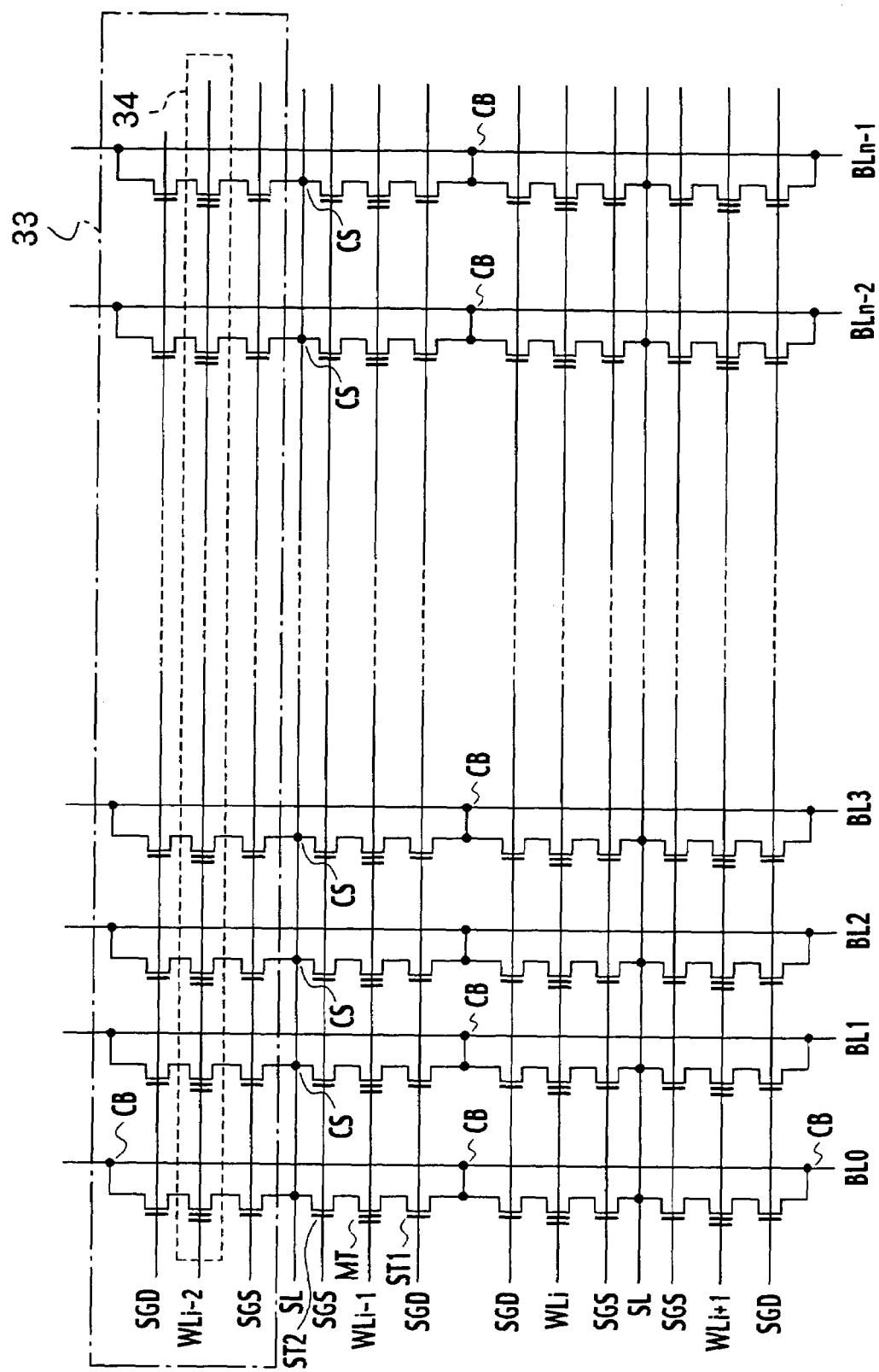
FIG. 36 is a diagram showing an exemplary circuitry of the three-transistor/cell system of a semiconductor memory according to the seventh embodiment of the present invention.

A schematic device cross section of a three-transistor/cell system for a semiconductor memory according to a seventh embodiment of the present invention is shown in FIG. 35, and three-transistor/cell system circuitry is shown in FIG. 36.

Figure 40:
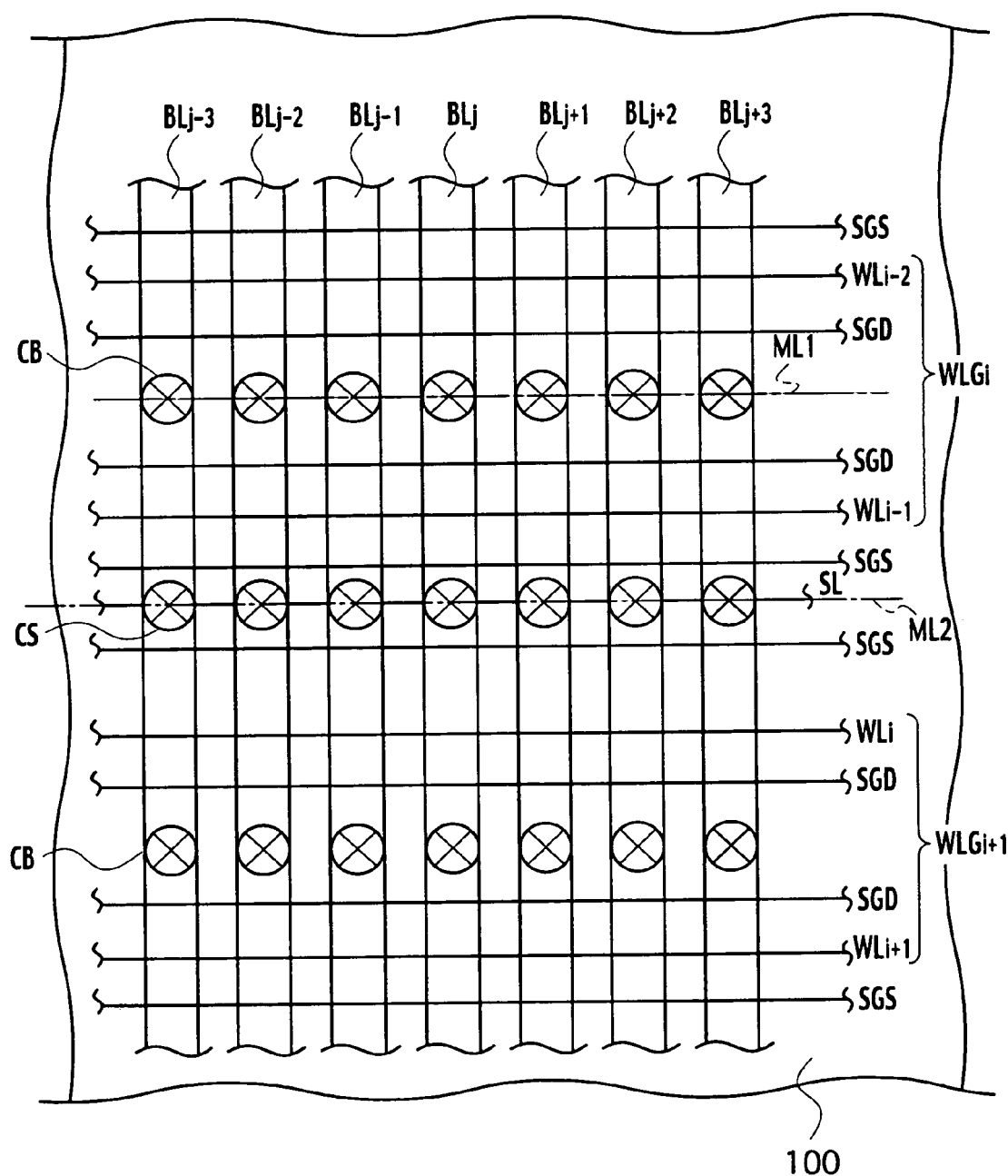
FIG. 40 is a diagram schematically showing an arrangement pattern of bit line contacts CB and source line contacts CS in a three-transistor/cell system.

An arrangement pattern of bit line contacts CB and source line contacts CS in a three-transistor/cell structure is schematically shown in FIG. 40 while referencing the circuitry shown in FIG. 36.

The semiconductor memory according to the seventh embodiment of the present invention has a three-transistor/cell structure as a basic structure. The structure includes, as shown in FIGS. 35 and 36, memory cells, each with a stacked gate structure configured by a gate insulating film 30, which is formed as a tunnel insulating film on a p-well or semiconductor substrate 26, a floating gate 8, an inter-gate insulating film 7, and a control gate 2 arranged on the gate insulating film 30. A select transistor having a select gate electrode 15 is arranged on both sides of each of the memory cells. The drain region of a memory cell transistor is connected to a bit line contact (CB) 11 via a bit line side select transistor, while the source region is connected to a source line contact (CS) 12 via a source line side select transistor. Such three-transistor/cell system memory cells are arranged in parallel along the word line length and, as shown in FIG. 36, configures a memory cell block 33. In a single memory cell block 33, the word line $WL_{i-2}$ is con-nected in common to memory cell control gates 2, configuring a page unit 34. Note that pages within multiple blocks may be compiled into a page unit. Furthermore, a select gate line SGS is connected in common to the gates of the source line side select transistors, and a select gate line SGD is connected in common to the gates of the bit line side select transistors. Circuitry where three-transistor/cell system memory cells are arranged symmetrical with the source line SL as a line of symmetry and arranged in series along the length of bit lines BL0, BL1, BL2, . . . , BLn.

As a result, as shown in FIG. 36, the bit line contacts CB are linearly arranged between adjacent word lines $WL_{i-1}$, $WL_j$ along the word line length, and the source line contacts CS are linearly arranged between adjacent select gate lines SGS along the word line length.

The semiconductor memory according to the seventh embodiment of the present invention, as shown in FIG. 40, is mounted on a semiconductor chip 100. The memory includes: multiple bit lines $BL_{j-3}$, $BL_{j-2}$, $BL_{j-1}$, $BL_j$, $BL_{j+1}$, $BL_{j+2}$, $BL_{j+3}$ . . . ; a source line SL, which is arranged adjacent and parallel to respective multiple word line groups $WLG_i$, $WLG_{i+1}$, . . . orthogonal to the multiple bit lines $BL_{j-3}$, $BL_{j-2}$, $BL_{j-1}$, $BL_j$, $BL_{j+1}$, $BL_{j+2}$, $BL_{j+3}$, . . . ; a pair of bit line side select gate lines SGD, which is arranged in parallel with the word line groups $WLG_i$, $WLG_{i+1}$ and adjacent to the inner sides of a pair of word lines $WL_{i-2}$, $WL_{i-1}$ of the multiple word line groups $WLG_i$, $WLG_{i+1}$; a pair of source line side select gate lines SGS, which is arranged with a topology parallel to the word line groups $WLG_i$, $WLG_{i+1}$, . . . , adjacent to the outer sides of the pair of word lines $WL_{i-2}$, $WL_{i-1}$, and between a word line group adjacent to the pair of word lines $WL_{i-2}$, $WL_{i-1}$, and that pair of word lines; memory cell transistors, which are arranged at the intersections of the bit lines $BL_{j-3}$, $BL_{j-2}$, $BL_{j-1}$, $BL_j$, $BL_{j+1}$, $BL_{j+2}$, $BL_{j+3}$, . . . and word lines bit lines $WL_{j-3}$, $WL_{j-2}$, $WL_{j-1}$, $WL_j$, $WL_{j+1}$, $WL_{j+2}$, $WL_{j+3}$, . . . ; select gate transistors ST1, ST2, which are arranged at the intersections of the bit line side select gate lines SGD and the bit lines bit lines $BL_{j-3}$, $BL_{j-2}$, $BL_{j-1}$, $BL_j$, $BL_{j+1}$, $BL_{j+2}$, $BL_{j+3}$, . . . and also at the intersections of the source line side select gate lines SGS and the same; bit line contacts (CB) 11, which are linearly arranged along the length of the word line groups $WLG_i$, $WLG_{i+1}$, . . . between a pair of bit line side select gate lines SGD; and source line contacts (CS) 12, which are linearly arranged along the length of the word line groups $WLG_i$, $WLG_{i+1}$, . . . between another pair of source line side select gate lines SGS. The semiconductor memory has a structure having a periodic symmetrical pattern with the center line between the pair of bit line side select gate lines SGD as a first line of symmetry ML1 and the center line between the pair of source line side select gate lines SGS as a second line of symmetry ML2. An interval between the pair of bit line side select gate lines SGD is greater than an interval between the pair of source line side select gate lines SGS.

The three-transistor/cell system memory cells shown in FIGS. 35 and 36 are arranged to alternately sandwich two types of to-be-formed contact region widths along the column length in the flash EEPROM shown in FIG. 40. The wider to-be-formed contact region width is for the bit line contacts CB and is a width allowing void-free embedding of an interlayer insulating film 27. The narrower to-be-formed contact region width is for the source line contacts CS and should be a minimum width determined from design rules such as contact diameter, alignment margin and the like. This is because, as shown in FIGS. 36 and 40, it does not matter if voids are generated and short circuit the source line contacts CS since the source line SL is shared by memory cells along the word line length.

In this manner, formation of a wide to-be-formed bit line contact region width and a narrow to-be-formed source line contact region width corresponds to formation of wider areas of the diffusion regions for the bit line contacts CB than the areas for the source line contacts CS. In other words, this structure corresponds to providing a wider interval between adjacent word lines on both sides of each bit line contact CB than the interval between select gate lines SGS of adjacent select gate transistors on both sides of each bit line contact CS.

According to the semiconductor memory of the seventh embodiment, an intermediary operation to the NAND type and the NOR type memories is possible, and even with such three-transistor/cell system memory cell system circuitry, by alternately sandwiching two types of to-be-formed contact region widths with the bit line contacts CB and the source line contacts CS linearly arranged, voids may develop between the source line contacts CS. However, generation of voids between the bit line contacts CB can be controlled, short circuits between adjacent bit lines can be avoided, and yield can be improved.

[Eighth Embodiment]

(NAND Structure)

Figure 41:
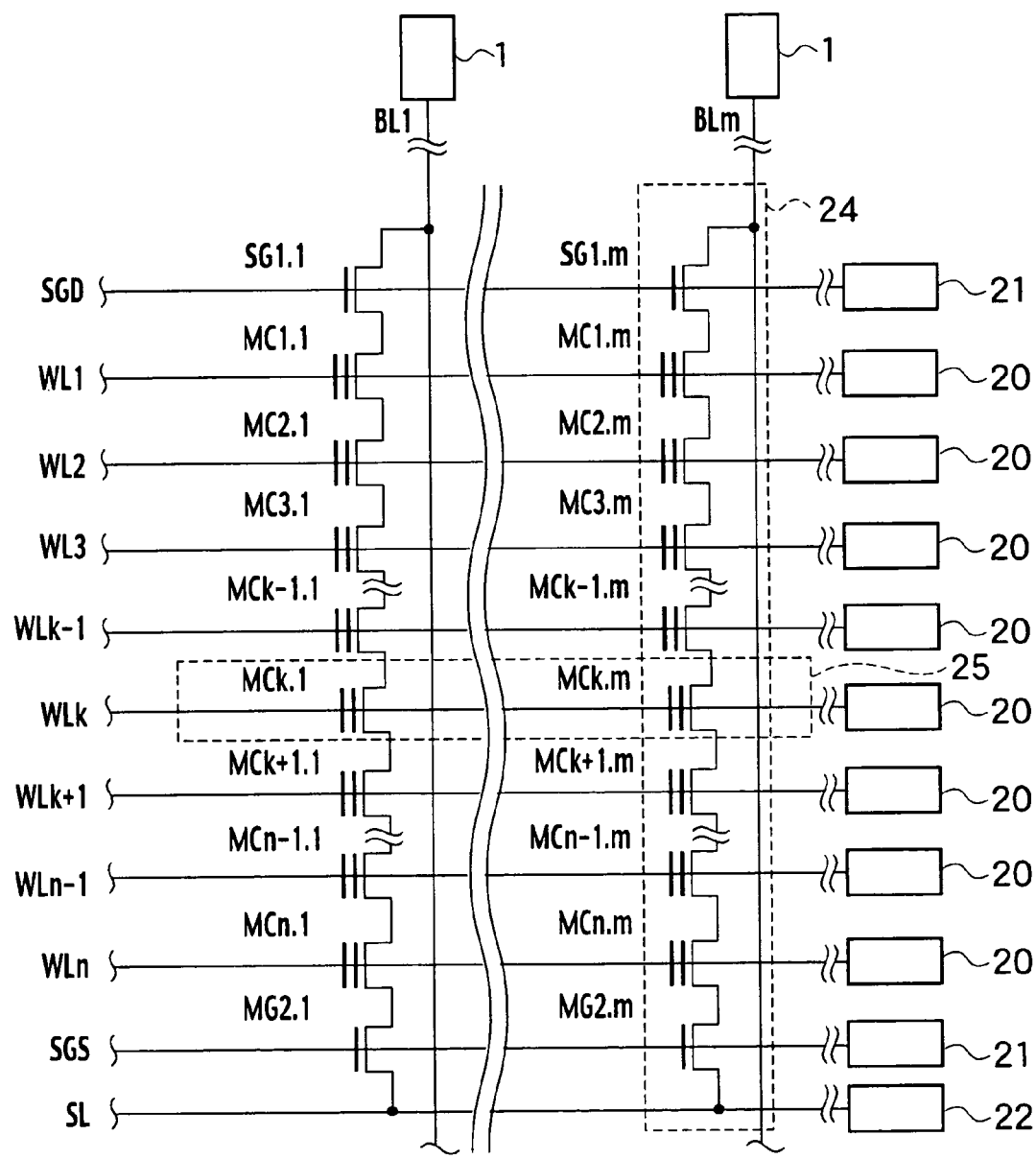
FIG. 41 is a diagram showing an exemplary NAND circuitry of a semiconductor memory according to an eighth embodiment of the present invention.

A NAND structure is shown in FIG. 41 as exemplary circuitry of a nonvolatile semiconductor memory according to an eighth embodiment. FIG. 41 shows an example of the semiconductor memory according to the first and the second embodiment configured with NAND memory cell arrays.

Each NAND cell unit 24 is configured by connecting n memory cell transistors (MC,m to MCn,m) in series and in a shape such that neighboring memory cells share either the source or the drain region, and arranging select gate transistors (SG1.m, SG2.m) at both sides of the memory cell unit. A NAND memory cell array is configured by arranging NAND memory cell units 24 in a matrix. NAND cell unit 24 arranged in the same row configure a NAND cell block. The drain of one of the select gate transistors (SG1.m) in each NAND cell unit 24 is connected to a bit line (BLm), while the source of the other select gate transistor (SG2.m) is connected to a source line SL shared by multiple NAND cell units 24. The control gates of multiple memory cell transistors and select gate transistors aligned along the row length of the NAND memory cell array are respectively connected in common to a control gate line (word line) WL and select gate lines SGD, SGS. Data is written all at once in all memory cell transistors 25 that are connected to a single word line. The write-in unit is normally defined as one page; however recently, there are cases where multiple pages are allotted to a single control gate. When n memory cell transistors are in a NAND memory cell unit 24, n control gate lines are included in a single memory cell block. Bit lines BL1, BL2 are respectively connected to a bit line drive circuit 1, the word lines WL are respectively connected to a control gate line drive circuit 20, the select gate lines are respectively connected to a select gate line drive circuit 21, and a source line is connected to a source line drive circuit 22.

According to the nonvolatile semiconductor memory of the eighth embodiment of the present invention, voids may be included in the source line SL that connects source line contacts CS, a semiconductor memory having only the bit line contacts CB with a void free structure can be applied. The voids are positively available for the source line SL to which the self aligned source line contacts CS are in contact, because the source line SL and source line contacts CS are commonly short circuited to the ground potential. However, the voids for the bit line contacts CB may cause short circuits between bit lines, as described above. Therefore, the NAND semiconductor memory described with the first and the second embodiment of the present invention can be applied.

Note that the device may have circuitry where the number of select gate transistors is not limited to one but may have multiple select gate transistors connected in series is as described with the third embodiment of the present invention.

[Ninth Embodiment]

(Exemplary System Block Structure)

Figure 42:
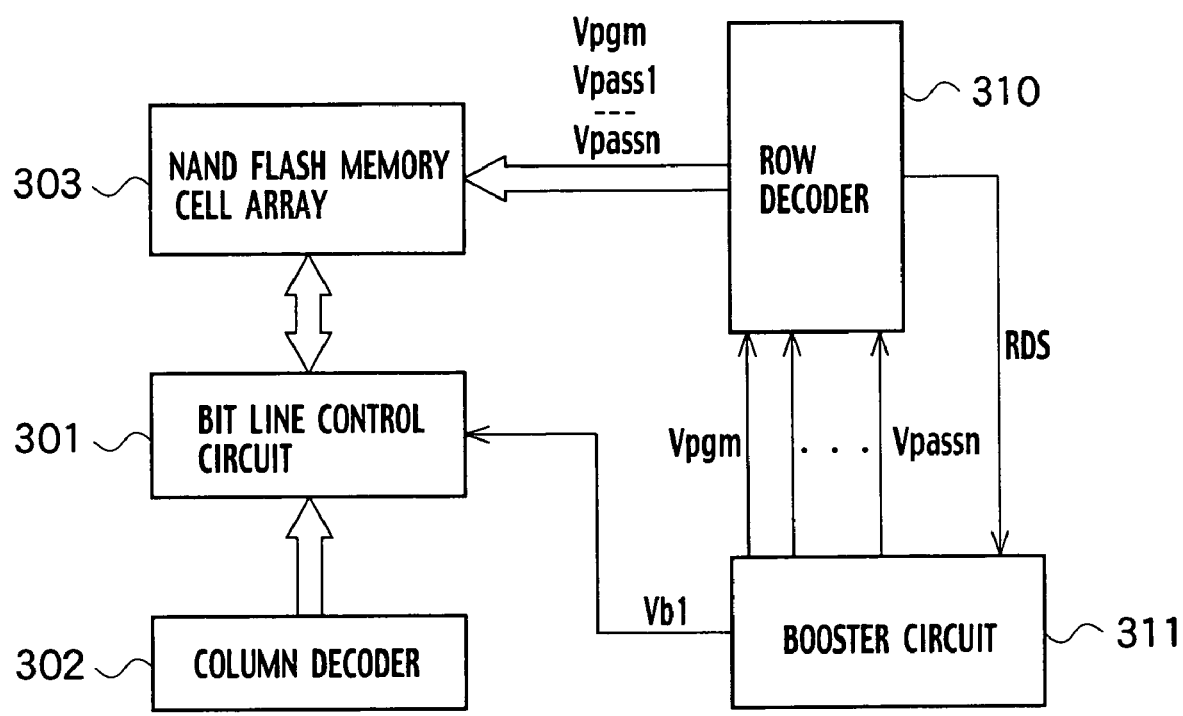
FIG. 42 is a diagram showing an exemplary system block structure of a semiconductor memory according to a ninth embodiment of the present invention.

The system block structure of the nonvolatile semiconductor memory according to the first to the third embodiment of the present invention as shown in FIG. 42 is configured with a NAND flash memory array 303, a bit line control circuit 301, a row decoder 310, a column decoder 302, and a booster circuit 311. The NAND memory cell array described with FIG. 41 may be applied to the NAND flash memory array 303. In other words, in the NAND flash memory cell array 303, NAND cell units 24 with stacked gate structured basic memory cell transistors are vertically and horizontally arranged in a matrix, and the word lines WL1 to WLn, the bit lines BL1 to BLm, the select gate lines SGD and SGS, and the source line SL are deployed so as to be connected to the control gates 2. The bit line control circuit 301 and the row decoder 310 are connected to this NAND flash memory cell array 303. The bit line control circuit 301 is a circuit that latches write-in data and performs a sensing operation during read-out. The column decoder 302, which decodes a column address signal so as to select a NAND cell unit column, is connected to this bit line control circuit 301. The booster circuit 311 generates write-in voltage $V_{pgm}$, different multiple intermediate voltages $V_{pass1}$ to $V_{passn}$, and bit line voltage $V_{bl}$ and the like from a power supply voltage. The row decoder 310 supplies a control signal RDS to the booster circuit 311 and receives a write-in voltage $V_{pgm}$ and intermediate voltages $V_{pass1}$ to $V_{passn}$. It should be noted that the multiple intermediate voltages $V_{pass1}$ to $V_{passn}$ are voltages used in the write-in, read-out and erasure operations for the nonvolatile semiconductor memory according to the embodiments of the present invention, and are mainly voltages to be applied to the word lines WL1 to WLn, respectively. The row decoder 310 decodes a row address signal, and based on the voltage supplied from the booster circuit 311, outputs the resulting decoded signals, such as write-in voltage $V_{pgm}$, which is used to select a memory cell transistor in the NAND flash memory cell array 303, intermediate voltages $V_{pass1}$ to $V_{passn}$, voltage $V_{sgs}$ to be applied to the select gate line SGS, voltage $V_{sgd}$ to be applied to the select gate line SGD, and voltage $V_{sl}$ to be applied to the source line. Accordingly, word lines and select gate lines in the NAND flash memory cell array 303 are selected. Furthermore, the bit line control circuit 301 receives the bit line voltage $V_{bl}$ from the booster circuit 311, supplying the bit line voltage to a NAND cell unit column selected by the column decoder 302. It should be noted that only the minimum circuit configuration is shown in FIG. 32, where an address buffer, a data input/output buffer, and a timing generation circuit and the like are also necessary, however, descriptions thereof are omitted.

[Tenth Embodiment]

Figure 43:
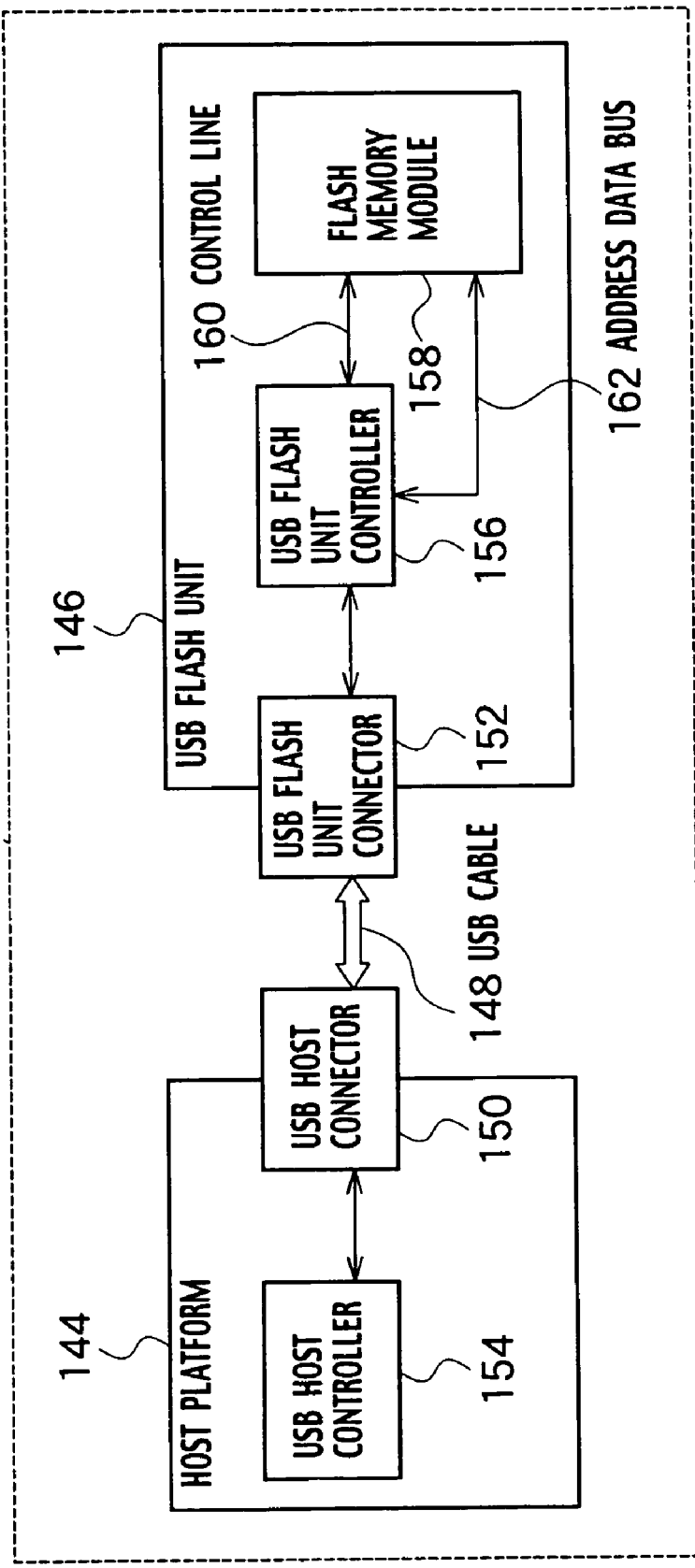
FIG. 43 illustrates an application example of the semiconductor memory according to the first to the sixth embodiment of the present invention, and is a tenth embodiment of the present invention.

FIG. 43 illustrates an application example of a nonvolatile semiconductor memory according to the first to ninth embodiments of the present invention as a tenth embodiment of the present invention. FIG. 43 is a schematic diagram of principal elements of a flash memory and system according to the present invention. As shown in the drawing, a flash memory system 142 is configured with a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first to ninth embodiments of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which is stored with transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet through the USB cable 148. If the USB flash unit 146 is a unit including the end point that has received this request packet, this request is accepted by the USB flash unit controller 156.

Next, the USB flash unit controller 156 performs various operations such as read-in, write-in or erasure of data from or to the flash memory module 158. In addition, the flash unit controller supports basic USB functions such as acquiring a USB address and the like. The USB flash unit controller 156 controls the flash memory module 158 via either a control line 160, which is used to control output from the flash memory module 158, or, for example, other various signals such as a chip enable signal CE, a read-out signal or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the result and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

[Other Embodiments]

With the above description, NAND type, AND type, NOR type, two-transistor/cell type and three-transistor/cell type nonvolatile memories have been described; however, it is self evident that the embodiments of the present invention are not limited thereto. Namely, the present invention is applicable as long as such a device has a memory cell array structure where memory cell units are arranged in a matrix and a source line SL is shared by source line contacts CS aligned in a single direction regardless of the operating principle of the memory cell transistor.

The present invention is described according to the first to tenth embodiments; however, it should not be perceived that descriptions forming a part of this disclosure and drawings are intended to limit the spirit and scope of the present invention. Various alternative embodiments, working examples, and operational techniques will become apparent from this disclosure for those skilled in the art.

In this manner, the present invention naturally includes various embodiments not described herein. Accordingly, the technical scope of the present invention is determined only by specified features of the invention according to the following claims that can be regarded appropriate from the above-mentioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor memory comprising:
a plurality of bit lines, a plurality of word line groups orthogonal to the plurality of bit lines, and a plurality of source lines that are respectively arranged adjacent and parallel to the word line groups;
a pair of bit line side select gate lines formed between a pair of word line groups of the plurality of word line groups, and aligned parallel to the word line groups;
a pair of source line side select gate lines formed between a word line group adjacent to the pair of word line groups and the pair of word line groups, and aligned parallel to the word line groups;
memory cell transistors arranged at an intersections of the bit lines and the word lines, and select gate transistors arranged at an intersections of the bit lines and the select gate lines;
a bit line contact arranged between the pair of bit line side select gate lines; and
a source line contact arranged between the pair of source line side select gate lines, wherein
in a periodic symmetrical pattern with the center line between the pair of bit line side select gate lines as a first line of symmetry and the center line between the pair of source line side select gate lines as a second line of symmetry, an interval between the pair of bit line side select gate lines is greater than an interval between the pair of source line side select gate lines.

2. The semiconductor memory of claim 1, wherein
the pair of bit line side select gate lines is formed between the pair of word line groups of the plurality of word line groups, and is aligned adjacent to inner sides of the pair of word line groups and parallel to the word line groups.

3. The semiconductor memory of claim 1, wherein the pair of source line side select gate lines is arranged with a topology parallel to the word line groups, adjacent to outer sides of the pair of word line groups, and between a word line group adjacent to the pair of word line groups and the pair of word line groups.

4. The semiconductor memory of claim 1, wherein the bit line contact is linearly arranged along the direction of the word line groups between the pair of bit line side select gate lines.

5. The semiconductor memory of claim 1, wherein the source line contact is linearly arranged along the direction of the word line groups between the pair of source line side select gate lines.

6. A semiconductor memory comprising:
a plurality of bit lines, a plurality of word line groups orthogonal to the plurality of bit lines, and a plurality of source lines that are respectively arranged adjacent and parallel to the word line groups;
a bit line contact arranged between a pair of word lines in the plurality of word line groups;
a source line contact arranged between another pair of word lines adjacent to the pair of word lines; and
memory cell transistors arranged at an intersections of the bit lines and the word lines,
wherein
in a periodic symmetrical pattern with the center line between the pair of word lines as a first line of symmetry and the center line between the other pair of word lines adjacent to the pair of word lines as a second line of symmetry, an interval between the pair of word lines is greater than an interval between the pair of word lines and the other pair of word lines adjacent to the pair of word lines.

7. The semiconductor memory of claim 6, wherein the bit line contact is linearly arranged along the direction of the word line groups between a pair of word lines in the plurality of word line groups.

8. The semiconductor memory of claim 6, wherein the source line contact is arranged with a topology parallel to the word line groups, adjacent to outer sides of the pair of word lines, and between another pair of word lines adjacent to the pair of word line groups and the pair of word line groups.

9. A semiconductor memory comprising:
a plurality of bit lines, a plurality of word line groups orthogonal to the plurality of bit lines, and a plurality of source lines that are respectively arranged adjacent and parallel to the word line groups;
a bit line contact arranged between a pair of word lines in the plurality of word line groups;
a pair of source line side select gate lines formed between a word line group adjacent to the pair of word lines and the pair of word lines, and aligned parallel to the word line groups;
memory cell transistors arranged at an intersection of the bit lines and the word lines, and select gate transistors arranged at an intersection of the bit lines and the select gate lines; and
a source line contact arranged between the pair of source line side select gate lines,
wherein
in a periodic symmetrical pattern with the center line between the pair of word lines as a first line of symmetry and a center line between the pair of source line side select gate lines as a second line of symmetry, an interval between the pair of word lines is greater than an interval between the pair of source line side select gate lines.

10. The semiconductor memory of claim 9, wherein the bit line contact is linearly arranged along the direction of the word line groups between the pair of word lines in the plurality of word line groups.

11. The semiconductor memory of claim 9, wherein the pair of source line side select gate lines is arranged with a topology parallel to the word line groups, adjacent to outer sides of the pair of word lines, and between a word line group adjacent to the pair of word lines and the pair of word lines.

12. The semiconductor memory of claim 9, wherein the source line contact is linearly arranged along the direction of the word line groups between the pair of source line side select gate lines.

* * * * *